(12) United States Patent
Luch et al.

(10) Patent No.: US 8,076,568 B2
(45) Date of Patent: *Dec. 13, 2011

(54) COLLECTOR GRID AND INTERCONNECT STRUCTURES FOR PHOTOVOLTAIC ARRAYS AND MODULES

(76) Inventors: Daniel Luch, Morgan Hill, CA (US); Daniel Randolph Luch, Carmel Valley, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 12/798,221

(22) Filed: Mar. 31, 2010

(65) Prior Publication Data

US 2010/0224230 A1  Sep. 9, 2010

Related U.S. Application Data

(63) Continuation-in-part of application No. 12/290,896, filed on Nov. 5, 2008, which is a continuation-in-part of application No. 11/824,047, filed on Jun. 30, 2007, now abandoned, which is a continuation-in-part of application No. 11/404,168, filed on Apr. 13, 2006, now Pat. No. 7,635,810, application No. 12/798,221, which is a continuation-in-part of application No. 11/980,010, filed on Oct. 29, 2007, now abandoned, and a continuation-in-part of application No. 12/590,222, filed on Nov. 3, 2009, which is a continuation-in-part of application No. 12/156,505, filed on Jun. 2, 2008.

(60) Provisional application No. 61/274,960, filed on Aug. 24, 2009.

(51) Int. Cl.
*H02N 6/00* (2006.01)
*H01L 31/042* (2006.01)
*H01L 31/00* (2006.01)

(52) U.S. Cl. ........ 136/244; 136/245; 136/249; 136/251; 136/256

(58) Field of Classification Search .................. 136/244, 136/245, 249, 251, 256
See application file for complete search history.

(56) References Cited

U.S. PATENT DOCUMENTS

| | | | |
|---|---|---|---|
| 3,094,439 A | 6/1963 | Mann et al. |
| 3,116,171 A | 12/1963 | Leif et al. |
| 3,330,700 A | 7/1967 | Sequeira et al. |
| 3,346,419 A | 10/1967 | Webb et al. |
| 3,369,939 A | 2/1968 | Meyer |
| 3,376,163 A | 4/1968 | Abrahamsohn |
| 3,442,007 A | 5/1969 | Griffin et al. |
| 3,459,597 A | 8/1969 | Baron |
| 3,480,473 A | 11/1969 | Tanos |

(Continued)

OTHER PUBLICATIONS

Singh, V.P. et al. "Thin film CdTe-CdS heterojunction solar cells on lightweight metal substrates", Sol. Energy Mater. Sol. Cells. 59, 145-161. (1999).

*Primary Examiner* — Basia Ridley
*Assistant Examiner* — Lindsey Bernier

(57) ABSTRACT

An interconnected arrangement of photovoltaic cells is achieved using laminating current collector electrodes. The electrodes comprise a pattern of conductive material extending over a first surface of sheetlike substrate material. The first surface comprises material having adhesive affinity for a selected conductive surface. Application of the electrode to the selected conductive surface brings the first surface of the sheetlike substrate into adhesive contact with the conductive surface and simultaneously brings the conductive surface into firm contact with the conductive material extending over first surface of the sheetlike substrate. Use of the laminating current collector electrodes allows facile and continuous production of expansive area interconnected photovoltaic arrays.

38 Claims, 38 Drawing Sheets

U.S. PATENT DOCUMENTS

| | | |
|---|---|---|
| 3,483,038 A | 12/1969 | Hui et al. |
| 3,493,822 A * | 2/1970 | Iles .................................. 136/256 |
| 3,523,875 A | 8/1970 | Minklei |
| 3,553,030 A | 1/1971 | Lebrun |
| 3,619,382 A | 11/1971 | Lupinski |
| 3,682,786 A | 8/1972 | Brown et al. |
| 3,713,893 A | 1/1973 | Shirland |
| 3,764,280 A | 10/1973 | Lupinski |
| 3,849,880 A | 11/1974 | Haynos |
| 3,865,699 A | 2/1975 | Luch |
| 3,888,697 A | 6/1975 | Bogus et al. |
| 3,903,427 A | 9/1975 | Pack |
| 3,903,428 A | 9/1975 | DeJong |
| 3,978,333 A | 8/1976 | Crisman et al. |
| 3,982,964 A | 9/1976 | Lindmayer et al. |
| 3,993,505 A | 11/1976 | Pack |
| 3,996,067 A | 12/1976 | Broder |
| 4,009,093 A | 2/1977 | Luch |
| 4,017,332 A | 4/1977 | James |
| 4,019,924 A | 4/1977 | Kurth |
| 4,027,652 A | 6/1977 | Collura |
| 4,038,042 A | 7/1977 | Adelman |
| 4,087,960 A | 5/1978 | Koichi |
| 4,101,385 A | 7/1978 | Luch |
| 4,127,424 A | 11/1978 | Ullery |
| 4,158,612 A | 6/1979 | Luch et al. |
| 4,175,249 A | 11/1979 | Gruber |
| 4,195,117 A | 3/1980 | Luch |
| 4,227,942 A | 10/1980 | Hall |
| 4,231,808 A | 11/1980 | Tabei et al. |
| 4,241,493 A | 12/1980 | Andrulitis et al. |
| 4,243,432 A | 1/1981 | Jordan et al. |
| 4,260,429 A | 4/1981 | Moyer |
| 4,278,473 A | 7/1981 | Borden |
| 4,278,510 A | 7/1981 | Chien et al. |
| 4,283,590 A | 8/1981 | Bilger et al. |
| 4,283,591 A | 8/1981 | Boer |
| 4,291,191 A | 9/1981 | Dahlberg |
| 4,306,108 A | 12/1981 | Henesian |
| 4,315,096 A | 2/1982 | Tyan et al. |
| 4,320,154 A | 3/1982 | Biter |
| 4,348,546 A | 9/1982 | Little |
| 4,361,717 A | 11/1982 | Gilmore et al. |
| 4,366,335 A | 12/1982 | Feng et al. |
| 4,380,112 A | 4/1983 | Little |
| 4,395,362 A | 7/1983 | Satoh et al. |
| 4,398,055 A | 8/1983 | Ijaz et al. |
| 4,425,262 A | 1/1984 | Kawai et al. |
| 4,428,110 A | 1/1984 | Kim |
| 4,429,020 A | 1/1984 | Luch |
| 4,430,519 A | 2/1984 | Young |
| 4,443,651 A | 4/1984 | Swartz |
| 4,457,578 A | 7/1984 | Taylor |
| 4,499,658 A | 2/1985 | Lewis |
| 4,507,181 A | 3/1985 | Nath et al. |
| 4,510,079 A | 4/1985 | Kawai et al. |
| 4,514,579 A | 4/1985 | Hanak |
| 4,514,580 A | 4/1985 | Bartlett |
| 4,517,403 A | 5/1985 | Morel et al. |
| 4,542,255 A | 9/1985 | Tanner et al. |
| 4,542,258 A * | 9/1985 | Francis et al. ................. 136/256 |
| 4,584,427 A | 4/1986 | Mackamul et al. |
| 4,585,490 A | 4/1986 | Raffel et al. |
| 4,586,988 A | 5/1986 | Nath et al. |
| 4,598,306 A | 7/1986 | Nath et al. |
| 4,603,092 A | 7/1986 | Luch |
| 4,603,470 A | 8/1986 | Yamazaki |
| 4,605,813 A | 8/1986 | Takeuchi et al. |
| 4,617,420 A | 10/1986 | Dilts et al. |
| 4,617,421 A | 10/1986 | Nath et al. |
| 4,624,045 A | 11/1986 | Ishihara et al. |
| 4,640,002 A | 2/1987 | Phillips et al. |
| 4,652,693 A | 3/1987 | Bar-On |
| 4,667,128 A | 5/1987 | Kamijo et al. |
| 4,675,468 A | 6/1987 | Basol et al. |
| 4,695,674 A | 9/1987 | Bar-On |
| 4,697,041 A | 9/1987 | Okaniwa et al. |
| 4,697,042 A | 9/1987 | Schilling |
| 4,704,369 A | 11/1987 | Nath et al. |
| 4,724,011 A | 2/1988 | Turner et al. |
| 4,745,078 A | 5/1988 | Stetter et al. |
| 4,746,618 A | 5/1988 | Nath et al. |
| 4,758,526 A | 7/1988 | Thalheimer |
| 4,762,747 A | 8/1988 | Liu et al. |
| 4,765,845 A | 8/1988 | Takada et al. |
| 4,769,086 A | 9/1988 | Tanner et al. |
| 4,773,944 A | 9/1988 | Nath |
| 4,806,432 A | 2/1989 | Eguchi et al. |
| 4,830,038 A | 5/1989 | Anderson et al. |
| 4,860,509 A | 8/1989 | Laaly et al. |
| 4,876,430 A | 10/1989 | Hershitz et al. |
| 4,877,460 A | 10/1989 | Flodl |
| 4,965,655 A | 10/1990 | Grimmer et al. |
| 5,084,107 A | 1/1992 | Deguchi et al. |
| 5,118,540 A | 6/1992 | Hutchison |
| 5,158,618 A | 10/1992 | Rubin et al. |
| 5,164,443 A | 11/1992 | Watanabe |
| 5,181,968 A | 1/1993 | Nath et al. |
| 5,185,042 A | 2/1993 | Ferguson |
| 5,223,044 A | 6/1993 | Asai |
| 5,232,518 A | 8/1993 | Nath et al. |
| 5,238,519 A | 8/1993 | Nath et al. |
| 5,254,179 A | 10/1993 | Ricaud et al. |
| 5,270,229 A | 12/1993 | Ishihara |
| 5,273,608 A | 12/1993 | Nath |
| 5,330,583 A | 7/1994 | Asai et al. |
| 5,380,371 A | 1/1995 | Murakami |
| 5,385,848 A | 1/1995 | Grimmer |
| 5,391,235 A | 2/1995 | Inoue |
| 5,391,236 A | 2/1995 | Krut et al. |
| 5,419,781 A | 5/1995 | Hamakawa et al. |
| 5,421,908 A | 6/1995 | Yoshida et al. |
| 5,428,249 A | 6/1995 | Sawayama et al. |
| 5,457,057 A | 10/1995 | Nath et al. |
| 5,466,302 A | 11/1995 | Carey et al. |
| 5,468,652 A | 11/1995 | Gee |
| 5,474,620 A | 12/1995 | Nath et al. |
| 5,474,621 A | 12/1995 | Barnard |
| 5,476,553 A * | 12/1995 | Hanoka et al. ................. 136/251 |
| 5,530,519 A | 6/1996 | Miyawaki et al. |
| 5,547,516 A | 8/1996 | Luch |
| 5,554,229 A | 9/1996 | Vogeli |
| 5,567,296 A | 10/1996 | Luch |
| 5,575,861 A | 11/1996 | Younan et al. |
| 5,593,901 A | 1/1997 | Oswald et al. |
| 5,620,528 A | 4/1997 | Schade et al. |
| 5,626,686 A | 5/1997 | Yoshida |
| 5,626,688 A | 5/1997 | Probst et al. |
| 5,637,537 A | 6/1997 | Nath et al. |
| 5,660,646 A * | 8/1997 | Kataoka et al. ................. 136/251 |
| 5,667,596 A | 9/1997 | Tsuzuki et al. |
| 5,674,325 A | 10/1997 | Albright et al. |
| 5,679,176 A | 10/1997 | Tsuzuki et al. |
| 5,681,402 A | 10/1997 | Ichinose et al. |
| 5,733,381 A | 3/1998 | Ota et al. |
| 5,735,966 A | 4/1998 | Luch |
| 5,759,291 A | 6/1998 | Ichinose et al. |
| 5,814,195 A | 9/1998 | Lehan et al. |
| 5,865,904 A | 2/1999 | Tanda |
| 5,868,869 A | 2/1999 | Albright et al. |
| 5,897,715 A | 4/1999 | Ward et al. |
| 5,919,316 A | 7/1999 | Bogorad et al. |
| 5,928,439 A | 7/1999 | Ota et al. |
| 5,942,048 A | 8/1999 | Fujisaki et al. |
| 5,951,786 A | 9/1999 | Gee et al. |
| 6,008,451 A | 12/1999 | Ichinose et al. |
| 6,034,322 A | 3/2000 | Pollard |
| 6,093,581 A | 7/2000 | Takabayashi |
| 6,093,884 A | 7/2000 | Toyomura et al. |
| 6,111,189 A | 8/2000 | Garvison et al. |
| 6,121,542 A | 9/2000 | Shiotsuka et al. |
| 6,137,221 A | 10/2000 | Roitman et al. |
| 6,175,075 B1 * | 1/2001 | Shiotsuka et al. ............. 136/251 |
| 6,184,458 B1 | 2/2001 | Murakami et al. |
| 6,231,732 B1 | 5/2001 | Hollars et al. |
| 6,232,544 B1 | 5/2001 | Takabayashi |
| 6,239,352 B1 | 5/2001 | Luch |

| | | |
|---|---|---|
| 6,265,812 B1 | 7/2001 | Watanabe et al. |
| 6,268,014 B1 | 7/2001 | Eberspacher et al. |
| 6,313,395 B1 | 11/2001 | Crane et al. |
| 6,335,479 B1 | 1/2002 | Yamada et al. |
| 6,340,403 B1 | 1/2002 | Carey et al. |
| 6,350,944 B1 | 2/2002 | Sheri et al. |
| 6,359,209 B1 | 3/2002 | Glenn et al. |
| 6,365,010 B1 | 4/2002 | Hollars |
| 6,372,538 B1 | 4/2002 | Wendt et al. |
| 6,384,313 B2 | 5/2002 | Nakagawa et al. |
| 6,414,235 B1 | 7/2002 | Luch |
| 6,422,793 B1 | 7/2002 | Todisco et al. |
| 6,459,032 B1 | 10/2002 | Luch |
| 6,468,828 B1 | 10/2002 | Glatfelter et al. |
| 6,479,744 B1 | 11/2002 | Tsuzuki et al. |
| 6,488,824 B1 | 12/2002 | Hollars |
| 6,511,861 B2 | 1/2003 | Takeyama et al. |
| 6,548,912 B1 | 4/2003 | Graff et al. |
| 6,553,729 B1 | 4/2003 | Nath et al. |
| 6,555,739 B2 | 4/2003 | Kawam |
| 6,573,445 B1 | 6/2003 | Burgers |
| 6,582,887 B2 | 6/2003 | Luch |
| 6,586,270 B2 | 7/2003 | Tsuzuki et al. |
| 6,697,248 B1 | 2/2004 | Luch |
| 6,729,081 B2 | 5/2004 | Nath et al. |
| 6,743,524 B2 | 6/2004 | Schaepkens |
| 6,750,662 B1 | 6/2004 | Van Der Heide |
| 6,784,358 B2 | 8/2004 | Kukulka et al. |
| 6,787,405 B2 | 9/2004 | Chen |
| 6,803,513 B2 | 10/2004 | Beernink et al. |
| 6,974,976 B2 | 12/2005 | Hollars |
| 7,022,910 B2 | 4/2006 | Gaudiana et al. |
| 7,120,005 B1 | 10/2006 | Luch |
| 7,144,751 B2 | 12/2006 | Gee et al. |
| 7,157,641 B2 | 1/2007 | Gregg |
| 7,170,001 B2 | 1/2007 | Tee et al. |
| 7,276,724 B2 | 10/2007 | Sheats et al. |
| 7,394,425 B2 | 7/2008 | Luch |
| 7,507,903 B2 * | 3/2009 | Luch ............................. 136/256 |
| 7,635,810 B2 | 12/2009 | Luch |
| 7,781,672 B2 | 8/2010 | Gaudiana et al. |
| 7,829,781 B2 | 11/2010 | Montello et al. |
| 7,898,053 B2 * | 3/2011 | Luch ............................. 257/448 |
| 7,898,054 B2 * | 3/2011 | Luch ............................. 257/448 |
| 2002/0014262 A1 | 2/2002 | Matsushitat et al. |
| 2004/0063320 A1 | 4/2004 | Hollars |
| 2004/0144043 A1 | 7/2004 | Stevenson et al. |
| 2005/0072461 A1 | 4/2005 | Kuchinski et al. |
| 2005/0074915 A1 | 4/2005 | Tuttle et al. |
| 2005/0109392 A1 | 5/2005 | Hollars |
| 2005/0241692 A1 | 11/2005 | Rubin et al. |
| 2005/0263178 A1 | 12/2005 | Montello et al. |
| 2005/0263179 A1 | 12/2005 | Gaudiana et al. |
| 2005/0263180 A1 | 12/2005 | Montello et al. |
| 2005/0274408 A1 | 12/2005 | Li et al. |
| 2006/0030141 A1 | 2/2006 | Weng et al. |
| 2006/0032752 A1 | 2/2006 | Luch |
| 2006/0121701 A1 | 6/2006 | Basol |
| 2006/0174931 A1 | 8/2006 | Mapes et al. |
| 2007/0283996 A1 | 12/2007 | Hachtmann et al. |
| 2007/0283997 A1 | 12/2007 | Hachtmann et al. |
| 2007/0295385 A1 | 12/2007 | Sheats |
| 2007/0295390 A1 | 12/2007 | Sheats et al. |
| 2008/0000518 A1 | 1/2008 | Basol |
| 2008/0011350 A1 | 1/2008 | Luch |
| 2008/0053512 A1 | 3/2008 | Kawashima |
| 2008/0053519 A1 | 3/2008 | Pearce et al. |
| 2008/0142071 A1 | 6/2008 | Dorn et al. |
| 2008/0227236 A1 | 9/2008 | Luch |
| 2008/0314432 A1 | 12/2008 | Paulson et al. |
| 2009/0014049 A1 | 1/2009 | Gur et al. |
| 2009/0014057 A1 | 1/2009 | Croft et al. |
| 2009/0014058 A1 | 1/2009 | Croft et al. |
| 2009/0107538 A1 | 4/2009 | Luch |
| 2009/0111206 A1 * | 4/2009 | Luch ............................. 438/59 |
| 2009/0114261 A1 | 5/2009 | Stancel |
| 2009/0145551 A1 | 6/2009 | Luch |
| 2009/0159119 A1 | 6/2009 | Basol |
| 2009/0169722 A1 | 7/2009 | Luch |
| 2009/0173374 A1 * | 7/2009 | Luch ............................. 136/244 |
| 2009/0199894 A1 | 8/2009 | Hollars et al. |
| 2009/0223552 A1 | 9/2009 | Luch |
| 2009/0293941 A1 | 12/2009 | Luch |
| 2010/0071757 A1 | 3/2010 | Krajewski et al. |
| 2010/0269902 A1 * | 10/2010 | Luch et al. ............................. 136/256 |

* cited by examiner

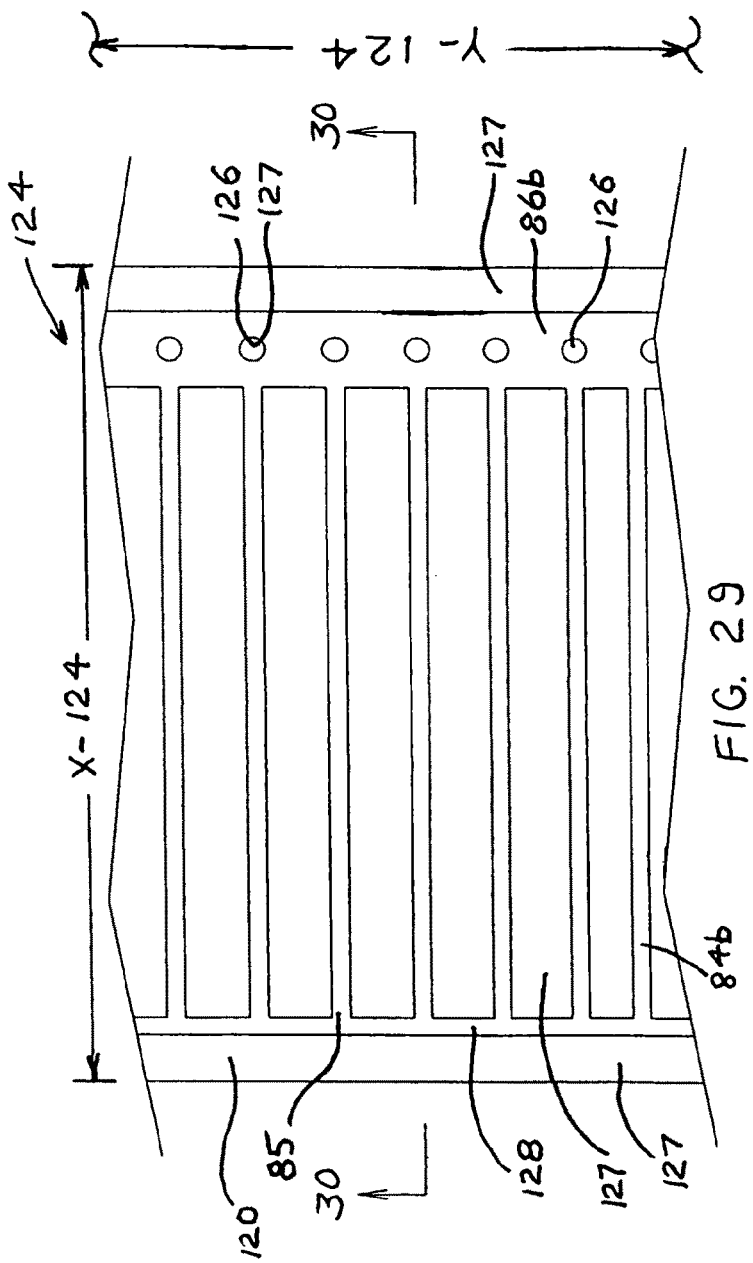
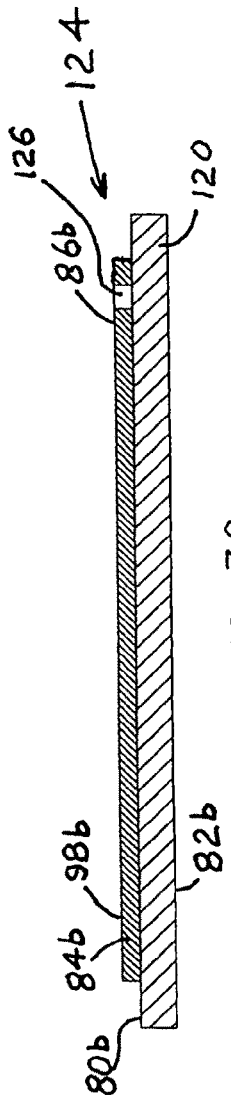
FIG. 29
FIG. 30

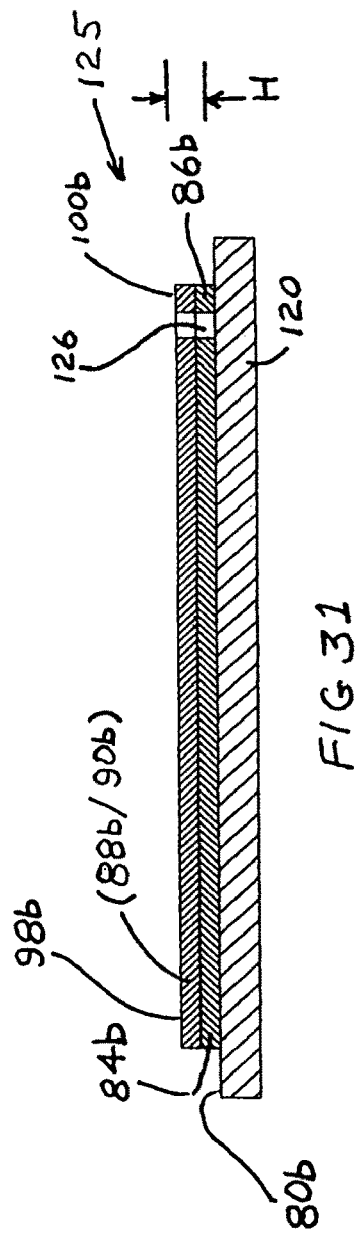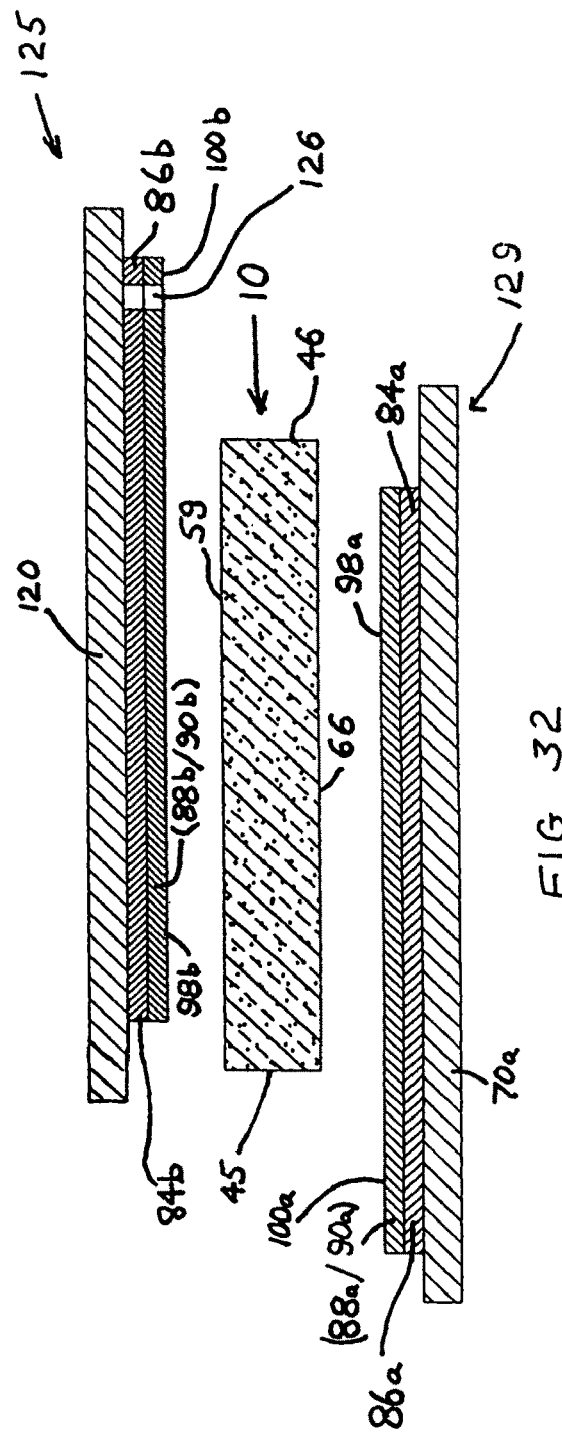

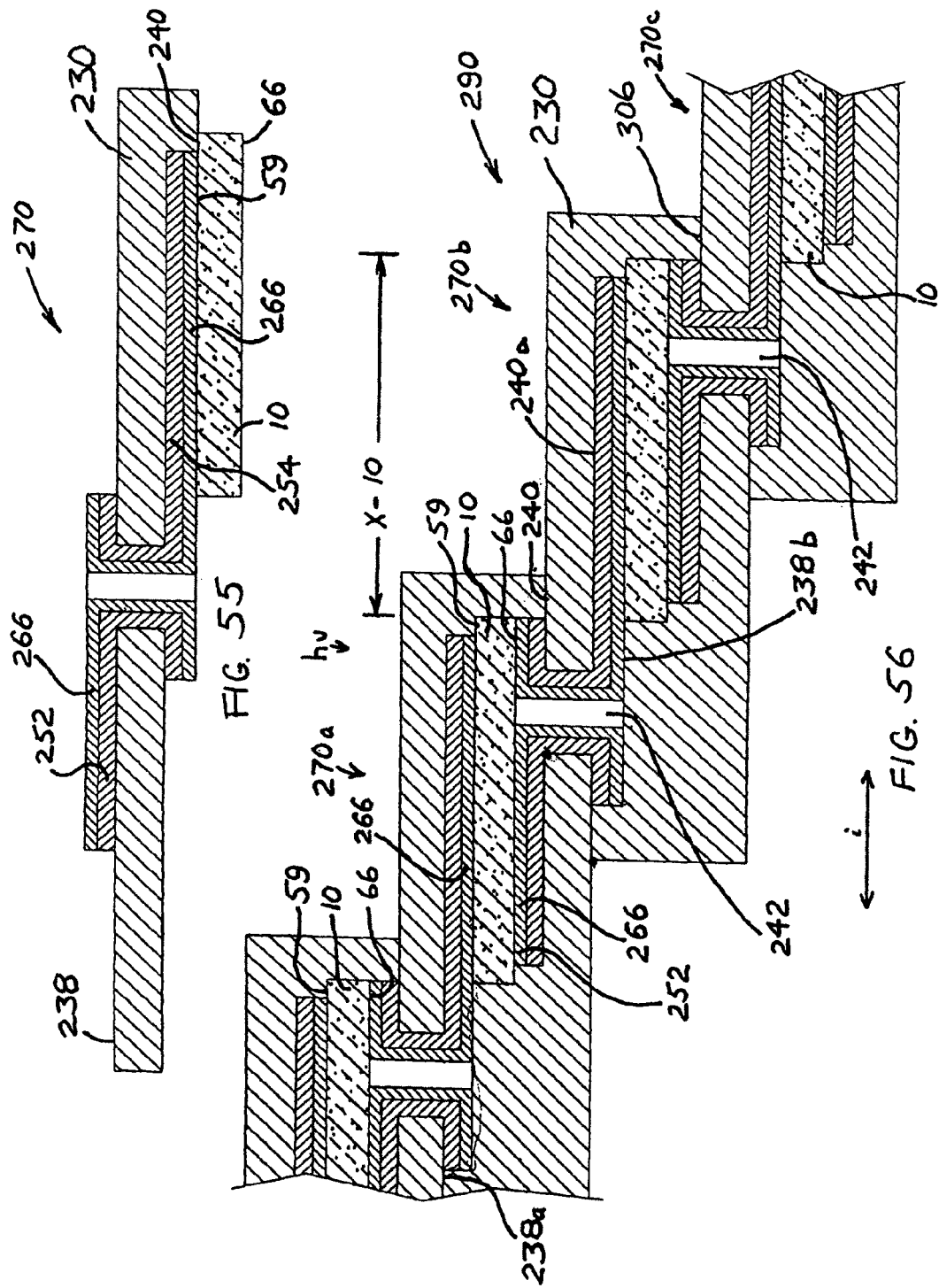

COLLECTOR GRID AND INTERCONNECT STRUCTURES FOR PHOTOVOLTAIC ARRAYS AND MODULES

CROSS-REFERENCE TO RELATED APPLICATIONS

This application is a Continuation-in-Part of U.S. patent application Ser. No. 12/290,896 filed Nov. 5, 2008, entitled Collector Grid, Electrode Structures and Interconnect Structures for Photovoltaic Arrays and Methods of Manufacture, which is a Continuation-in-Part of U.S. patent application Ser. No. 11/824,047 filed Jun. 30, 2007 now abandoned, entitled Collector Grid, Electrode Structures and Interconnect Structures for Photovoltaic Arrays and other Optoelectric Devices, which is a Continuation-in-Part of U.S. application Ser. No. 11/404,168 filed Apr. 13, 2006, entitled Substrate and Collector Grid Structures for Integrated Photovoltaic Arrays and Process of Manufacture of Such Arrays and now U.S. Pat. No. 7,635,810.

This application is also a Continuation-in-Part of U.S. patent application Ser. No. 11/980,010 filed Oct. 29, 2007 now abandoned entitled Collector Grid and Interconnect Structures for Photovoltaic Arrays and Modules.

This application is also a Continuation-in-Part of U.S. patent application Ser. No. 12/590,222 filed Nov. 3, 2009 entitled Photovoltaic Power Farm Structure and Installation, which is a Continuation-in-Part of U.S. patent application Ser. No. 12/156,505 filed Jun. 2, 2008 entitled Photovoltaic Power Farm Structure and Installation.

This application also claims priority to U.S. Provisional Patent Application No. 61274960 filed Aug. 24, 2009 entitled Identification, Isolation, and Repair of Shunts and Shorts in Photovoltaic Cells.

The entire contents of the above identified applications are incorporated herein by this reference.

BACKGROUND OF THE INVENTION

Photovoltaic cells have developed according to two distinct methods. The initial operational cells employed a matrix of single crystal silicon appropriately doped to produce a planar p-n junction. An intrinsic electric field established at the p-n junction produces a voltage by directing solar photon produced holes and free electrons in opposite directions. Despite good conversion efficiencies and long-term reliability, widespread energy collection using single-crystal silicon cells is thwarted by the high cost of single crystal silicon material and interconnection processing.

A second approach to produce photovoltaic cells is by depositing thin photovoltaic semiconductor films on a supporting substrate. Material requirements are minimized and technologies can be proposed for mass production. Thin film photovoltaic cells employing amorphous silicon, cadmium telluride, copper indium gallium diselenide, dye sensitized polymers and the like have received increasing attention in recent years. Despite significant improvements in individual cell conversion efficiencies for both single crystal and thin film approaches, photovoltaic energy collection has been generally restricted to applications having low power requirements. One factor impeding development of bulk power systems is the problem of economically collecting the energy from an extensive collection surface. Photovoltaic cells can be described as high current, low voltage devices. Typically individual cell voltage is less than about two volts, and often less than 0.6 volt. The current component is a substantial characteristic of the power generated. Efficient energy collection from an expansive surface must minimize resistive losses associated with the high current characteristic. A way to minimize resistive losses is to reduce the size of individual cells and connect them in series. Thus, voltage is stepped through each cell while current and associated resistive losses are minimized.

It is readily recognized that making effective, durable series connections among multiple small cells can be laborious, difficult and expensive. In order to approach economical mass production of series connected arrays of individual cells, a number of factors must be considered in addition to the type of photovoltaic materials chosen. These include the substrate employed and the process envisioned. Since thin films can be deposited over expansive areas, thin film technologies offer additional opportunities for mass production of interconnected arrays compared to inherently small, discrete single crystal silicon cells. Thus a number of U.S. Patents have issued proposing designs and processes to achieve series interconnections among the thin film photovoltaic cells. Many of these technologies comprise deposition of photovoltaic thin films on glass substrates followed by scribing to form smaller area individual cells. Multiple steps then follow to electrically connect the individual cells in series array. Examples of these proposed processes are presented in U.S. Pat. Nos. 4,443,651, 4,724,011, and 4,769,086 to Swartz, Turner et al. and Tanner et al. respectively. While expanding the opportunities for mass production of interconnected cell arrays compared with single crystal silicon approaches, glass substrates must inherently be processed on an individual batch basis.

More recently, developers have explored depositing wide area films using continuous roll-to-roll processing. This technology generally involves depositing thin films of photovoltaic material onto a continuously moving web. However, a challenge still remains regarding subdividing the expansive films into individual cells followed by interconnecting into a series connected array. For example, U.S. Pat. No. 4,965,655 to Grimmer et. al. and U.S. Pat. No. 4,697,041 to Okamiwa teach processes requiring expensive laser scribing and interconnections achieved with laser heat staking. In addition, these two references teach a substrate of thin vacuum deposited metal on films of relatively expensive polymers. The electrical resistance of thin vacuum metallized layers significantly limits the active area of the individual interconnected cells.

Many of the legacy techniques used to interconnect individual photovoltaic cells into a modular format involve the use of low melting point metal solders and/or electrically conductive adhesives. These techniques are time consuming, expensive, and often require batch processing. Moreover, the electrical connections achieved with solder and/or electrically conductive adhesives have historically been susceptible to deterioration when exposed to environmental or mechanical stress.

It has become well known in the art that the efficiencies of certain promising thin film photovoltaic junctions can be substantially increased by high temperature treatments. These treatments involve temperatures at which even the most heat resistant plastics suffer rapid deterioration, thereby requiring either ceramic, glass, or metal substrates to support the thin film junctions. Use of a glass or ceramic substrates generally restricts one to batch processing and handling difficulty. Use of a metal foil as a substrate allows continuous roll-to-roll processing. However, despite the fact that use of a metal foil allows high temperature processing in roll-to-roll fashion, the subsequent interconnection of individual cells effectively in an interconnected array has proven difficult, in part because the metal foil substrate is electrically conducting.

U.S. Pat. No. 4,746,618 to Nath et al. teaches a design and process to achieve interconnected arrays using roll-to-roll processing of a metal web substrate such as stainless steel. The process includes multiple operations of cutting, selective deposition, and riveting. These operations add considerably to the final interconnected array cost.

U.S. Pat. No. 5,385,848 to Grimmer teaches roll-to-roll methods to achieve integrated series connections of adjacent thin film photovoltaic cells supported on an electrically conductive metal substrate. The process includes mechanical or chemical etch removal of a portion of the photovoltaic semiconductor and transparent top electrode to expose a portion of the electrically conductive metal substrate. The exposed metal serves as a contact area for interconnecting adjacent cells. These material removal techniques are troublesome for a number of reasons. First, many of the chemical elements involved in the best photovoltaic semiconductors are expensive and environmentally unfriendly. This removal subsequent to controlled deposition involves containment, dust and dirt collection and disposal, and possible cell contamination. This is not only wasteful but considerably adds to expense. Secondly, the removal processes are difficult to control dimensionally. Thus a significant amount of the valuable photovoltaic semiconductor is lost to the removal process. Ultimate module efficiencies are further compromised in that the spacing between adjacent cells grows, thereby reducing the effective active collector area for a given module area.

Thus there remains a need for manufacturing processes and articles which allow separate production of photovoltaic structures while also offering unique means to achieve effective integrated connections.

A further unsolved problem which has thwarted production of expansive surface photovoltaic modules is that of collecting the photogenerated current from the top, light incident surface. Transparent conductive oxide (TCO) layers are normally employed as a top surface electrode. However, these TCO layers are relatively resistive compared to pure metals. Thus, efforts must be made to minimize resistive losses in transport of current through the TCO layer. One approach is simply to reduce the surface area of individual cells to a manageable amount. However, as cell widths decrease, the width of the area between individual cells (interconnect area) should also decrease so that the relative portion of inactive surface of the interconnect area does not become excessive. Typical cell widths of one centimeter are often taught in the art. These small cell widths demand very fine interconnect area widths, which dictate delicate and sensitive techniques to be used to electrically connect the top TCO surface of one cell to the bottom electrode of an adjacent series connected cell. Furthermore, achieving good stable ohmic contact to the TCO cell surface has proven difficult, especially when one employs those sensitive techniques available when using the TCO only as the top collector electrode. Another method is to form a current collector grid over the surface. This approach positions highly conductive material in contact with the surface of the TCO in a spaced arrangement such that the travel distance of current through the TCO is reduced. In the case of the classic single crystal silicon or polycrystal silicon cells, a common approach is to form a collector grid pattern of traces using a silver containing paste and then fuse the paste to sinter the silver particles into continuous conductive silver paths. These highly conductive traces normally lead to a collection buss such as a copper foil strip. One notes that this approach involves use of expensive silver and requires the photovoltaic semiconductors tolerate the high fusion temperatures. Another approach is to attach an array of fine copper wires to the surface of the TCO. The wires may also lead to a collection buss, or alternatively extend to an electrode of an adjacent cell. This wire approach requires positioning and fixing of multiple fine fragile wires which makes mass production difficult and expensive. Another approach is to print a collector grid array on the surface of the TCO using a conductive ink, usually one containing a heavy loading of fine particulate silver. The ink is simply dried or cured at mild temperatures which do not adversely affect the cell. These approaches require the use of relatively expensive inks because of the high loading of finely divided silver. In addition, batch printing on the individual cells is laborious and expensive.

In a somewhat removed segment of technology, a number of electrically conductive fillers have been used to produce electrically conductive polymeric materials. This technology generally involves mixing of a conductive filler such as silver particles with the polymer resin prior to fabrication of the material into its final shape. Conductive fillers may have high aspect ratio structure such as metal fibers, metal flakes or powder, or highly structured carbon blacks, with the choice based on a number of cost/performance considerations. More recently, fine particles of intrinsically conductive polymers have been employed as conductive fillers within a resin binder. Electrically conductive polymers have been used as bulk thermoplastic compositions, or formulated into paints and inks. Their development has been spurred in large part by electromagnetic radiation shielding and static discharge requirements for plastic components used in the electronics industry. Other known applications include resistive heating fibers and battery components and production of conductive patterns and traces. The characterization "electrically conductive polymer" covers a very wide range of intrinsic resistivities depending on the filler, the filler loading and the methods of manufacture of the filler/polymer blend. Resistivities for filled electrically conductive polymers may be as low as 0.00001 ohm-cm. for very heavily filled silver inks, yet may be as high as 10,000 ohm-cm or even more for lightly filled carbon black materials or other "anti-static" materials. "Electrically conductive polymer" has become a broad industry term to characterize all such materials. In addition, it has been reported that recently developed intrinsically conducting polymers (absent conductive filler) may exhibit resistivities comparable to pure metals.

In yet another separate technological segment, coating plastic substrates with metal electrodeposits has been employed to achieve decorative effects on items such as knobs, cosmetic closures, faucets, and automotive trim. The normal conventional process actually combines two primary deposition technologies. The first is to deposit an adherent metal coating using chemical (electroless) deposition to first coat the nonconductive plastic and thereby render its surface highly conductive. This electroless step is then followed by conventional electroplating. ABS (acrylonitrile-butadiene-styrene) plastic dominates as the substrate of choice for most applications because of a blend of mechanical and process properties and ability to be uniformly etched. The overall plating process comprises many steps. First, the plastic substrate is chemically etched to microscopically roughen the surface. This is followed by depositing an initial metal layer by chemical reduction (typically referred to as "electroless plating"). This initial metal layer is normally copper or nickel of thickness typically one-half micrometer. The object is then electroplated with metals such as bright nickel and chromium to achieve the desired thickness and decorative effects. The process is very sensitive to processing variables used to fabricate the plastic substrate, limiting applications to carefully prepared parts and designs. In addition, the many steps employing harsh chemicals make the process intrinsically costly and environmentally difficult. Finally, the sensitivity of ABS plastic to liquid hydrocarbons has prevented certain applications. ABS and other such polymers have been referred to as "electroplateable" polymers or resins. This is a misnomer in the strict sense, since ABS (and other nonconductive polymers) are incapable of accepting an electrodeposit directly and must be first metallized by other means before being finally coated with an electrodeposit. The conventional technology for electroplating on plastic (etching, chemical reduction, electroplating) has been extensively documented and discussed in the public and commercial literature. See, for example, Saubestre, Transactions of the Institute of Metal Finishing, 1969, Vol. 47., or Arcilesi et al., Products Finishing, March 1984.

Many attempts have been made to simplify the process of electroplating on plastic substrates. Some involve special chemical techniques to produce an electrically conductive film on the surface. Typical examples of this approach are taught by U.S. Pat. No. 3,523,875 to Minklei, U.S. Pat. No. 3,682,786 to Brown et. al., and U.S. Pat. No. 3,619,382 to Lupinski. The electrically conductive film produced was then electroplated. None of these attempts at simplification have achieved any recognizable commercial application.

A number of proposals have been made to make the plastic itself conductive enough to allow it to be electroplated directly thereby avoiding the "electroless plating" process. It is known that one way to produce electrically conductive polymers is to incorporate conductive or semiconductive fillers into a polymeric binder. Investigators have attempted to produce electrically conductive polymers capable of accepting an electrodeposited metal coating by loading polymers with relatively small conductive particulate fillers such as graphite, carbon black, and silver or nickel powder or flake. Heavy such loadings are sufficient to reduce volume resistivity to a level where electroplating may be considered. However, attempts to make an acceptable electroplateable polymer using the relatively small metal containing fillers alone encounter a number of barriers. First, the most conductive fine metal containing fillers such as silver are relatively expensive. The loadings required to achieve the particle-to-particle proximity to achieve acceptable conductivity increases the cost of the polymer/filler blend dramatically. The metal containing fillers are accompanied by further problems. They tend to cause deterioration of the mechanical properties and processing characteristics of many resins. This significantly limits options in resin selection. All polymer processing is best achieved by formulating resins with processing characteristics specifically tailored to the specific process (injection molding, extrusion, blow molding, printing etc.). A required heavy loading of metal filler severely restricts ability to manipulate processing properties in this way. A further problem is that metal fillers can be abrasive to processing machinery and may require specialized screws, barrels, and the like.

Another major obstacle involved in the electroplating of electrically conductive polymers is a consideration of adhesion between the electrodeposited metal and polymeric substrate (metal/polymer adhesion). In most cases sufficient adhesion is required to prevent metal/polymer separation during extended environmental and use cycles. Despite being electrically conductive, a simple metal-filled polymer offers no assured bonding mechanism to produce adhesion of an electrodeposit since the metal particles may be encapsulated by the resin binder, often resulting in a resin-rich "skin".

A number of methods to enhance electrodeposit adhesion to electrically conductive polymers have been proposed. For example, etching of the surface prior to plating can be considered. Etching can be achieved by immersion in vigorous solutions such as chromic/sulfuric acid. Alternatively, or in addition, an etchable species can be incorporated into the conductive polymeric compound. The etchable species at exposed surfaces is removed by immersion in an etchant prior to electroplating. Oxidizing surface treatments can also be considered to improve metal/plastic adhesion. These include processes such as flame or plasma treatments or immersion in oxidizing acids. In the case of conductive polymers containing finely divided metal, one can propose achieving direct metal-to-metal adhesion between electrodeposit and filler. However, here the metal particles are generally encapsulated by the resin binder, often resulting in a resin rich "skin". To overcome this effect, one could propose methods to remove the "skin", exposing active metal filler to bond to subsequently electrodeposited metal.

Another approach to impart adhesion between conductive resin substrates and electrodeposits is incorporation of an "adhesion promoter" at the surface of the electrically conductive resin substrate. This approach was taught by Chien et al. in U.S. Pat. No. 4,278,510 where maleic anhydride modified propylene polymers were taught as an adhesion promoter. Luch, in U.S. Pat. No. 3,865,699 taught that certain sulfur bearing chemicals could function to improve adhesion of initially electrodeposited Group VIII metals.

For the above reasons, electrically conductive polymers employing metal fillers have not been widely used as bulk substrates for electroplateable articles. Such metal containing polymers have found use as inks or pastes in production of printed circuitry. Revived efforts and advances have been made in the past few years to accomplish electroplating onto printed conductive patterns formed by silver filled inks and pastes.

An additional physical obstacle confronting practical electroplating onto electrically conductive polymers is the initial "bridge" of electrodeposit onto the surface of the electrically conductive polymer. In electrodeposition, the substrate to be plated is often made cathodic through a pressure contact to a metal rack tip, itself under cathodic potential. However, if the contact resistance is excessive or the substrate is insufficiently conductive, the electrodeposit current favors the rack tip to the point where the electrodeposit will not bridge to the substrate.

Moreover, a further problem is encountered even if specialized racking or cathodic contact successfully achieves electrodeposit bridging to the substrate. Many of the electrically conductive polymers have resistivities far higher than those of typical metal substrates. Also, many applications involve electroplating onto a thin (less than 25 micrometer) printed substrate. The conductive polymeric substrate may be relatively limited in the amount of electrodeposition current which it alone can convey. Thus, the conductive polymeric substrate does not cover almost instantly with electrodeposit as is typical with metallic substrates. Except for the most heavily loaded and highly conductive polymer substrates, a large portion of the electrodeposition current must pass back through the previously electrodeposited metal growing laterally over the surface of the conductive plastic substrate. In a fashion similar to the bridging problem discussed above, the electrodeposition current favors the electrodeposited metal and the lateral growth can be extremely slow and erratic. This restricts the size and "growth length" of the substrate conductive pattern, increases plating costs, and can also result in large non-uniformities in electrodeposit integrity and thickness over the pattern.

This lateral growth is dependent on the ability of the substrate to convey current. Thus, the thickness and resistivity of the conductive polymeric substrate can be defining factors in the ability to achieve satisfactory electrodeposit coverage rates. When dealing with selectively electroplated patterns long thin metal traces are often desired, deposited on a relatively thin electrically conductive polymer substrate. These factors of course often work against achieving the desired result.

This coverage rate problem likely can be characterized by a continuum, being dependent on many factors such as the nature of the initially electrodeposited metal, electroplating bath chemistry, the nature of the polymeric binder and the resistivity of the electrically conductive polymeric substrate. As a "rule of thumb", the instant inventor estimates that coverage rate issue would demand attention if the resistivity of the conductive polymeric substrate rose above about 0.001 ohm-cm. Alternatively, a "rule of thumb" appropriate for thin film substrates would be that attention is appropriate if the substrate film to be plated had a surface "sheet" resistance of greater than about 0.1 ohm per square.

The least expensive (and least conductive) of the readily available conductive fillers for plastics are carbon blacks. Attempts have been made to electroplate electrically conductive polymers using carbon black loadings. Examples of this approach are the teachings of U.S. Pat. Nos. 4,038,042, 3,865,699, and 4,278,510 to Adelman, Luch, and Chien et al. respectively.

Adelman taught incorporation of conductive carbon black into a polymeric matrix to achieve electrical conductivity required for electroplating. The substrate was pre-etched in chromic/sulfuric acid to achieve adhesion of the subsequently electroplated metal. A fundamental problem remaining unresolved by the Adelman teaching is the relatively high resistivity of carbon loaded polymers. The lowest "microscopic resistivity" generally achievable with carbon black loaded polymers is about 1 ohm-cm. This is about five to six orders of magnitude higher than typical electrodeposited metals such as copper or nickel. Thus, the electrodeposit bridging and coverage rate problems described above remained unresolved by the Adelman teachings.

Luch in U.S. Pat. No. 3,865,699 and Chien et al. in U.S. Pat. No. 4,278,510 also chose carbon black as a filler to provide an electrically conductive surface for the polymeric compounds to be electroplated. The Luch Pat. No. 3,865,699 and the Chien Pat. No. 4,278,510 are hereby incorporated in their entirety by this reference. However, these inventors further taught inclusion of materials to increase the rate of metal coverage or the rate of metal deposition on the polymer. These materials can be described herein as "electrodeposit growth rate accelerators" or "electrodeposit coverage rate accelerators". An electrodeposit coverage rate accelerator is a material functioning to increase the electrodeposition coverage rate over the surface of an electrically conductive polymer independent of any incidental affect it may have on the conductivity of an electrically conductive polymer. In the embodiments, examples and teachings of U.S. Pat. Nos. 3,865,699 and 4,278,510, it was shown that certain sulfur bearing materials, including elemental sulfur, can function as electrodeposit coverage or growth rate accelerators to overcome problems in achieving electrodeposit coverage of electrically conductive polymeric surfaces having relatively high resistivity or thin electrically conductive polymeric substrates having limited current carrying capacity.

In addition to elemental sulfur, sulfur in the form of sulfur donors such as sulfur chloride, 2-mercapto-benzothiazole, N-cyclohexyle-2-benzothiaozole sulfonomide, dibutyl xanthogen disulfide, and tetramethyl thiuram disulfide or combinations of these and sulfur were identified. Those skilled in the art will recognize that these sulfur donors are the materials which have been used or have been proposed for use as vulcanizing agents or accelerators. Since the polymer-based compositions taught by Luch and Chien et al. could be electroplated directly they could be accurately defined as directly electroplateable resins (DER). These directly electroplateable resins (DER) can be generally described as electrically conductive polymers with the inclusion of a growth rate accelerator.

Specifically for the present invention, specification, and claims, directly electroplateable resins, (DER), are characterized by the following features:
(a) presence of an electrically conductive polymer;
(b) presence of an electrodeposit coverage rate accelerator;
(c) presence of the electrically conductive polymer and the electrodeposit coverage rate accelerator in the directly electroplateable composition in cooperative amounts required to achieve direct coverage of the composition with an electrodeposited metal or metal-based alloy.

In his Patents, Luch specifically identified unsaturated elastomers such as natural rubber, polychloroprene, butyl rubber, chlorinated butyl rubber, polybutadiene rubber, acrylonitrile-butadiene rubber, styrene-butadiene rubber etc. as suitable for the matrix polymer of a directly electroplateable resin. Other polymers identified by Luch as useful included polyvinyls, polyolefins, polystyrenes, polyamides, polyesters and polyurethanes.

When used alone, the minimum workable level of carbon black required to achieve "microscopic" electrical resistivities of less than 1000 ohm-cm. for a polymer/carbon black mix appears to be about 8 weight percent based on the combined weight of polymer plus carbon black. The "microscopic" material resistivity generally is not reduced below about 1 ohm-cm. by using conductive carbon black alone. This is several orders of magnitude larger than typical metal resistivities.

It is understood that in addition to carbon blacks, other well known, highly conductive fillers can be considered in DER compositions. Examples include but are not limited to metallic fillers or flake such as silver. In these cases the more highly conductive fillers can be used to augment or even replace the conductive carbon black. Furthermore, one may consider using intrinsically conductive polymers to supply the required conductivity. In this case, it may not be necessary to add conductive fillers to the polymer.

The "bulk, macroscopic" resistivity of conductive carbon black filled polymers can be further reduced by augmenting the carbon black filler with additional highly conductive, high aspect ratio fillers such as metal containing fibers. This can be an important consideration in the success of certain applications. Furthermore, one should realize that incorporation of non-conductive fillers may increase the "bulk, macroscopic" resistivity of conductive polymers loaded with finely divided conductive fillers without significantly altering the "microscopic resistivity" of the conductive polymer "matrix" encapsulating the non-conductive filler particles.

Regarding electrodeposit coverage rate accelerators, both Luch and Chien et al. in the above discussed U.S. Patents demonstrated that sulfur and other sulfur bearing materials such as sulfur donors and vulcanization accelerators function as electrodeposit coverage rate accelerators when using an initial Group VIII metal electrodeposit "strike" layer. Thus, an electrodeposit coverage rate accelerator need not be electrically conductive, but may be a material that is normally characterized as a non-conductor. The coverage rate accelerator need not appreciably affect the conductivity of the polymeric substrate. As an aid in understanding the function of an electrodeposit coverage rate accelerator the following is offered:

a. A specific conductive polymeric structure is identified as having insufficient current carrying capacity to be directly electroplated in a practical manner.

b. A material is added to the conductive polymeric material forming said structure. Said material addition may have insignificant affect on the current carrying capacity of the structure (i.e. it does not appreciably reduce resistivity or increase thickness).

c. Nevertheless, inclusion of said material greatly increases the speed at which an electrodeposited metal laterally covers the electrically conductive surface.

It is contemplated that a coverage rate accelerator may be present as an additive, as a species absorbed on a filler surface, or even as a functional group attached to the polymer chain. One or more growth rate accelerators may be present in a directly electroplateable resin (DER) to achieve combined, often synergistic results.

A hypothetical example might be an extended trace of conductive ink having a dry thickness of 1 micrometer. Such inks typically include a conductive filler such as silver, nickel, copper, conductive carbon etc. The limited thickness of the ink reduces the current carrying capacity of this trace thus preventing direct electroplating in a practical manner. However, inclusion of an appropriate quantity of a coverage rate accelerator may allow the conductive trace to be directly electroplated in a practical manner.

One might expect that other Group 6A elements, such as oxygen, selenium and tellurium, could function in a way similar to sulfur. In addition, other combinations of electrodeposited metals, such as copper and appropriate coverage rate accelerators may be identified. It is important to recognize that such an electrodeposit coverage rate accelerator is important in order to achieve direct electrodeposition in a practical way onto polymeric substrates having low conductivity or very thin electrically conductive polymeric substrates having restricted current carrying ability.

It has also been found that the inclusion of an electrodeposit coverage rate accelerator promotes electrodeposit bridging from a discrete cathodic metal contact to a DER surface. This greatly reduces the bridging problems described above.

Due to multiple performance problems associated with their intended end use, none of the attempts identified above to directly electroplate electrically conductive polymers or plastics has ever achieved any recognizable commercial success. Nevertheless, the current inventor has persisted in personal efforts to overcome certain performance deficiencies associated with the initial DER technology. Along with these efforts has come a recognition of unique and eminently suitable applications employing the DER technology. Some examples of these unique applications for electroplated articles include solar cell electrical current collection grids, electrodes, electrical circuits, electrical traces, circuit boards, antennas, capacitors, induction heaters, connectors, switches, resistors, inductors, batteries, fuel cells, coils, signal lines, power lines, radiation reflectors, coolers, diodes, transistors, piezoelectric elements, photovoltaic cells, emi shields, biosensors and sensors. One readily recognizes that the demand for such functional applications for electroplated articles is relatively recent and has been particularly explosive during the past decade.

It is important to recognize a number of important characteristics of directly electroplateable resins (DERs) which facilitate the current invention. One such characteristic of the DER technology is its ability to employ polymer resins and formulations generally chosen in recognition of the fabrication process envisioned and the intended end use requirements. In order to provide clarity, examples of some such fabrication processes are presented immediately below in subparagraphs 1 through 7.

(1) Should it be desired to electroplate an ink, paint, coating, or paste which may be printed or formed on a substrate, a good film forming polymer, for example a soluble resin such as an elastomer, can be chosen to fabricate a DER ink (paint, coating, paste etc.). For example, in some embodiments thermoplastic elastomers having an olefin base, a urethane base, a block copolymer base or a random copolymer base may be appropriate. In some embodiments the coating may comprise a water based latex. Other embodiments may employ more rigid film forming polymers. The DER ink composition can be tailored for a specific process such flexographic printing, rotary silk screening, gravure printing, flow coating, spraying etc. Furthermore, additives can be employed to improve the adhesion of the DER ink to various substrates. One example would be tackifiers.

(2) Very thin DER traces often associated with collector grid structures can be printed and then electroplated due to the inclusion of the electrodeposit growth rate accelerator.

(3) Should it be desired to cure the DER substrate to a 3 dimensional matrix, an unsaturated elastomer or other "curable" resin may be chosen.

(4) DER inks can be formulated to form electrical traces on a variety of flexible substrates. For example, should it be desired to form electrical structure on a laminating film, a DER ink adherent to the sealing surface of the laminating film can be effectively electroplated with metal and subsequently laminated to a separate surface.

(5) Should it be desired to electroplate a fabric, a DER ink can be used to coat all or a portion of the fabric intended to be electroplated. Furthermore, since DER's can be fabricated out of the thermoplastic materials commonly used to create fabrics, the fabric itself could completely or partially comprise a DER. This would eliminate the need to coat the fabric.

(6) Should one desire to electroplate a thermoformed article or structure, DER's would represent an eminently suitable material choice. DER's can be easily formulated using olefinic materials which are often a preferred material for the thermoforming process. Furthermore, DER's can be easily and inexpensively extruded into the sheet like structure necessary for the thermoforming process.

(7) Should one desire to electroplate an extruded article or structure, for example a sheet or film, DER' s can be formulated to possess the necessary melt strength advantageous for the extrusion process.

(8) Should one desire to injection mold an article or structure having thin walls, broad surface areas etc. a DER composition comprising a high flow polymer can be chosen.

(9) Should one desire to vary adhesion between an electrodeposited DER structure supported by a substrate the DER material can be formulated to supply the required adhesive characteristics to the substrate. For example, the polymer chosen to fabricate a DER ink can be chosen to cooperate with an "ink adhesion promoting" surface treatment such as an material primer or corona treatment. In this regard, it has been observed that it may be advantageous to limit such adhesion promoting treatments to a single side of the substrate. Treatment of both sides of the substrate in a roll to roll process may adversely affect the surface of the DER material and may lead to deterioration in plateability. For example, it has been observed that primers on both sides of a roll of PET film have adversely affected plateability of DER inks printed on the PET. It is believed that this is due to primer being transferred to the surface of the DER ink when the PET is rolled up.

All polymer fabrication processes require specific resin processing characteristics for success. The ability to "custom formulate" DER's to comply with these changing processing and end use requirements while still allowing facile, quality electroplating is a significant factor in the teachings of the current invention.

Another important recognition regarding the suitability of DER's for the teachings of the current invention is the simplicity of the electroplating process. Unlike many conventional electroplated plastics, DER's do not require a significant number of process steps prior to actual electroplating. This allows for simplified manufacturing and improved process control. It also reduces the risk of cross contamination such as solution dragout from one process bath being transported to another process bath. The simplified manufacturing process will also result in reduced manufacturing costs.

Another important recognition regarding the suitability of DER's for the teachings of the current invention is the wide variety of metals and alloys capable of being electrodeposited. Deposits may be chosen for specific attributes. Examples may include copper for conductivity and nickel for corrosion resistance.

Yet another recognition of the benefit of DER's for the teachings of the current invention is the ability they offer to selectively electroplate an article or structure. The articles of the current invention often consist of metal patterns selectively positioned in conjunction with insulating materials. Such selective positioning of metals is often expensive and difficult. However, the attributes of the DER technology make the technology eminently suitable for the production of such selectively positioned metal structures. As will be shown in later embodiments, it is often desired to electroplate a polymer or polymer-based structure in a selective manner. DER's are eminently suitable for such selective electroplating.

Yet another recognition of the benefit of DER's for the teachings of the current invention is the ability they offer to continuously electroplate an article or structure. As will be shown in later embodiments, it is often desired to continuously electroplate articles. DER's are eminently suitable for such continuous electroplating. Furthermore, DER's allow for selective electroplating in a continuous manner.

Yet another recognition of the benefit of DER's for the teachings of the current invention is their ability to withstand the pre-treatments often required to prepare other materials for plating. For example, were a DER to be combined with a metal, the DER material would be resistant to many of the pre-treatments such as cleaning which may be necessary to electroplate the metal.

Yet another recognition of the benefit of DER's for the teachings of the current invention is that the desired plated structure often requires the plating of long and/or broad surface areas. As discussed previously, the coverage rate accelerators included in DER formulations allow for such extended surfaces to be covered in a relatively rapid manner thus allowing one to consider the use of electroplating of conductive polymers.

These and other attributes of DER's may contribute to successful articles and processing of the instant invention. However, it is emphasized that the DER technology is but one of a number of alternative metal deposition or positioning processes suitable to produce many of the embodiments of the instant invention. Other approaches, such as electroless metal deposition or electroplating onto silver ink patterns may be suitable alternatives. These choices will become clear in light of the teachings to follow in the remaining specification, accompanying figures and claims.

In order to eliminate ambiguity in terminology, for the present invention the following definitions are supplied:

While not precisely definable, for the purposes of this specification, electrically insulating materials may generally be characterized as having electrical resistivities greater than 10,000 ohm-cm. Also, electrically conductive materials may generally be characterized as having electrical resistivities less than 0.001 ohm-cm. Also electrically resistive or semiconductive materials may generally be characterized as having electrical resistivities in the range of 0.001 ohm-cm to 10,000 ohm-cm. The characterization "electrically conductive polymer" covers a very wide range of intrinsic resistivities depending on the filler, the filler loading and the methods of manufacture of the filler/polymer blend. Resistivities for electrically conductive polymers may be as low as 0.00001 ohm-cm. for very heavily filled silver inks, yet may be as high as 10,000 ohm-cm or even more for lightly filled carbon black materials or other "anti-static" materials. "Electrically conductive polymer" has become a broad industry term to characterize all such materials. Thus, the term "electrically conductive polymer" as used in the art and in this specification and claims extends to materials of a very wide range of resitivities from about 0.00001 ohm-cm. to about 10,000 ohm-cm and higher.

An "electroplateable material" is a material having suitable attributes that allow it to be coated with a layer of electrodeposited material, either directly or following a preplating process.

A "metallizable material" is a material suitable to be coated with a metal deposited by any one or more of the available metallizing process, including chemical deposition, vacuum metallizing, sputtering, metal spraying, sintering and electrodeposition.

"Metal-based" refers to a material or structure having at least one metallic property and comprising one or more components at least one of which is a metal or metal-containing alloy.

"Alloy" refers to a substance composed of two or more intimately mixed materials.

"Group VIII metal-based" refers to a substance containing by weight 50% to 100% metal from Group VIII of the Periodic Table of Elements.

A "metal-based foil" or "bulk metal foil" refers to a thin structure of metal or metal-based material that may maintain its integrity absent a supporting structure. Generally, metal films of thickness greater than about 2 micrometers may have this characteristic (i.e. 2 micrometers, 10 micrometers, 25 micrometers, 100 micrometers, 250 micrometers). Thus, in most cases a "bulk metal foil" will have a thickness between about 2 micrometers and 250 micrometers and may comprise a laminate of multiple layers.

A "self supporting" structure is one that can be expected to maintain its integrity and form absent supporting structure.

A "film" refers to a thin material form having extended length and width relative to its thickness that may or may not be self supporting.

In this specification and claims, the terms "monolithic" or "monolithic structure" are used as is common in industry to describe structure that is made or formed from a single or uniform material. An example would be a "boat having a monolithic plastic hull".

A "continuous" form of material is one that has a length dimension far greater than its width or thickness such that the material can be supplied in its length dimension without substantial interruption.

A "continuous" process is one wherein a continuous form of a material component is supplied to the process. The material feed can be a continuous motion or repetitively intermittent, and the output is timed to remove product either by continuous motion or repetitively intermittent according to the rate of input.

A "roll-to-roll" process is one wherein a material component is fed to the process from a roll of material and the output of the process is accumulated in a roll form.

The "machine direction" is that direction in which material is transported through a process step.

The term "multiple" is used herein to mean "two or more".

A "web" is a thin, flexible sheetlike material form often characterized as continuous in a length direction.

"Sheetlike" characterizes a structure having surface dimensions far greater than the thickness dimension.

"Substantially planar" characterizes a surface structure which may comprise minor variations in surface topography but from an overall and functional perspective can be considered essentially flat.

The terms "upper", "upward facing", and "top" surfaces of structure refer to those surfaces of structures facing upward in normal use. For example, when used to describe a photovoltaic device, an "upper" surface refers to that surface facing toward the sun.

The terms "lower", "downward facing" or "bottom" surface refer to surfaces facing away from an upward facing surface of the structure.

OBJECTS OF THE INVENTION

An object of the invention is to eliminate the deficiencies in the prior art methods of producing expansive area, series or parallel interconnected photovoltaic arrays.

A further object of the present invention is to provide improved substrates to achieve series or parallel interconnections among photovoltaic cells.

A further object of the invention is to provide structures useful for collecting current from an electrically conductive surface.

A further object of the invention is to provide current collector electrode structures useful in facilitating mass production of optoelectric devices such as photovoltaic cell arrays.

A further object of the present invention is to provide improved processes whereby interconnected photovoltaic arrays can be economically mass produced.

A further object of the invention is to provide a process and means to accomplish interconnection of photovoltaic cells into an integrated array using continuous processing.

Other objects and advantages will become apparent in light of the following description taken in conjunction with the drawings and embodiments.

SUMMARY OF THE INVENTION

The current invention provides a solution to the stated need by producing the active photovoltaic cells and interconnecting structures separately and subsequently combining them to produce the desired interconnected array. One embodiment of the invention contemplates deposition of thin film photovoltaic junctions on metal foil substrates which may be heat treated following deposition if required in a continuous fashion without deterioration of the metal support structure. In a separate operation, interconnection structures are produced. In an embodiment, interconnection structures are produced in a continuous roll-to-roll fashion. In an embodiment, the interconnecting structure is laminated to the metal foil supported photovoltaic cell and conductive connections are applied to complete the array. Furthermore, the photovoltaic junction and its metal foil support can be produced in bulk. Subsequent application of a separate interconnection structure allows the interconnection structures to be uniquely formulated using polymer-based materials. Interconnections are achieved without the need to use the expensive and intricate material removal operations currently taught in the art to achieve interconnections.

In another embodiment, a separately prepared structure combining a current collector grid and interconnect portion is taught. In an embodiment the combined current collector/interconnect structure, also referred to herein as a unit of interconnecting structure, is produced in a continuous roll-to-roll fashion. The current collector/interconnect structure comprises conductive material positioned on a first surface of a laminating sheet or positioning sheet which may be positioned in abutting contact with a conductive surface such as the light incident surface of a photovoltaic cell. The interconnect portion comprises conductive material positioned on a second surface of the combined structure which may be positioned to abut the rear conductive surface of another photovoltaic cell.

BRIEF DESCRIPTION OF THE DRAWINGS

The various factors and details of the structures and manufacturing methods of the present invention are hereinafter more fully set forth with reference to the accompanying drawings wherein:

FIG. 29 is a top plan view of the original article of FIGS. 26-28 following an additional processing step.

FIG. 30 is a sectional view taken substantially from the perspective of lines 30-30 of FIG. 29.

FIG. 31 is a sectional view of the article of FIGS. 29 and 30 following an additional optional processing step.

FIG. 32 is a sectional view, similar to FIG. 22, showing an arrangement of articles just prior to combination using a process such as depicted in FIG. 21.

FIG. 46B is a sectional view of the FIG. 46A structural embodiment after addition of another component.

FIG. 46C is a top plan view of another structural embodiment.

FIG. 46D is a sectional view of the structural embodiment of FIG. 46C taken substantially from the perspective of lines 46D-46D of FIG. 46C.

FIG. 46E is a sectional view of the embodiment of FIGS. 46C and 46D after addition of another component.

FIG. 46F is a top plan view of another embodiment.

FIG. 46G is a top plan view of the structural embodiment of FIG. 46F after adding an additional structural component.

FIG. 46H is a side view of the embodiment shown in FIG. 46G.

FIG. 55 is a sectional view showing an article combining the article of FIG. 52 with a photovoltaic cell.

FIG. 56 is a sectional view embodying series interconnection of multiple articles as depicted in FIG. 55.

DESCRIPTION OF PREFERRED EMBODIMENTS

Figure 1:
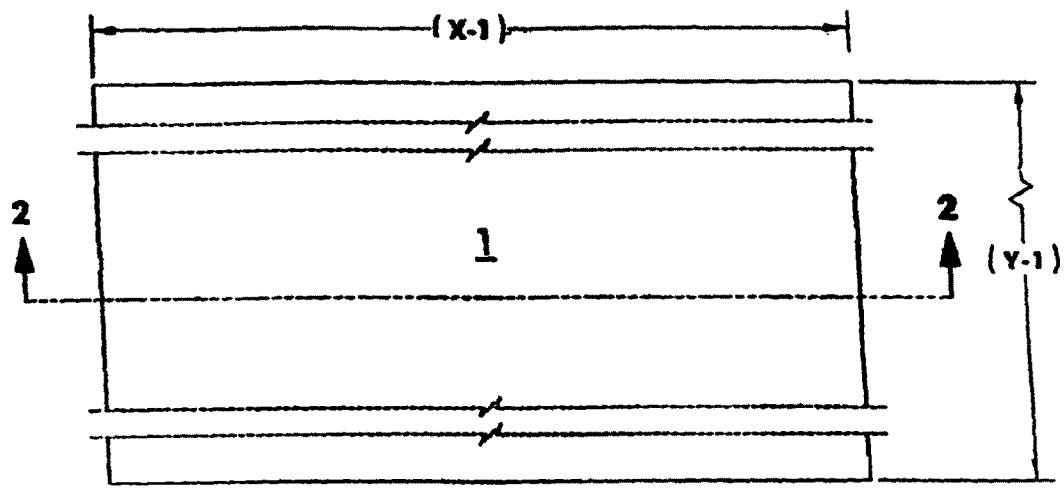
FIG. 1 is a top plan view of a thin film photovoltaic structure including its support structure.

Reference will now be made in detail to the preferred embodiments of the invention, examples of which are illustrated in the accompanying drawings. In the drawings, like reference numerals designate identical, equivalent or corresponding parts throughout several views and an additional letter designation is characteristic of a particular embodiment.

Figure 2:
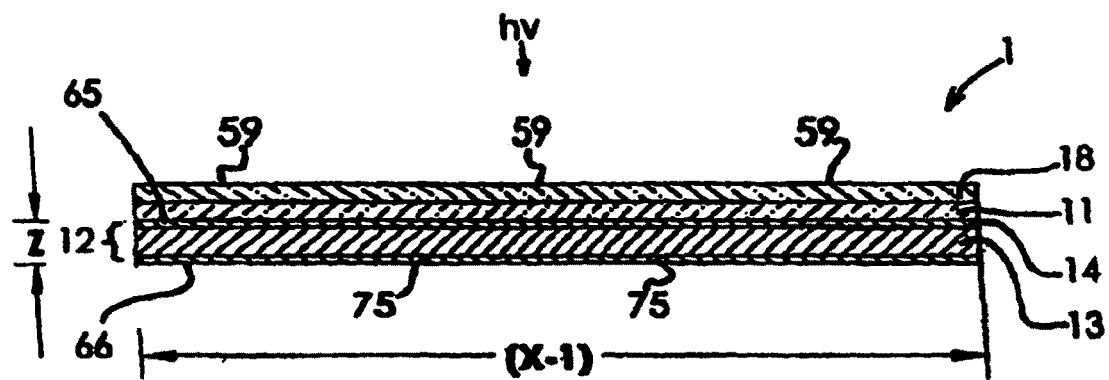
FIG. 2 is a sectional view taken substantially along the line 2-2 of FIG. 1.

Referring to FIGS. 1 and 2, an embodiment of a thin film photovoltaic structure is generally indicated by numeral 1. It is noted here that "thin film" has become commonplace in the industry to designate certain types of semiconductor materials in photovoltaic applications. These include amorphous silicon, cadmium telluride, copper-indium-gallium diselenide, dye sensitized polymers, so-called "Graetzel" electrolyte cells and the like. While the characterization "thin film" may be used to describe many of the embodiments of the instant invention, principles of the invention may extend to photovoltaic devices not normally considered "thin film" such as single crystal or polysilicon devices, as those skilled in the art will readily appreciate. Structure 1 has a light-incident top surface 59 and a bottom surface 66. Structure 1 has a width X-1 and length Y-1. It is contemplated that length Y-1 may be considerably greater than width X-1 such that length Y-1 can generally be described as "continuous" or being able to be processed in a roll-to-roll fashion. FIG. 2 shows that structure 1 embodiment comprises a thin film semiconductor structure 11 supported by "bulk" metal-based foil 12. Foil 12 has a top surface 65, bottom surface 66, and thickness "Z". In the embodiment, bottom surface 66 of foil 12 also forms the bottom surface of photovoltaic structure 1. Metal-based foil 12 may be of uniform composition or may comprise a laminate of multiple layers. For example, foil 12 may comprise a base layer of inexpensive and processable metal 13 with an additional metal-based layer 14 disposed between base layer 13 and semiconductor structure 11. The additional metal-based layer 14 may be chosen to ensure good ohmic contact between the top surface 65 of foil 12 and photovoltaic semiconductor structure 11. Bottom surface 66 of foil 12 may comprise a material 75 chosen to achieve good electrical and mechanical joining characteristics as will be shown. "Bulk" metal-based foil 12 is normally self supporting. Accordingly, the thickness "Z" of foil 12 is often between 2 micrometers and 250 micrometers (i.e. 5 micrometers, 10 micrometers, 25 micrometers, 50 micrometers, 100 micrometers, 250 micrometers), although thicknesses outside this range may be functional in certain applications. One notes for example that should additional support be possible, such as that supplied by a supporting plastic film, metal foil thickness may be far less (0.1 to 1 micrometer) than those characteristic of a "bulk" foil. Nevertheless, a foil thickness between 2 micrometers and 250 micrometers may normally provide adequate handling strength while still allowing flexibility if roll-to-roll processing were employed, as further taught hereinafter.

Figure 3:
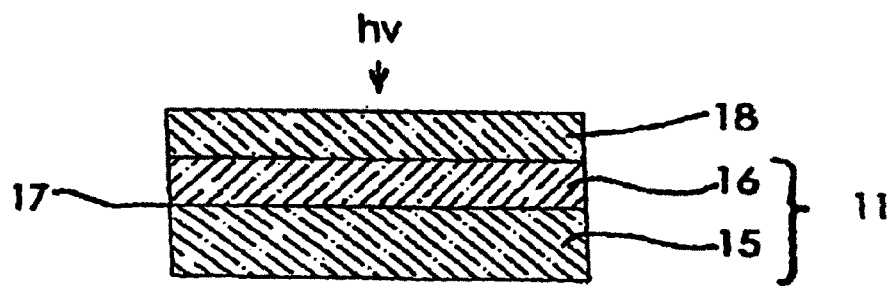
FIG. 3 is an expanded sectional view showing a form of the structure of semiconductor 11 of FIGS. 2 and 2A.

In its simplest form, a photovoltaic structure combines an n-type semiconductor with a p-type semiconductor to from a p-n junction. Often an optically transparent "window electrode" such as a thin film of zinc oxide or tin oxide is employed to minimize resistive losses involved in current collection. FIG. 3 illustrates an example of a typical photovoltaic structure in section. In FIGS. 2 and 3 and other figures, an arrow labeled "hv" is used to indicate the light incident side of the structure. In FIG. 3, 15 represents a thin film of a p-type semiconductor, 16 a thin film of n-type semiconductor and 17 the resulting photovoltaic junction. Window electrode 18 completes a typical photovoltaic structure. The exact nature of the photovoltaic semiconductor structure 11 does not form the subject matter of the present invention. For example, cells can be multiple junction or single junction and comprise homo or hetero junctions. Semiconductor structure 11 may comprise any of the thin film structures known in the art, including but not limited to CIS, CIGS, CdTe, Cu2S, amorphous silicon, so-called "Graetzel" electrolyte cells, polymer based semiconductors and the like. Structure 11 may also comprise organic solar cells such as dye sensitized cells. Further, semiconductor structure 11 may also represent characteristically "non-thin film" cells such as those based on single crystal or polycrystal silicon since many embodiments of the invention may encompass such cells, as will be evident to those skilled in the art in light of the teachings to follow.

In the following, photovoltaic cells having a metal based support foil will be used to illustrate the embodiments and teachings of the invention. However, those skilled in the art will recognize that many of the embodiments of the instant invention do not require the presence of a "bulk" foil as represented in FIGS. 1 and 2. In many embodiments, other conductive substrate structures, such as a metallized polymer film or glass having a thin metallized or conductive resin layer, may be substituted for the "bulk" metal foil.

Figure 4:
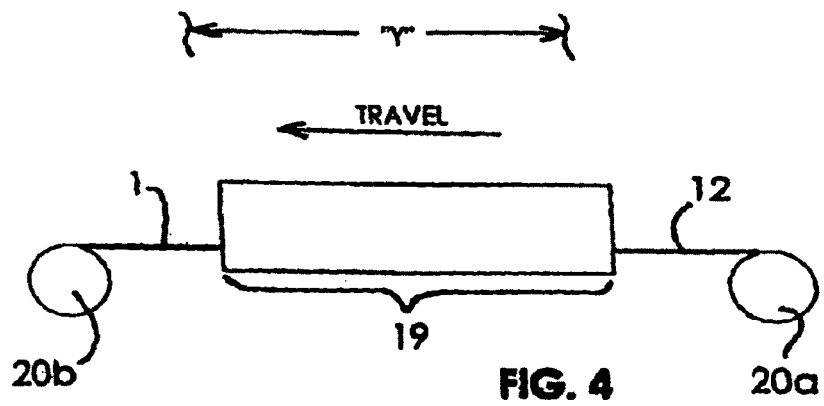
FIG. 4 illustrates a possible process for producing the structure shown in FIGS. 1-3.

FIG. 4 refers to a method of manufacture of the bulk thin film photovoltaic structures generally illustrated in FIGS. 1 and 2. In the FIG. 4 embodiment, a "bulk" metal-based support foil 12 is moved in the direction of its length Y through a deposition process, generally indicated as 19. Process 19 accomplishes deposition of the active photovoltaic structure onto foil 12. In the FIG. 4 embodiment, foil 12 is unwound from supply roll 20a, passed through deposition process 19 and rewound onto takeup roll 20b. As such, the process may be characterized as a "roll-to-roll process. Process 19 can comprise any of the processes well-known in the art for depositing thin film photovoltaic structures. These processes include electroplating, vacuum evaporation and sputtering, chemical deposition, and printing of nanoparticle precursors. Process 19 may also include treatments, such as heat treatments, intended to enhance photovoltaic cell performance.

Figure 1A:
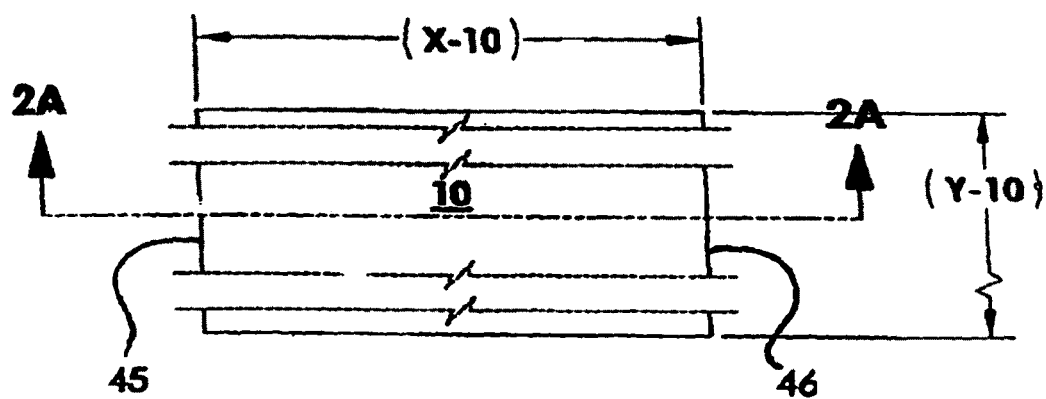
FIG. 1A is a top plan view of the article of FIG. 1 following an optional processing step of subdividing the article of FIG. 1 into cells of smaller dimension.
Figure 2A:
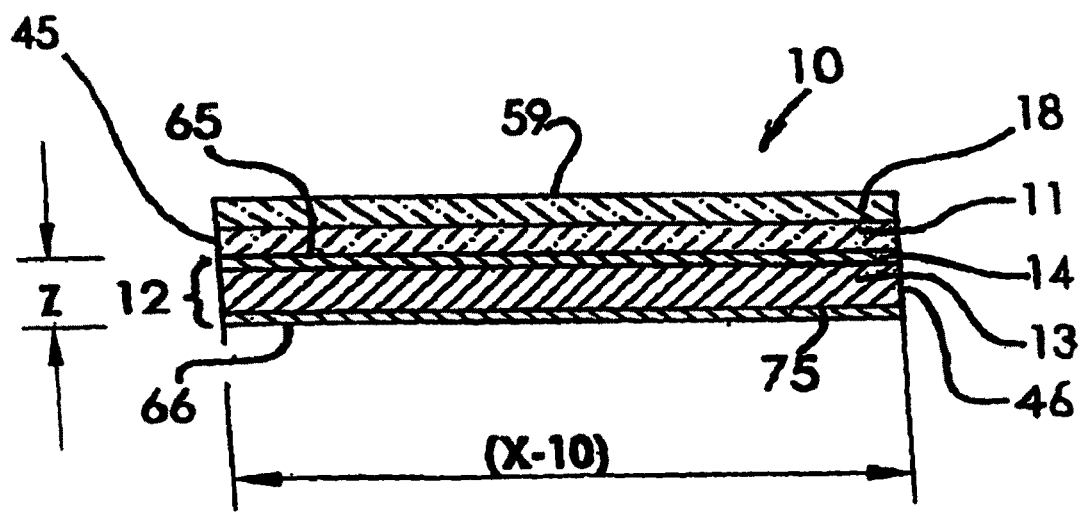
FIG. 2A is a sectional view taken substantially along the line 2A-2A of FIG. 1A.

Those skilled in the art will readily realize that the deposition process 19 of FIG. 4 may often most efficiently produce photovoltaic structure 1 having dimensions far greater than those suitable for individual cells in an interconnected array. Thus, the photovoltaic structure 1 may be subdivided into cells 10 having dimensions X-10 and Y-10 as indicated in FIGS. 1A and 2A for further fabrication. In FIG. 1A, width X-10 defines a first photovoltaic cell terminal edge 45 and second photovoltaic cell terminal edge 46. In one embodiment, for example, X-1 of FIG. 1A may be from 0.25 inches to 12 inches and Y-10 of FIG. 1A may be characterized as "continuous". In other embodiments the final form of cell 10 may be rectangular, such as 6 inch by 6 inch, 4 inch by 3 inch or 8 inch by 2 inch. In other embodiments, the photovoltaic structure 1 of FIG. 1 may be subdivided in the "X" dimension only thereby retaining the option of further processing in a "continuous" fashion in the "Y" direction. In the following, cell structure 10 in a form having dimensions suitable for interconnection into a multi-cell array may be referred to as "cell stock" or simply as cells. "Cell stock" can be characterized as being either continuous or discreet.

Figure 2B:
FIG. 2B is a simplified sectional depiction of the structure embodied in FIG. 2A.

FIG. 2B is a simplified depiction of cell 10 shown in FIG. 2A. In order to facilitate presentation of the aspects of the instant invention, the simplified depiction of cell 10 shown in FIG. 2B will normally be used.

Figure 2C:
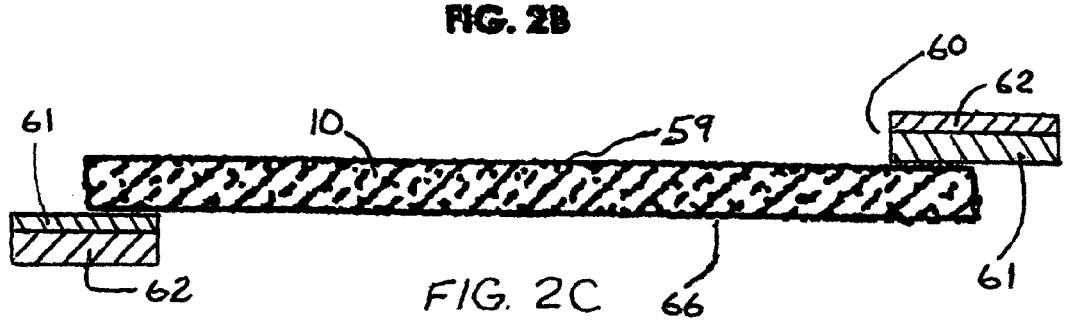
FIG. 2C is a simplified sectional view similar to FIG. 2A but also including additional insulating structure protecting raw cell edges.

FIG. 2C is a simplified depiction of cell 10 as in FIG. 2B but also showing additional structure intended to protect a raw edge of the cell from shorting. In the FIG. 2C, a strip of insulating material 60 is positioned along a cell edge. It has been found convenient to employ strips of a laminating film or pressure sensitive adhesive tape for the insulating material. An adhesive layer 61 of the strip or tape is positioned to overlap and contact a cell surface portion adjacent the edge, as shown in the drawing. A structural carrier layer 62 is also normally present to support the adhesive. The same process may be used to protect the edge either from the top or bottom sides. Heat and/or pressure may be used to activate the adhesive of an insulating laminating film strip causing it to adhere to the cell surface as shown in the FIG. 2C. It has been found that a simple plastic bag sealer or impulse sealer may be appropriate to accomplish this. Alternatively, simple room temperature application of a pressure sensitive adhesive tape (for example "Scotch Tape, a product of 3M Co.) has been used effectively. Raw edge protection is particularly appropriate when thin film photovoltaic cells are employed. In these cases, conductive electrical traces associated with current collection and cell interconnection may extend across cell edges and thus may readily short the closely spaced top and bottom surfaces of a cell. In most of the embodiments to follow, the cell depiction of FIG. 2B will be used for simplicity. However, one will understand that the FIG. 2B depiction is highly simplified and does not include component structure nor the edge protection structure which would often be present in practice.

Figure 5:
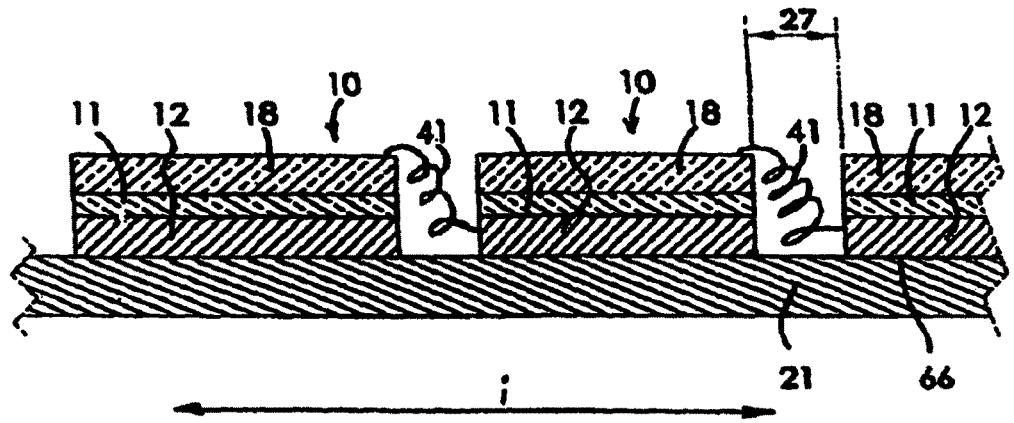
FIG. 5 is a sectional view illustrating the problems associated with making series connections among thin film photovoltaic cells shown in FIGS. 1-3.

Referring now to FIG. 5, there are illustrated cells 10 as shown in FIG. 2A. The cells have been positioned to achieve spatial positioning on the support substrate 21. Support structure 21 is by necessity non-conductive at least in a space indicated by numeral 27 separating the adjacent cells 10. This insulating space prevents short circuiting from metal foil electrode 12 of one cell to foil electrode 12 of an adjacent cell. In order to achieve series connection, electrical communication must be made from the top surface of window electrode 18 to the foil electrode 12 of an adjacent cell. This communication is shown in the FIG. 5 as a metal wire or tab 41. The direction of the net current flow for the arrangement shown in FIG. 5 is indicated by the double pointed arrow "i". It should be noted that foil electrode 12 is normally relatively thin, on the order of 5 micrometer to 250 micrometer. Therefore, connecting to its edge as indicated in FIG. 5 would be impractical. Thus, such connections are normally made to the top surface 65 or the bottom surface 66 of foil 12. One readily recognizes that connecting metal wire or tab 41 is laborious, making inexpensive production difficult.

Figure 6:
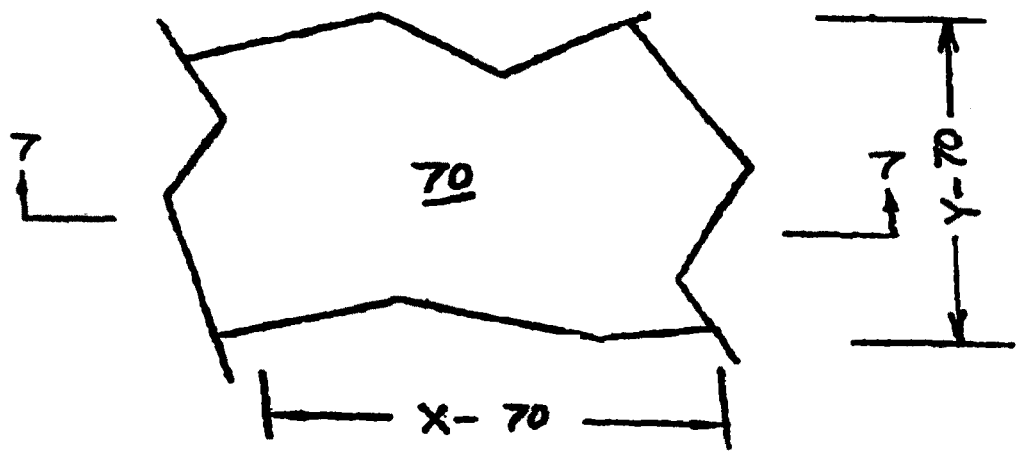
FIG. 6 is a top plan view of a starting structure for an embodiment of the instant invention.
Figure 7:
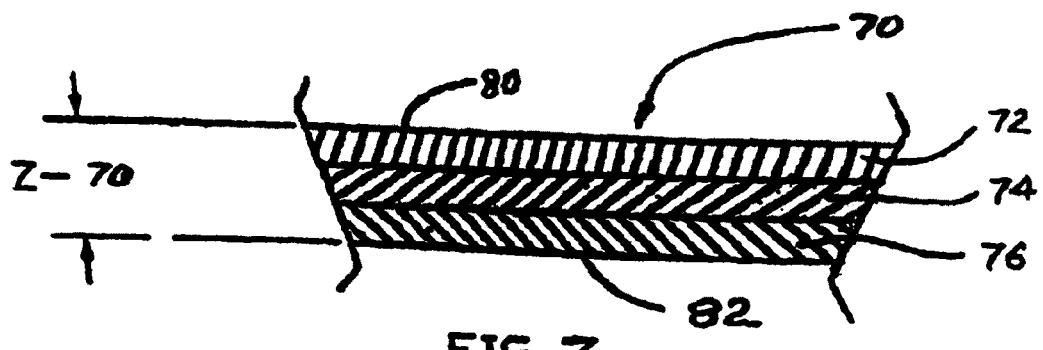
FIG. 7 is a sectional view, taken substantially along the lines 7-7 of FIG. 6, illustrating a possible laminate structure of the embodiment.

FIG. 6 is a top plan view of a starting article in production of a laminating current collector grid or electrode according to the instant invention. FIG. 6 embodies a polymer based film or glassy substrate 70. Substrate 70 has width X-70 and length Y-70. In embodiments, taught in detail below, Y-70 may be much greater than width X-70, whereby film 70 can generally be described as "continuous" in length and able to be processed in length direction Y-70 in a continuous roll-to-roll fashion. FIG. 7 is a sectional view taken substantially from the view 7-7 of FIG. 6. Thickness dimension Z-70 is small in comparison to dimensions Y-70, X-70 and thus substrate 70 may have a flexible sheetlike, or web structure contributing to possible roll-to-roll processing. Normally a flexible material can be significantly deformed and then returned to substantially its original shape. As shown in FIG. 7, substrate 70 may be a laminate of multiple layers 72, 74, 76 etc. or may comprise a single layer of material. Any number of layers 72, 74, 76 etc. may be employed. The layers 72, 74, 76 etc. may comprise inorganic or organic components such as thermoplastics, thermosets or silicon containing glass-like layers. As is understood in the art, a thermoplastic is a polymeric material which may be heated to make fluid without promoting a flow retarding chemical reaction. Also, as is understood in the art, a thermoset is a material which may cure to a rigid or non-flowing material when heated appropriately. The various layers are intended to supply functional attributes such as environmental barrier protection or adhesive characteristics. Various PV barrier layers provide a number of functional benefits including but not limited to protection from uv degradation, water or moisture ingress, scratching etc. In addition, one or more of the layers may be used to provide structural support during processing and application. Such functional layering is well-known and widely practiced in the plastic packaging art.

Sheetlike substrate 70 has first surface 80 and second surface 82. In particular, in light of the teachings to follow, one will recognize that it may be advantageous to have layer 72 forming surface 80 comprise a sealing or adhesive material such as an ethylene vinyl acetate (EVA), ethylene ethyl acetate (EEA), an ionomer, or a polyolefin based adhesive to impart adhesive characteristics during a possible subsequent lamination process. Other sealing or adhesive materials useful in certain embodiments include those comprising atactic polyolefin, or a polymer containing polar functional groups for adhesive characteristics during a possible subsequent lamination process. Other sealing or adhesive materials useful in certain embodiments include those comprising silicones, silicone gels, epoxies, polydimethyl siloxane (PDMS), RTV rubbers, such as room temperature vulcanized silicones (RTV silicones) polyvinyl butyral (PVB), thermoplastic polyurethanes (TPU), acrylics and urethanes. Both thermosetting and thermoplastic adhesives have been successfully employed in the practice of the invention.

The thickness of substrate 70, and specifically the thickness of the layers such as layer 72 forming surface 80, may vary depending on the requirements imposed by subsequent processing or end use application. For example, for a subsequent roll lamination process the thickness of layer 72 may typically be between 10 micrometers to 250 micrometers. In roll lamination, sheetlike materials are heated and passed through a "nip" created by matched rollers. Pressure and heat applied by passing through the hot "nip" expels air between the sheets and laminates them together. Alternately, should a lamination process include encapsulation of relatively thick items such as "string and tab" arrangements of cells, thicker layers from 100 micrometers to 600 micrometers may be employed for layer 72. In this case vacuum lamination may be a preferred choice of process.

Lamination of such sheetlike films employing such sealing materials is a common practice in the packaging industry. In the packaging industry lamination is known and understood as applying a film, normally polymer based and having a surface comprising a sealing material, to a second surface and sealing them together with heat and/or pressure. Sealing materials generally will have tacky or adhesive surfaces. Many suitable sealing materials may be made tacky and flowable, often under heated conditions, and retain their adhesive bond to many surfaces upon cooling. A wide variety of laminating films with associated sealing materials is possible, depending on the surface to which the adhesive seal or bond is to be made. Sealing materials such as olefin copolymers or atactic polyolefins may be advantageous, since these materials allow for the minimizing of materials which may be detrimental to the longevity of a solar cell with which it is in contact.

Additional layers 74, 76 etc. may comprise carrier materials which supply structural support for processing. A carrier material film is typically a structural polymer present to assist in overall integrity of the substrate. For example, the carrier film may structurally support relatively thin layers of an adhesive material which may not be self supporting absent the carrier. Typical carrier films comprise polymer support layers and may include polypropylene, polyethylene terepthalate (PET), polyethylene naphthalate (PEN), acrylic, and polycarbonate.

Additional layers 74, 76 may comprise barrier materials such as fluorinated polymers, biaxially oriented polypropylene (BOPP), poly(vinylidene chloride), such as Saran, a product of Dow Chemical, and Siox. Saran is a tradename for poly(vinylidene chloride) and is manufactured by Dow Chemical Corporation. Siox refers to a vapor deposited thin film of silicon oxide often deposited on a polymer support. Siox can be characterized as an ultra thin glassy layer. Siox is an example of many of the inorganic film structures being proposed as moisture barrier materials for photovoltaic cells. Other examples of very thin flexible glass materials are those identified as Corning 0211 and Schott D263. In addition, flexible transparent barrier sheets continue to be developed to allow production of flexible, environmentally secure photovoltaic modules. These more recent barrier materials adopt the Siox concept but typically comprise stacks of multiple films in a laminar structure. The films may comprise multiple inorganic layers or combinations of multiple organic and inorganic layers. The multiple layers present a tortuous path for moisture or gas molecules to penetrate through the barrier sheet. The individual layers of the barrier sheet are typically very thin, often of the order of one micrometer or less, formed by various processing such as sputtering, chemical vapor deposition and atomic layer deposition. Thus these individual layers are typically not self supporting. The barrier stack of multiple thin polymer and inorganic pairs (dyads) may be deposited onto a supporting carrier film which itself may be applied over a device for protection. An example of such a barrier film technology is that marketed by Vitex Systems under the tradename "Barix". Additional layers 74, 76 etc. may also comprise materials intended to afford protection against ultraviolet radiation and may also comprise materials to promote curing. The instant invention does not depend on the presence of any specific material for layers 72, 74, or 76. In many embodiments substrate 70 may be generally be characterized as a laminating material. For example, the invention has been successfully demonstrated using standard office laminating films of 75 micrometer and 150 micrometer thicknesses sold by GBC Corp., Northbrook, Ill., 60062. It has also been successfully demonstrated using a 75 micrometer thick Surlyn adhesive layer supported by a 50 micrometer thick polyethylene terepthalate carrier film. It has also been successfully demonstrated using a 100 micrometer thick olefinic adhesive layer supported by a 75 micrometer thick BOPP carrier film. It has also been successfully demonstrated using 75 micrometer thick EVA adhesive layer supported by a 50 micrometer thick polyethylene terepthalate carrier film. It has also been successfully demonstrated using a 250 micrometer thick Surlyn adhesive layer supported by a 50 micrometer thick polyethylene terepthalate carrier film. Surlyn is a registered trademark for an ionomer material sold by Dupont.

Figure 8:
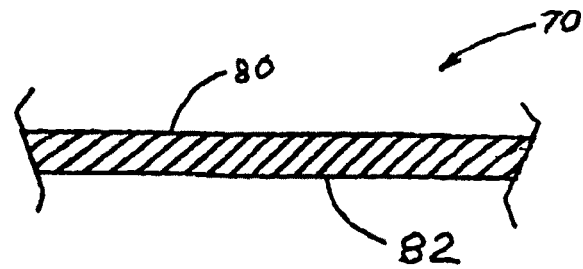
FIG. 8 is a simplified sectional depiction of the FIG. 7 structure suitable for ease of presentation of additional embodiments.

FIG. 8 depicts the structure of substrate 70 (possibly laminate) as a single layer for purposes of presentation simplicity. Substrate 70 will be represented as this single layer in the subsequent embodiments, but it will be understood that structure 70 may be a laminate of any number of layers. In addition, substrate 70 is shown in FIGS. 6 through 8 as comprising uniform, unvarying monolithic sheets. However, it is understood that various regions of substrate 70 may differ in composition. For example, selected regions of substrate 70 may comprise differing sheetlike structures patched together using appropriate seaming techniques. Possible applications for such a "patchwork" structure will become clear in light of the teachings to follow.

Figure 9:
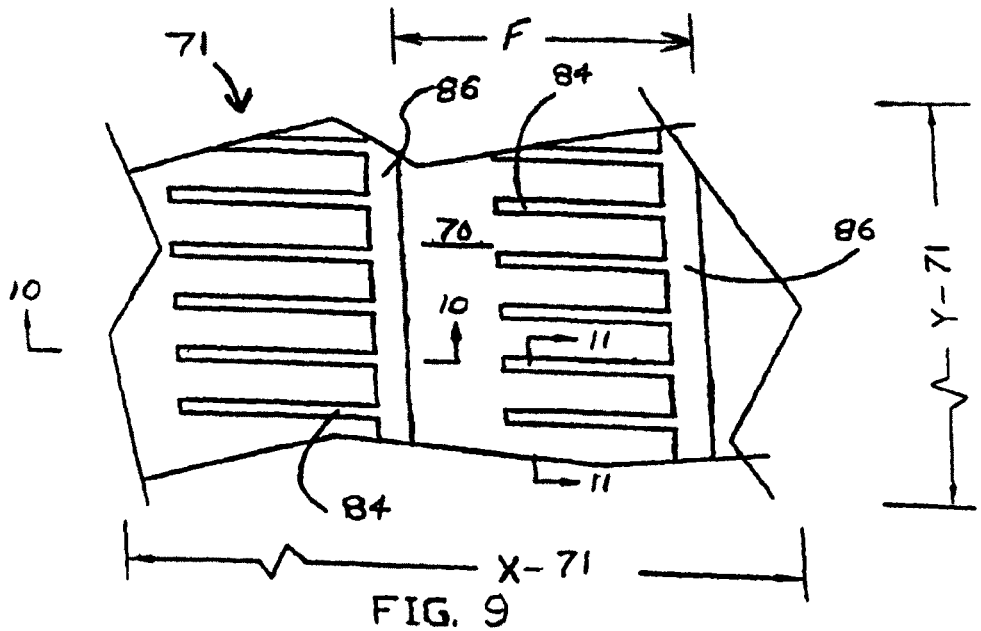
FIG. 9 is a top plan view of the structure embodied in FIGS. 6 through 8 following an additional processing step.

FIG. 9 is a plan view of the structure following an additional manufacturing step.

Figure 10:
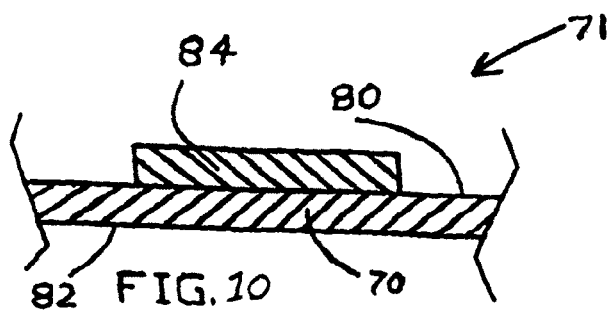
FIG. 10 is a sectional view taken substantially from the perspective of lines 10-10 of FIG. 9.

FIG. 10 is a sectional view taken along line 10-10 of FIG. 9.

Figure 11:
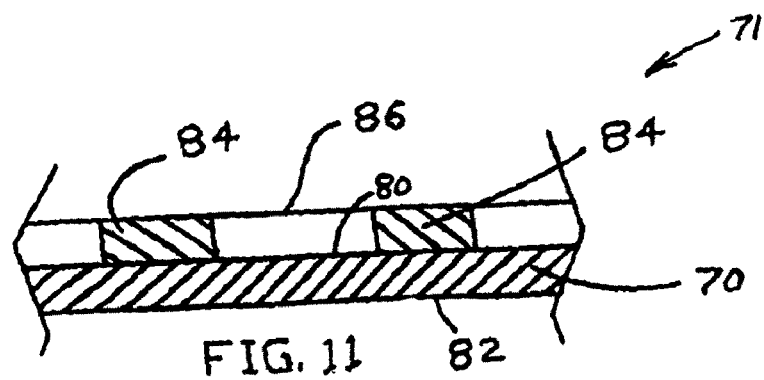
FIG. 11 is a sectional view taken substantially from the perspective of lines 11-11 of FIG. 9.

FIG. 11 is a sectional view taken along line 11-11 of FIG. 9.

In the specific embodiments of FIGS. 9, 10, and 11, the structure is now designated 71 to reflect the additional processing. It is seen that a material pattern has now been positioned on surface 80 of substrate 70. In the embodiments of FIGS. 9, 10, and 11, "fingers" or "traces" 84 and "busses" or "tabs" 86 are positioned on supporting substrate 70 in a grid pattern. "Fingers" or "traces" 84 extend in the width X-71 direction of article 71 from "busses" or "tabs" 86 extending in the Y-71 direction substantially perpendicular to the "fingers. As suggested above, article 71 may be processed and extend continuously in the length "Y-71" direction. Repetitive multiple "finger/buss" arrangements are shown in the FIG. 9 embodiment with a repeat dimension "F" as indicted. Portions of substrate 70 not overlayed by "fingers" 84 and "busses" 86 remain transparent or translucent to visible light. In the embodiment of FIGS. 9 through 11, the "fingers" 84 and "busses" 86 are shown to be a single layer for simplicity of presentation. However, the "fingers" and "busses" can comprise multiple layers of differing materials chosen to support various functional attributes. For example the material in direct contact with substrate 70 defining the "buss" or "finger" patterns may be chosen for its adhesive affinity to surface 80 of substrate 70 and also to a subsequently applied constituent of the buss or finger structure. Further, it may be advantageous to have the first visible material component of the fingers and busses be of dark color or black. As will be shown, the light incident side (upper or outside surface) of the substrate 70 will eventually be surface 82. By having the first visible component of the fingers and busses be dark, they will aesthetically blend with the generally dark color of the photovoltaic cell. This eliminates the often objectionable appearance of a metal colored grid pattern.

"Fingers" 84 and "busses" 86 may comprise electrically conductive material. Examples of such materials are metal wires and foils, stamped or die cut metal patterns, conductive metal containing inks and pastes such as those having a conductive filler comprising silver or stainless steel, patterned deposited metals such as etched metal patterns or masked vacuum deposited metals, intrinsically conductive polymers and DER formulations. In a preferred embodiment, the "fingers and "busses" comprise electroplateable material such as DER or an electrically conductive ink which will enhance or allow subsequent metal electrodeposition. "Fingers" 84 and "busses" 86 may also comprise non-conductive material which would assist accomplishing a subsequent deposition of conductive material in the pattern defined by the "fingers" and "busses". For example, "fingers" 84 or "busses" 86 could comprise a polymer which may be seeded to catalyze chemical deposition of a metal in a subsequent step. An example of such a material is seeded ABS. Patterns comprising electroplateable materials or materials facilitating subsequent electrodeposition are often referred to as "seed" patterns or layers. "Fingers" 84 and "busses" 86 may also comprise materials selected to promote adhesion of a subsequently applied conductive material. "Fingers" 84 and "busses" 86 may differ in actual composition and be applied separately. For example, "fingers" 84 may comprise a conductive ink while "buss/tab" 86 may comprise a conductive metal foil strip. Alternatively, fingers and busses may comprise a continuous unvarying monolithic material structure forming portions of both fingers and busses. Fingers and busses need not both be present in certain embodiments of the invention.

Permissible dimensions and structure for the "fingers" 84 and "busses" 86 will vary somewhat depending on materials and fabrication process used for the fingers and busses, and the dimensions of the individual photovoltaic cells. Moreover, "fingers" and "busses" may comprise material structure having dimensions, form or shape which may not be self supporting and may only be properly maintained using a supporting substrate such as sheetlike substrate 70. For example, one readily realizes that patterns of electrodeposited metal, ink traces, or patterns of fine metal wires would likely demand additional support to maintain shape and material integrity.

One will recognize that while shown in the embodiments as a continuous void free surface, "buss" 86 could be selectively structured. Such selective structuring may be appropriate to enhance functionality, such as flexibility, of article 71 or any article produced there from. Furthermore, regions of substrate 70 supporting the "buss" regions 86 may be different than those regions supporting "fingers" 84. For example, substrate 70 associated with "buss region" 86 may comprise a fabric while substrate 70 may comprise a film devoid of thru-holes in the region associated with "fingers" 84. A "holey" structure in the "buss region" would provide increased flexibility, increased surface area and increased structural characteristic for an adhesive to grip. Moreover, the embodiments of FIGS. 9 through 11 show the "fingers" and "busses" as essentially planar rectangular structures. Other geometrical forms are clearly possible, especially when design flexibility is associated with the process used to establish the material pattern of "fingers" and "busses". "Design flexible" processing includes printing of conductive inks or "seed" layers, foil etching or stamping, masked deposition using paint or vacuum deposition, and the like. For example, these conductive paths can have triangular type surface structures increasing in width (and thus cross section) in the direction of current flow. Thus the resistance decreases as net current accumulates to reduce power losses. Alternatively, one may select more intricate patterns, such as a "watershed" pattern as described in U.S. Patent Application Publication 2006/0157103 A1 which is hereby incorporated in its entirety by reference. Various structural features, such as radiused connections between fingers and busses may be employed to improve structural robustness.

The embodiment of FIG. 9 shows multiple "busses" 86 extending in the direction Y-71 with "fingers" extending from one side of the "busses" in the X-71 direction. Many different such structural arrangements of the laminating current collector structures are possible within the scope and purview of the instant invention. It is important to note however that many of the laminating current collector/interconnect structures of the instant invention may be manufactured utilizing continuous, bulk roll to roll processing. While the collector grid embodiments of the current invention may advantageously be produced using continuous processing, one will recognize that combining of grids or electrodes so produced with mating conductive surfaces may be accomplished using either continuous or batch processing. In one case it may be desired to produce photovoltaic cells having discrete defined dimensions. For example, single crystal silicon cells are often produced having X-Y dimensions of approximately 6 inches by 6 inches. In this case the collector grids of the instant invention, which may themselves be produced continuously, may then be subdivided to dimensions appropriate for combining with such cells. In other cases, such as production of many thin film photovoltaic structures, a continuous roll-to-roll production of an expansive surface article can be accomplished in the "Y" direction as identified in FIG. 1. Such a continuous expansive photovoltaic structure may be combined with a continuous arrangement of collector grids of the instant invention in a semicontinuous or continuous manner. Alternatively the expansive semiconductor structure may be subdivided into continuous strips of cell stock. In this case, combining a continuous strip of cell stock with a continuous strip of collector grid of the instant invention may be accomplished in a continuous or semi-continuous manner.

Figure 12:
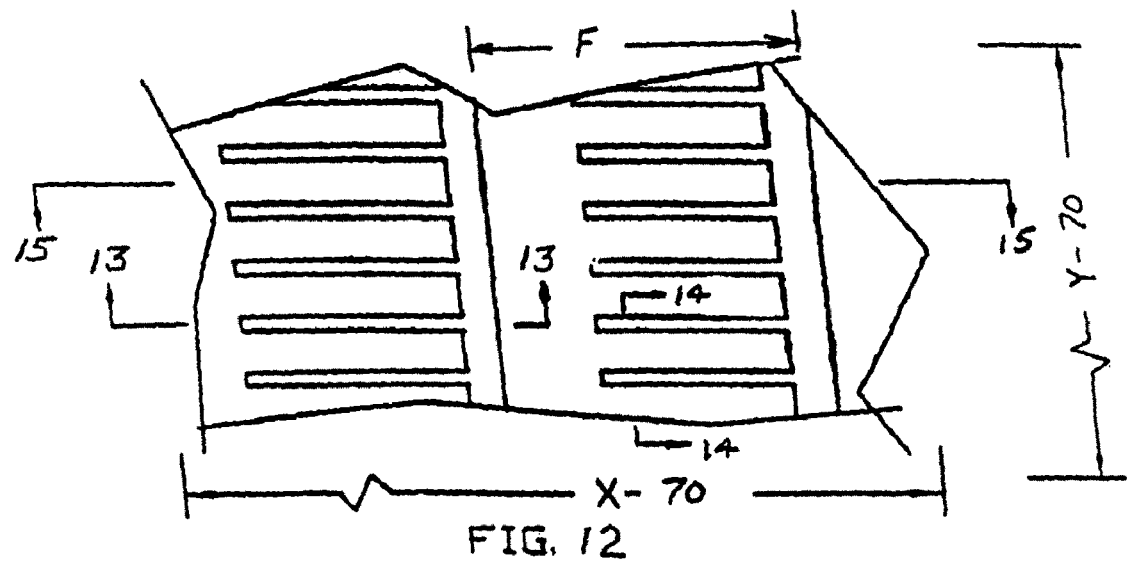
FIG. 12 is a top plan view of an article resulting from exposing the FIG. 9 article to an additional processing step.
Figure 13:
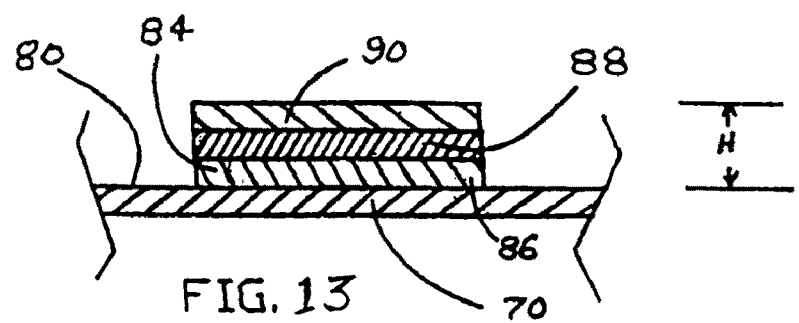
FIG. 13 is a sectional view taken substantially from the perspective of lines 13-13 of FIG. 12.
Figure 14:
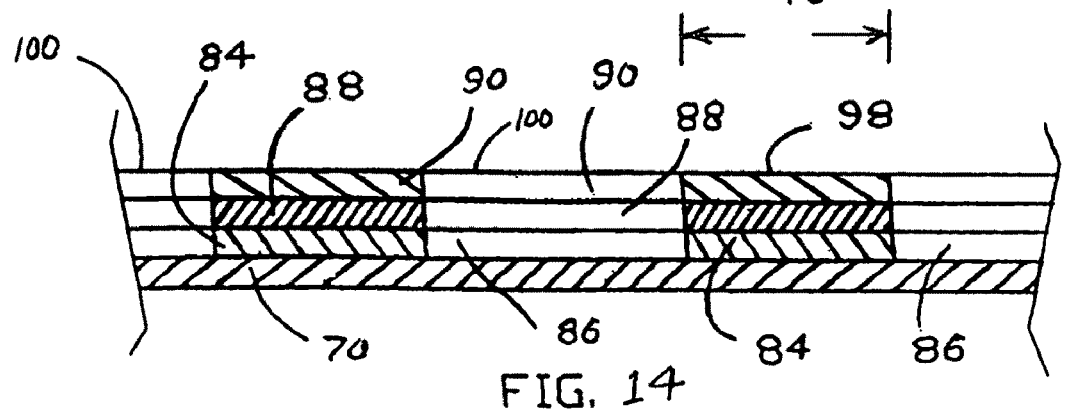
FIG. 14 is a sectional view taken substantially from the perspective of lines 14-14 of FIG. 12.
Figure 15:
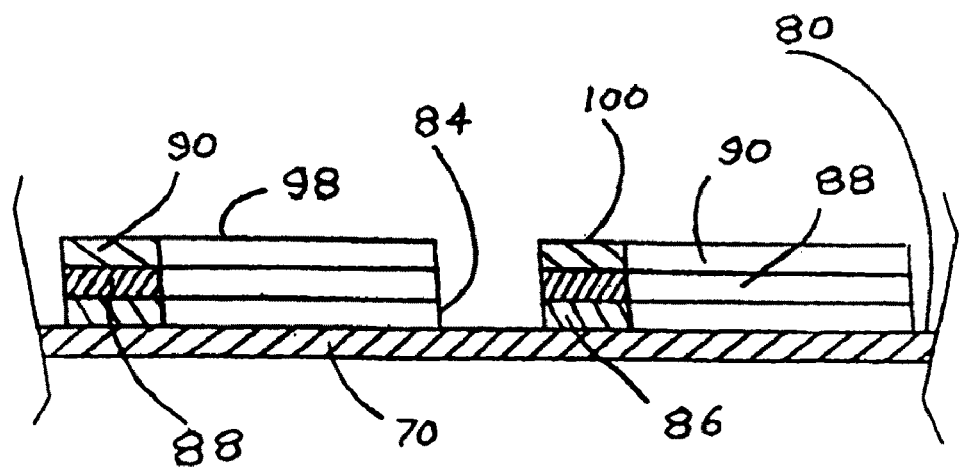
FIG. 15 is a sectional view taken substantially from the perspective of lines 15-15 of FIG. 12.

FIGS. 12, 13 and 14 correspond to the views of FIGS. 9, 10 and 11 respectively following an additional optional processing step. FIG. 15 is a sectional view taken substantially along line 15-15 of FIG. 12. Such additional optional process steps accomplish improved function of the conductive patterns of the grid/interconnect structures of the invention. For example, FIGS. 12 through 15 show additional conductive material deposited onto the "fingers" 84 and "busses" 86 of FIGS. 9 through 11. In this embodiment additional conductive material is designated by one or more layers 88, 90. This additional conductive material enhances the current carrying capacity of the "fingers" and "busses". Often when using "bulk" materials such as metal wires, stamped or etched metal foils and the like for the finger/buss pattern, the current carrying capacity of the initial pattern "84/86" is adequate. However, when forming the conductive patterns using techniques such as printing and metal electrodeposition, it may be desireable to enhance current carrying ability above that supplied by the initial pattern "84/86". For example, such enhancement may be appropriate as the length of fingers 84 increases.

While shown as two layers 88, 90, it is understood that this conductive material could comprise more than two layers or be a single layer. In addition, while each additional conductive layer is shown in the embodiment as having the same continuous monolithic material extending over both the buss and finger patterns, one will realize that selective deposition techniques would allow the additional "finger" layers to differ from additional "buss" layers. For example, as shown in FIG. 14, "fingers" 84 have free surface 98 and "busses" 86 have free surface 100. As noted, selective deposition techniques such as brush electroplating or masked deposition would allow different materials to be considered for the "buss" surface 100 and "finger" surface 98. In a preferred embodiment, at least one of the additional layers 88, 90 etc. are deposited by electrodeposition, taking advantage of the deposition speed, compositional choice, low cost and selectivity of the electrodeposition process. Many various metals, including highly conductive silver, copper and gold, nickel, tin and alloys can be readily electrodeposited. In these embodiments, it may be advantageous to utilize electrodeposition technology giving an electrodeposit of low tensile stress to prevent curling and promote flatness of the metal deposits. In particular, use of nickel deposited from a nickel sulfamate bath, nickel deposited from a bath containing stress reducing additives such as brighteners, or copper from a standard acid copper bath have been found particularly suitable. Electrodeposition also permits precise control of thickness and composition to permit optimization of other requirements of the overall manufacturing process for interconnected arrays. Thus, the electrodeposited metal may significantly increase the current carrying capacity of the "buss" and "finger" structure and may be the dominant current carrying material for these structures. In general, electrodeposit thicknesses characterized as "low profile", less than about 0.002 inch, supply adequate current carrying capacity for the grid "fingers" of the instant invention. Alternatively, these additional conductive layers may be deposited by selective chemical deposition or registered masked vapor deposition. These additional layers 88, 90 may also comprise conductive inks applied by registered printing.

As indicated in FIG. 13 the traces, fingers and busses project above surface 80 of substrate 70 by dimension "H". In many cases it may be important to ensure that this projection is sufficient to assure adequate contacting of the surfaces 98, 100 with mating conductive surfaces of a photovoltaic cell during lamination processing which brings the mating surfaces together. Specifically, during the lamination process heat and pressure may force the insulating material layer such as 72 to melt and become fluid. Should the projection "H" be insufficient, the laminating process may force insulating material between the two mating conductive surfaces (such as 98 and 59). Sufficient projection "H" will force the mating conductive surfaces into firm contact before insulating material can flow between them.

In some cases it may be desirable to reduce the height of projection "H" prior to eventual combination with a conductive surface such as 59 or 66 of photovoltaic cell 10. In other cases it may be desirable to improve the coupling between the conductive pattern and the substrate 70. Suitable height reduction or increased coupling may be accomplished by passing the structures as depicted in FIGS. 12-15 through a roll lamination process wherein pressurized and/or heated rollers embed "fingers" 84 and/or "busses" 86 into layer 72 of substrate 70. Depending on the degree of heat and pressure and the nip spacing between rollers, the degree of the embedding (and residual projection "H") can be closely controlled. In another embodiment, it has been demonstrated that a surface combining a conductive pattern embedded in a layer 72 of substrate 70 can be made very smooth, showing a minimum of spatial discontinuity between the conductive and non-conductive surfaces. Such a unique surface could allow deposition of thin active semiconductor layers directly onto a current collection grid without discontinuities at the edges of the grid traces.

It has been found very advantageous to form surface 98 of "fingers" 84 or surface 100 of "busses" 86 with a material compatible with the conductive surface with which eventual contact is made. In preferred embodiments, electroless deposition or electrodeposition is used to form a suitable metallic surface. Specifically electrodeposition offers a wide choice of potentially suitable materials to form the free surface. Corrosion resistant materials such as nickel, chromium, tin, indium, silver, gold and platinum are readily electrodeposited. When compatible, of course, surfaces comprising metals such as copper or zinc or alloys of copper or zinc may be considered. Alternatively, the surface 98 may comprise a conversion coating, such as a chromate coating, of a material such as copper or zinc. Further, as will be discussed below, it may be highly advantageous to choose a material to form surfaces 98 or 100 which exhibits adhesive or bonding ability to a subsequently positioned abutting conductive surface. For example, it may be advantageous to form surfaces 98 and 100 using an electrically conductive adhesive.

Alternatively, it may be advantageous to form surfaces 98 of "fingers" 84 and/or 100 of "busses" 86 with a conductive material such as a low melting point metal such as tin or tin containing alloys in order to facilitate electrical joining to a complimentary conductive surface having electrical communication with an electrode of an adjacent photovoltaic cell. Such low melting point metals or alloys are often referred to as solders. In this case the low melting point metal would be chosen to have a melting point below a temperature reached during processing such that surfaces 98 and/or 100 would become molten thereby wet the complimentary conductive surface. Many plastic materials may be properly processed at temperatures less than 600 degree Fahrenheit. Thus, for purposes of this specification and claims, a metal or metal-based alloy whose melting point is less than 600 degree Fahrenheit is considered a low melting point metal. One will note that materials forming "fingers" surface 98 and "buss" surface 100 need not be the same. It is emphasized that many of the principles taught in detail with reference to FIGS. 6 through 15 extend to additional embodiments of the invention taught in subsequent Figures.

Figure 16:
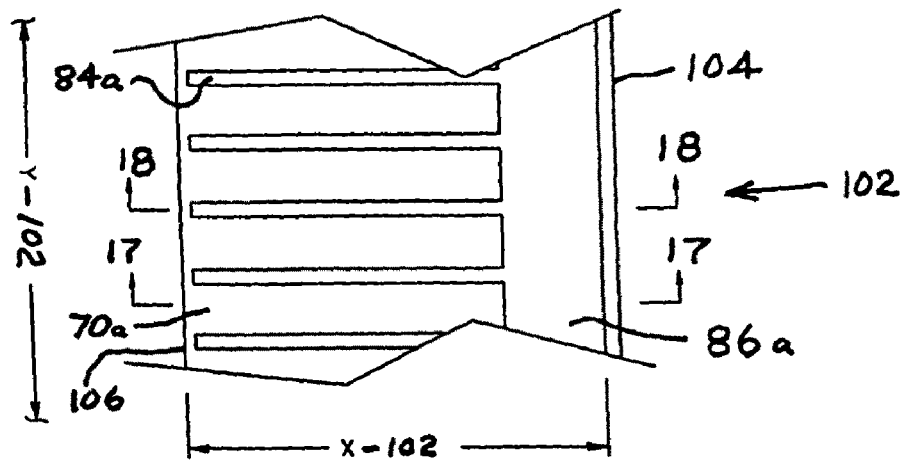
FIG. 16 is a top plan of an alternate embodiment similar in structure to the embodiment of FIG. 9.

FIG. 16 is a top plan view of an article 102 embodying another form of the electrodes of the current invention. FIG. 16 shows article 102 having structure comprising a pattern of "fingers" or traces 84a extending from "buss/tab" 86a arranged on a substrate 70a. The structure of FIG. 16 is similar to that shown in FIG. 9. However, whereas FIG. 9 depicted multiple finger and buss/tab structures arranged in a substantially repetitive pattern in direction "X-71" on a common substrate, the FIG. 16 embodiment consists of a single unit of finger/buss pattern. Thus, the dimension "X-102" of FIG. 16 may be roughly equivalent to the repeat dimension "F" shown in FIG. 9. Indeed, it is contemplated that article 102 of FIG. 16 may be produced by subdividing the FIG. 9, structure 71 according to repeat dimension "F" shown in FIG. 9. Dimension "Y-102" may be chosen appropriate to the particular processing scheme envisioned for the eventual lamination to a conductive surface such as a photovoltaic cell. However, it is envisioned that "Y-102" may be much greater than "X-102" such that article 102 may be characterized as continuous or capable of being processed in a roll-to-roll fashion. Article 102 has a first terminal edge 104 and second terminal edge 106. In the FIG. 16 embodiment "fingers" 84a are seen to terminate prior to intersection with terminal edge 106. One will understand that this is not a requirement.

"Fingers" 84a and "buss/tab" 86a of FIG. 16 have the same characterization as "fingers" 84 and "busses" 86 of FIGS. 9 through 11. Like the "fingers" 84 and "busses" 86 of FIGS. 9 through 11, "fingers" 84a and "buss" 86a of FIG. 16 may comprise materials that are either conductive, assist in a subsequent deposition of conductive material or promote adhesion of a subsequently applied conductive material to substrate 70a. While shown as a single layer, one appreciates that "fingers" 84a and "buss" 86a may comprise multiple layers. The materials forming "fingers" 84a and "buss" 86a may be different or the same. In addition, the substrate 70a may comprise different materials or structures in those regions associated with "fingers" 84a and "buss region" 86a. For example, substrate 70a associated with "buss region" 86a may comprise a fabric to provide thru-hole communication and enhance flexibility, while substrate 70a in the region associated with "fingers" 84a may comprise a film devoid of thru-holes such as depicted in FIGS. 6-8. A "holey" structure in the "buss region" would provide increased flexibility, surface area and structural characteristic for an adhesive to grip.

Figure 17:
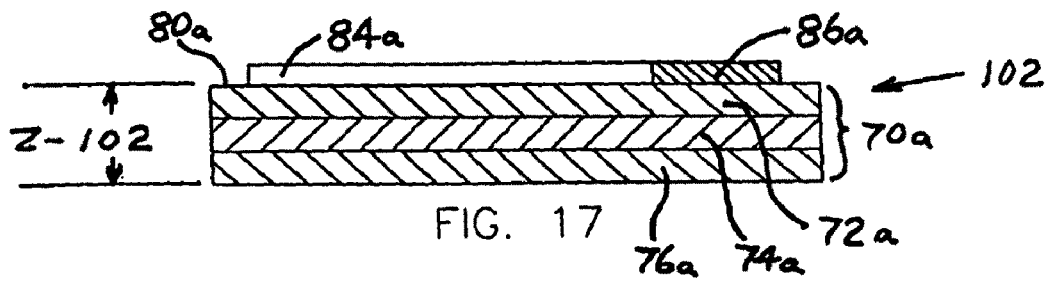
FIG. 17 is a sectional view taken substantially from the perspective of lines 17-17 of FIG. 16.
Figure 18:
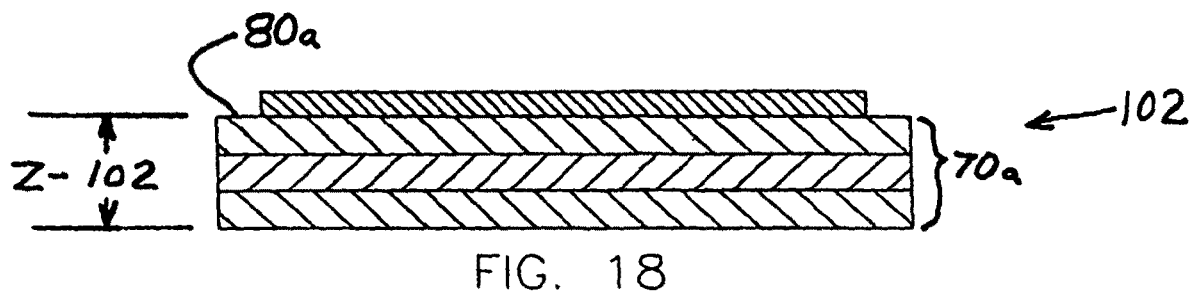
FIG. 18 is a sectional view taken substantially from the perspective of lines 18-18 of FIG. 16.

FIGS. 17 and 18 are sectional embodiments taken substantially from the perspective of lines 17-17 and 18-18 respectively of FIG. 16. FIGS. 17 and 18 show that article 102 has thickness Z-102 which may be much smaller than the X and Y dimensions, thereby allowing article 102 to be flexible and processable in roll form. Also, flexible sheet-like article 102 may comprise any number of discrete layers (three layers 72a, 74a, 76a are shown in FIGS. 17 and 18). These layers contribute to functionality as previously pointed out in the discussion of FIG. 7. As will be understood in light of the following discussion, it is normally helpful for layer 72a forming free surface 80a to exhibit adhesive characteristics to the eventual abutting conductive surface.

Figure 17A:
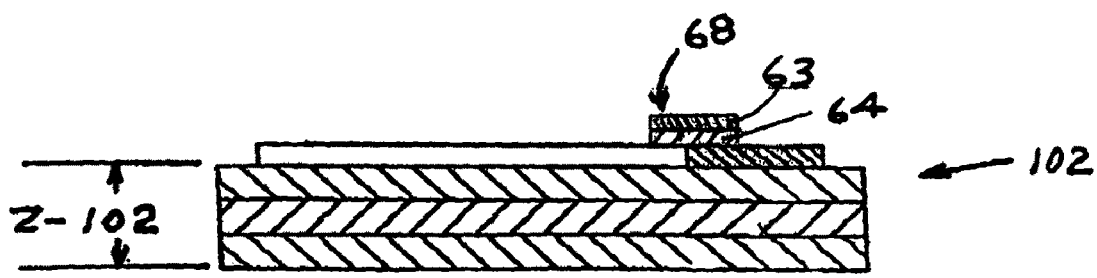
FIG. 17A is a sectional view similar to FIG. 15 showing an additional optional component included to prevent shorting during application to cells.

FIG. 17A is a sectional view showing additional structure 68 applied to the FIG. 17 embodiment. Structure 68 comprises an insulating strip or tape spanning the intersection of "fingers" 84a and "buss" 86a. As will be seen in the teachings to follow, it is this region where the conductive traces normally cross an edge of a photovoltaic cell. Thus the strip 68 prevents shorting caused by incidental contact of a trace with both the top and bottom surfaces of a cell. The strip of tape comprises an adhesive layer 64 and carrier layer 63 as is common with pressure sensitive tapes or laminating sheets.

Figure 19:
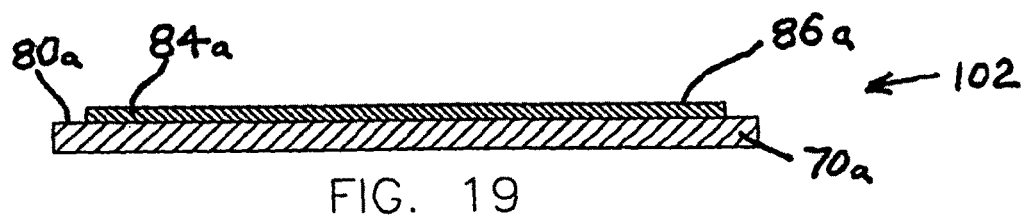
FIG. 19 is a simplified sectional view of the article embodied in FIGS. 16-18 suitable for ease of clarity of presentation of additional embodiments.

FIG. 19 is an alternate representation of the sectional view of FIG. 18. FIG. 19 depicts substrate 70a as a single layer for ease of presentation. The single layer representation will be used in many following embodiments, but one will understand that substrate 70a may comprise multiple layers.

Figure 20:
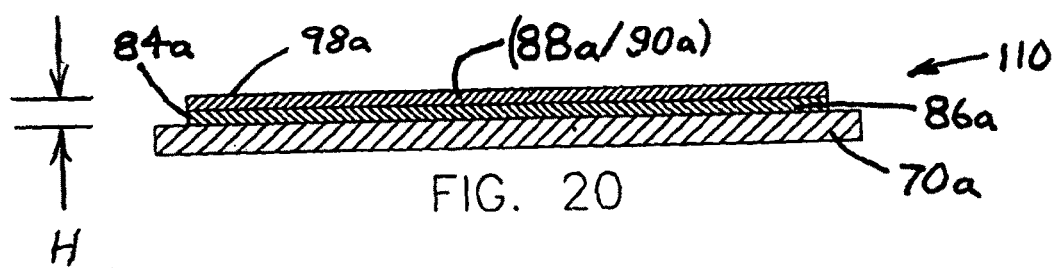
FIG. 20 is a sectional view showing the article of FIGS. 16 through 19 following an additional optional processing step.

FIG. 20 is a sectional view of the article now identified as 110, similar to FIG. 19, after an additional optional processing step. In a fashion like that described above for production of the current collector structure of FIGS. 12 through 15, additional conductive material (88a/90a) has been deposited by optional processing to produce the article 110 of FIG. 20. The discussion involving processing to produce the article of FIGS. 12 through 15 is proper to describe production of the article of FIG. 20. Thus, while additional conductive material has been designated as a single layer (88a/90a) in the FIG. 20 embodiment, one will understand that layer (88a/90a) of FIG. 20 may represent any number of multiple additional layers. In subsequent embodiments, additional conductive material (88a/90a) will be represented as a single layer for ease of presentation. In its form prior to combination with cells 10, the structures such as shown in FIGS. 9-15, and 16-20 can be referred to as "current collector stock". For the purposes of this specification and claims a current collector in its form prior to combination with a conductive surface can be referred to as "current collector stock". Articles 102 and 110 may be characterized as a unit of "current collector stock". Moreover, "current collector stock" can be in either continuous or discrete form. Further, in light of the teachings to follow one will recognize that the structures shown in FIGS. 9-15 and 16-20 may function and be characterized as laminating electrodes.

Figure 21:
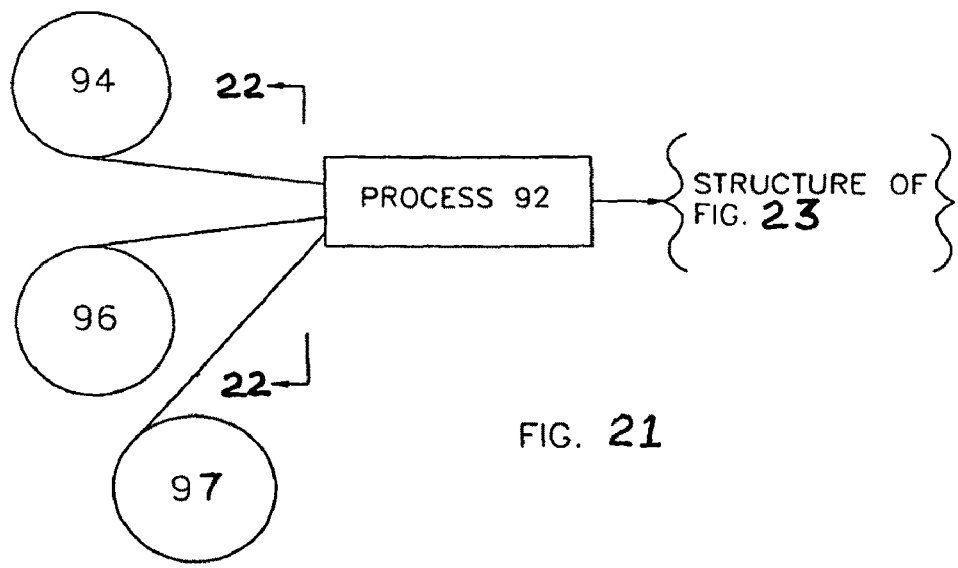
FIG. 21 is a simplified depiction of a process useful in producing objects of the instant invention.

FIG. 21 illustrates a process 92 by which the current collector grids of FIGS. 16 through 20 may be combined with the structure illustrated in FIGS. 1A, 2A and 2B to accomplish lamination of current collecting electrodes to top and bottom surfaces photovoltaic cell stock. The process envisioned in FIG. 21 has been demonstrated using standard lamination processing such as roll lamination and vacuum lamination. In a preferred embodiment, roll lamination is employed. In roll lamination, sheetlike feed streams are fed to a nip formed by a pair of rollers. Heat and pressure applied when passing through the hot nip expels air and bonds the sheetlike surfaces together.

Roll lamination allows continuous processing and a wide choice of application temperatures and pressures. However, the rapid processing afforded by roll lamination places limits on the thicknesses of the feed streams because of the rapid heating rates involved. Moreover, roll lamination requires adequate structural integrity of the feed streams. This is especially true when continuous lamination is involved. Thus roll lamination will typically involve a relatively thin adhesive sealing material layer supported on a structural polymeric carrier film. Roll lamination is further characterized as allowing relatively short thermal exposure. This is an advantage in processing throughput and also in some instances may avoid thermal semiconductor deterioration. However, such short thermal exposures (rapid heat up and cool down) normally require relatively thin materials. For example, using roll lamination the total thickness of a sealing layer would typically be less than 250 micrometers (i.e. 75 micrometers, 150 micrometers, 200 micrometers). A complimentary carrier layer would typically be less than 125 micrometers (i.e. 50 micrometers, 100 micrometers). In contrast, many of the legacy encapsulation techniques for solar cell module employ sealing materials in excess of 375 micrometers. Such thick materials require extended batch processing such as that characteristic of vacuum lamination processing.

Temperatures employed for process 92 of FIG. 21 are typical for lamination of standard polymeric materials used in the high volume plastics packaging industry, normally less than about 500 degrees Fahrenheit. Process 92 is but one of many processes possible to achieve such application. In FIG. 21 rolls 94 and 97 represent "continuous" feed rolls of grid/buss structure on a flexible sheetlike substrate (current collector stock) as depicted in FIGS. 16 through 20. Roll 96 represents a "continuous" feed roll of the sheetlike cell stock as depicted in FIGS. 1A, 2A and 2B.

Figure 22:
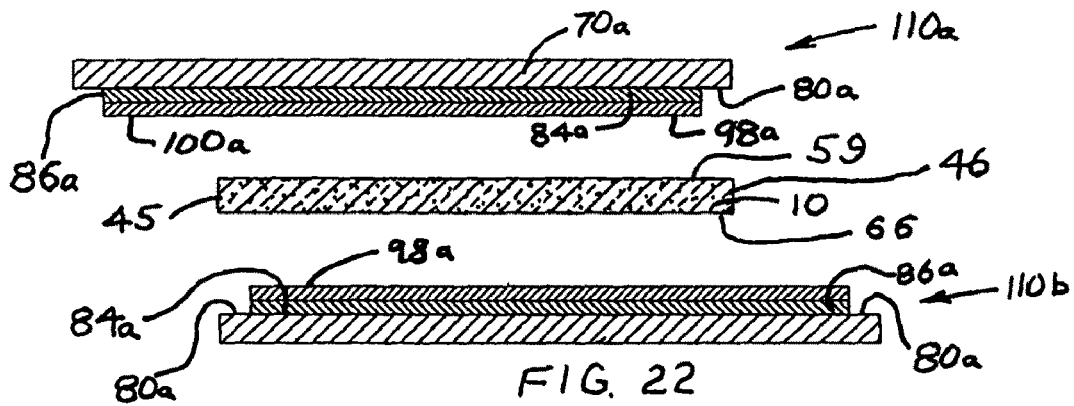
FIG. 22 is a sectional view taken substantially from the perspective of lines 22-22 of FIG. 21 showing an arrangement of three components just prior to the Process 92 depicted in FIG. 21.
Figure 23:
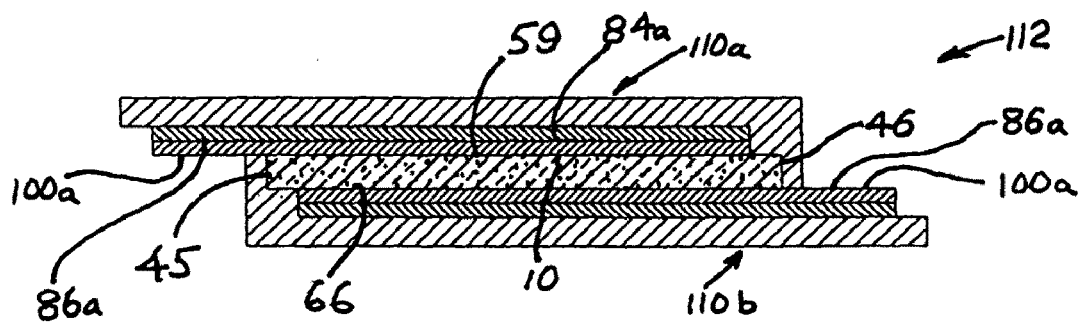
FIG. 23 is a sectional view showing the result of combining the components of FIG. 22 using the process of FIG. 21.

FIG. 22 is a sectional view taken substantially from the perspective of line 22-22 of FIG. 21. FIG. 22 shows a photovoltaic cell 10 such as embodied in FIGS. 2A and 2B disposed between two current collecting electrodes 110a and 110b such as article 110 embodied in FIG. 20. FIG. 23 is a sectional view showing the article 112 resulting from using process 92 to laminate the three individual structures of FIG. 22 while substantially maintaining the relative positioning depicted in FIG. 22. FIG. 23 shows that a laminating current collector electrode 110a has now been applied to the top conductive surface 59 of cell 10. The grid pattern of "fingers" or traces 84a extends over a preponderance of the light incident surface 59 of cell 10. Laminating current collector electrode 110b mates with and contacts the bottom conductive surface 66 of cell 10. Grid "fingers" 84a of a current collector electrode 110a project laterally across the top surface 59 of cell stock 10 and extend to a "buss" region 86a located outside terminal edge 45 of cell stock 10. The grid "fingers" 84a of a bottom current collector electrode 110b project laterally across the bottom surface 66 of cell stock 10 and extend to a "buss" region 86a located outside terminal edge 46 of cell stock 10. Thus article 112 is characterized as having readily accessible conductive surface portions 100a in the form of tabs in electrical communication with both top cell surface 59 and bottom cell surface 66.

Those skilled in the art will recognize that contact between the top surface 59 of cell 10 and the mating surface 98a of finger 84a will be achieved by ensuring good adhesion between surface 80a of substrate 70a and surface 59 of cell 10. One will further recognize that contact between bottom surface 66 of cell 10 and fingers 84a of collector grid 110b will be ensured by achieving adhesion between surface 80a of substrate 70a and surface 66 of cell 10. In particular, the material forming the remaining free surface 80a of articles 110a and 110b (that portion of surfaces 80a not covered with conductive material) is chosen to promote good adhesion between articles 110a and 110b and the corresponding cell surfaces during a laminating process. Thus, in the embodiment of FIGS. 22 and 23 surface 80a comprises material having adhesive affinity to both surfaces 59 and 66 of cell 10.

Article 112 can be described as a "tabbed cell stock". In the present specification and claims, a "tabbed cell stock" is defined as a photovoltaic cell structure combined with electrically conducting material in electrical communication with a conductive surface of the cell structure, and further wherein the electrically conducting material extends outside a terminal edge of the cell structure to present a readily accessible contact surface. In light of the present teachings, one will understand that "tabbed cell stock" can be characterized as being either continuous or discrete. One will also recognize that electrodes 110a and 110b can be used independently of each other. For example, 110b could be employed as a back side electrode while a current collector electrode different than 110a is employed on the upper side of cell 10. Also, one will understand that while electrodes 110a and 110b are shown in the embodiment to be the same structure, different structures and compositions may be chosen for electrodes 110a and 110b.

A "tabbed cell stock" 112 has a number of fundamental advantageous attributes. First, it can be produced as a continuous cell "strip" and in a continuous roll-to-roll fashion in the Y direction (direction normal to the paper in the sectional view of FIG. 23). Following the envisioned lamination, the "tabbed cell stock" strip can be continuously monitored for quality since there is ready access to the exposed free surfaces 100a in electrical communication with top cell surface 59 and the cell bottom surface 66. Thus defective cell material can be identified and discarded prior to final interconnection into an array. Finally, the laminated current collector electrodes protect the surfaces of the cell from defects possibly introduced by the further handing associated with final interconnections.

The lamination process 92 of FIG. 21 normally involves application of heat and pressure. Temperatures of up to 600 degree F. are envisioned. Lamination temperatures of less than 600 degree F. would be more than sufficient to melt and activate not only typical polymeric sealing materials but also many low melting point metals, alloys and metallic solders. For example, tin melts at about 450 degree F. and its alloys even lower. Tin alloys with for example bismuth, lead and indium are common industrial materials. Many conductive "hot melt" adhesives can be activated at even lower temperatures such as 300 degree F. Typical thermal curing temperatures for polymers are in the range 200 to 350 degree F. Thus, typical lamination practice widespread in the packaging industry is normally appropriate to simultaneously accomplish many conductive joining possibilities.

Figure 24:
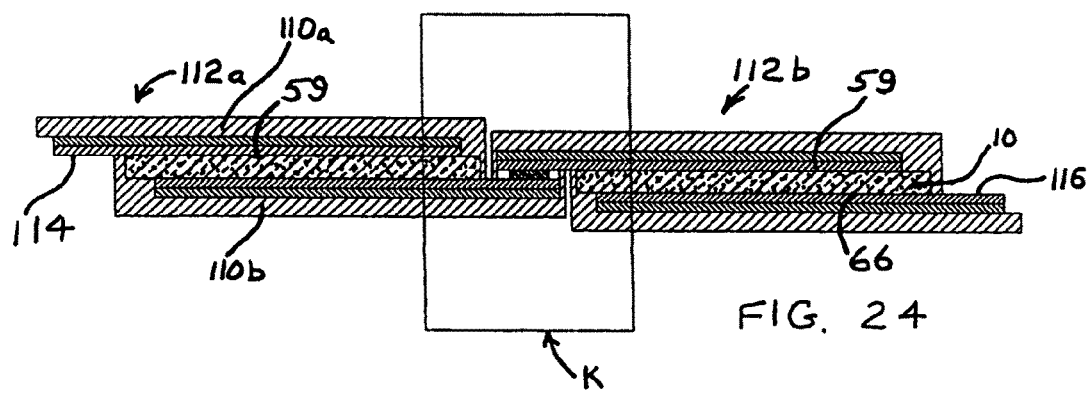
FIG. 24 is a sectional view embodying a series interconnection of multiple articles as depicted in FIG. 23
Figure 25:
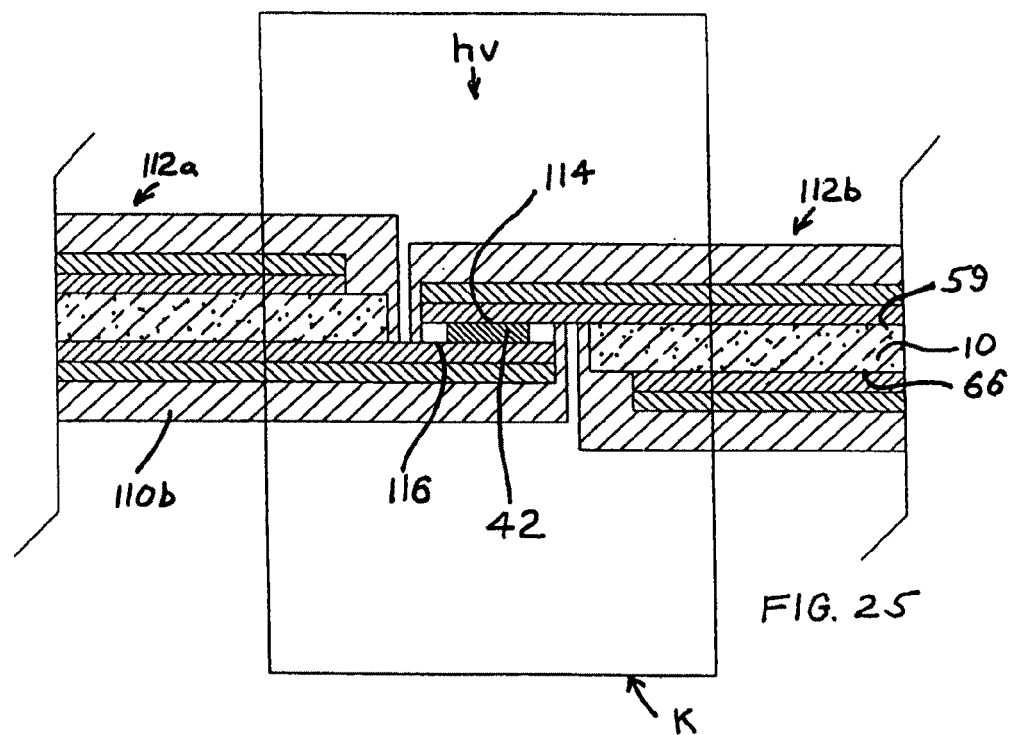
FIG. 25 is an exploded sectional view of the region within the box "K" of FIG. 24.

The sectional drawings of FIGS. 24 and 25 show the result of joining multiple articles 112a, 112b. Each article has a readily accessible downward facing conductive surface pattern (in the drawing perspective) 114 in communication with the cell top surface 59. A readily accessible upward facing conductive surface pattern 116 extends from the cell bottom surfaces 66. It is clear that each unit 112a, 112b, etc. has its own individual current collector structure 110a harvesting current from the cells top surface. Thus each cell is covered by its own individual substrate layer 70a which is separate and distinct from the substrate layer of an adjacent cell.

One clearly recognizes that these readily accessible surfaces 114 and 116 may function as terminal bars for the end cells of a modular array of interconnected cells. One also appreciates that as shown in this embodiment, current collector 110b functions as an interconnecting substrate unit. Series connections between adjacent cells are easily achieved by overlapping the top surface extension 114 of one article 112b and a bottom surface extension 116 of a second article 112a and electrically connecting these extensions with electrically conductive joining means such as conductive adhesive 42 shown in FIGS. 24 and 25. Other electrically conductive joining means including those defined above may be selected in place of conductive adhesive 42. For example, surfaces 114 and 116 could overlap and be electrically joined to top and bottom surfaces of a metal foil member. Finally, since the articles 112 of FIG. 23 can be produced in a continuous form (in the direction normal to the paper in FIG. 23) the series connections and array production embodied in FIGS. 24 and 25 may also be accomplished in a continuous manner by using continuous feed rolls of "tabbed cell stock" 112. However, while continuous assembly may be possible, other processing may be envisioned to produce the interconnection embodied in FIGS. 24 and 25. For example, defined lengths of "tabbed cell stock" 112 could be produced by subdividing a continuous strip of "tabbed cell stock" 112 in the Y dimension and the individual articles thereby produced could be arranged as shown in FIGS. 24 and 25 using, for example, standard pick and place positioning.

Figure 26:
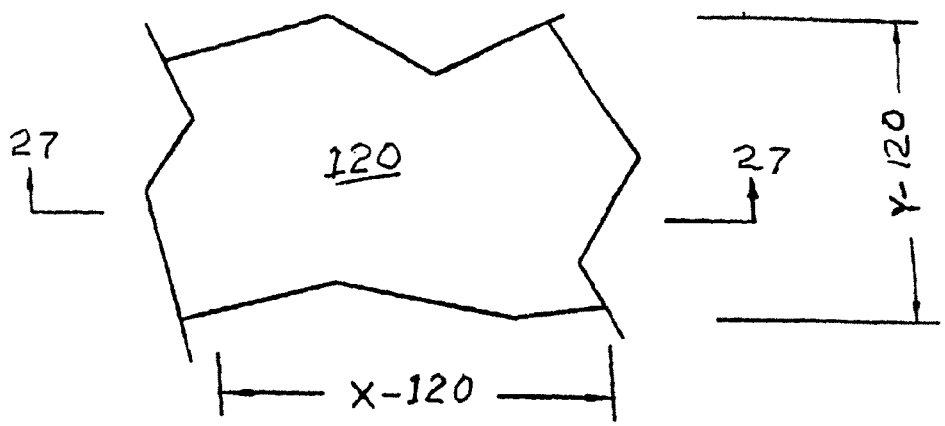
FIG. 26 is a top plan view of a starting article in the production of another embodiment of the instant invention.
Figure 27:
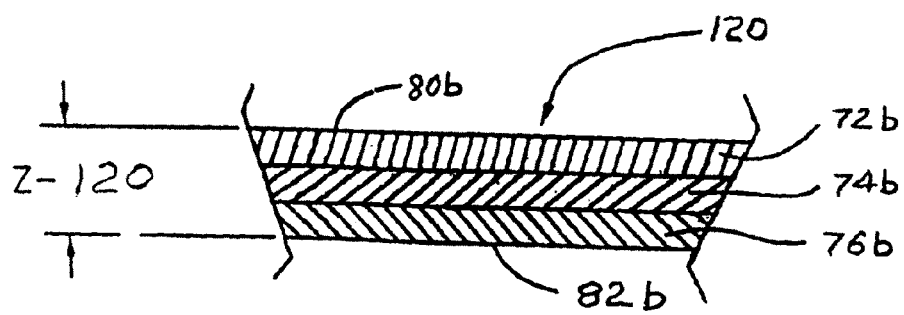
FIG. 27 is a sectional view taken from the perspective of lines 27-27 of FIG. 26.
Figure 28:
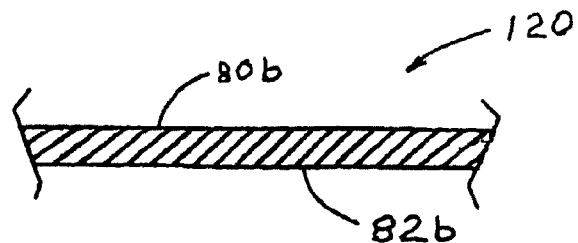
FIG. 28 is a simplified sectional depiction of the article of FIGS. 26 and 27 useful in preserving clarity of presentation of additional embodiments.

FIG. 26 is a top plan view of an article in production of another embodiment of a laminating current collector grid or electrode according to the instant invention. FIG. 26 embodies a polymer based film or glass substrate 120. Substrate 120 has width X-120 and length Y120. In embodiments, taught in detail below, Y-120 may be much greater than width X-120, whereby film 120 can generally be described as "continuous" in length and able to be processed in length direction Y-120 in a continuous roll-to-roll fashion. FIG. 27 is a sectional view taken substantially from the view 27-27 of FIG. 26. Thickness dimension Z-120 is small in comparison to dimensions Y-120, X-120 and thus substrate 120 may have a flexible sheetlike, or web structure contributing to possible roll-to-roll processing. As shown in FIG. 27, substrate 120 may be a laminate of multiple layers 72b, 74b, 76b etc. or may comprise a single layer of material. Thus substrate 120 may have structure similar to that of the FIGS. 6 through 8 embodiment, and the discussion of the characteristics of article 70 of FIGS. 6 through 8 is proper to characterize article 120 as well. As with the representation of the article 70 of FIGS. 6 through 8, and as shown in FIG. 28, article 120 (possibly multilayered) will be embodied as a single layer in the following for simplicity of presentation.

FIG. 29 is a top plan view of an article 124 following an additional processing step using article 120. FIG. 30 is a sectional view substantially from the perspective of lines 30-30 of FIG. 29. The structure depicted in FIGS. 29 and 30 is similar to that embodied in FIGS. 16 and 18. It is seen that article 124 comprises a pattern of "fingers" or "traces", designated 84b, extending from "buss" or "tab" structures, designated 86b. In the embodiments of FIGS. 29 and 30, both "fingers" 84b and "busses" 86b are positioned on supporting substrate 120 in a grid pattern. "Fingers" 84b extend in the width X-124 direction of article 124 and "busses" ("tabs") extend in the Y-124 direction substantially perpendicular to the "fingers". In the FIG. 29 embodiment, it is seen that the distal ends 85 of the fingers located away from the "buss" 86b are joined by connecting trace of material 128 extending in the "Y-124" direction. One readily understands that should an individual "finger" 84b become severed or otherwise conductively impaired at a point along its length, the connecting material trace 128 allows a shuttling of the affected current flow to an adjacent finger. In this way a defective finger does not appreciably detract from overall cell performance. One may also appreciate the substantial functional redundancy characteristic of the grid/interconnect structures of the invention.

In the embodiment of FIGS. 29 and 30, the buss 86b region is characterized as having multiple regions 126 devoid of material forming "buss" 86b. In the FIG. 29 embodiment, the voided regions 126 are presented as circular regions periodically spaced in the "Y-124" direction. One will understand in light of the teachings to follow that the circular forms 126 depicted in FIG. 29 is but one of many different patterns possible for the voided regions 126. The sectional view of FIG. 30 shows the voided regions 126 leave regions of the surface 80b of substrate 120 exposed. Surface 80b of substrate 120 remains exposed in those regions not covered by the finger/buss pattern. These exposed regions are further indicated by the numeral 127 in FIG. 29.

Structure 124 may be produced, processed and extend continuously in the length "Y-124" direction.

Portions of substrate 120 not overlayed by material forming "fingers" 84b and "busses" 86b remain transparent or translucent to visible light. These regions are generally identified by numeral 127 in FIG. 29. In the embodiment of FIGS. 29 and 30, the "fingers" 84b and "busses" 86b are shown to be a single layer for simplicity of presentation. However, the "fingers" and "busses" can comprise multiple layers of differing materials chosen to support various functional attributes. For example the material defining the "buss" or "finger" patterns which is in direct contact with substrate 120 may be chosen for its adhesive affinity to surface 80b of substrate 120 and also to a subsequently applied constituent of the buss or finger structure. Further, it may be advantageous to have the first visible material component of the fingers and busses be of dark color or black. As will be shown, the light incident side (outside surface) of the substrate 120 will eventually be surface 82. By having the first visible component of the fingers and busses be dark, they will aesthetically blend with the generally dark color of the photovoltaic cell. This eliminates the often objectionable appearance of a metal colored grid pattern. Permissible dimensions and structure for the "fingers" and "busses" will vary somewhat depending on materials and fabrication process used for the fingers and busses, and the dimensions of the individual cell.

"Fingers" 84b and "busses" 86b may comprise electrically conductive material. Examples of such materials are metal wires and foils, stamped metal patterns, conductive metal containing inks and pastes such as those having a conductive filler comprising silver or stainless steel, patterned deposited metals such as etched metal patterns or masked vacuum deposited metals, intrinsically conductive polymers and DER formulations. In a preferred embodiment, the "fingers and busses" comprise electroplateable material such as DER or an electrically conductive ink which will enhance or allow subsequent metal electrodeposition. "Fingers" 84b and "busses" 86b may also comprise non-conductive material which would assist accomplishing a subsequent deposition of conductive material in the pattern defined by the "fingers" and "busses". For example, "fingers" 84b or "busses" 86b could comprise a polymer which may be seeded to catalyze chemical deposition of a metal in a subsequent step. An example of such a material is seeded ABS. Patterns comprising electroplateable materials or materials facilitating subsequent electrodeposition are often referred to as "seed" patterns or layers. "Fingers" 84b and "busses" 86b may also comprise materials selected to promote adhesion of a subsequently applied conductive material. "Fingers" 84b and "busses" 86b may differ in actual composition and be applied separately. For example, "fingers" 84b may comprise a conductive ink while "buss/tab" 86b may comprise a conductive metal foil strip. Alternatively, fingers and busses may comprise a continuous unvarying monolithic material structure forming portions of both fingers and busses. Fingers and busses need not both be present in certain embodiments of the invention.

The embodiments of FIGS. 29 and 30 show the "fingers" 84b, "busses" 86b, and connecting trace 128 as essentially planar rectangular structures. Other geometrical forms are clearly possible, especially when design flexibility is associated with the process used to establish the material pattern of "fingers" and "busses". "Design flexible" processing includes printing of conductive inks or "seed" layers, foil etching or stamping, masked deposition using paint or vacuum deposition, and the like. For example, these conductive paths can have triangular type surface structures increasing in width (and thus cross section) in the direction of current flow. Thus the resistance decreases as net current accumulates to reduce power losses. Alternatively, one may select more intricate patterns, such as a "watershed" pattern as described in U.S.

Patent Application Publication 2006/0157103 A1 which is hereby incorporated in its entirety by reference. Various structural features, such as radiused connections between fingers and busses may be employed to improve structural robustness.

It is important to note however that the laminating current collector structures of the instant invention may be manufactured utilizing continuous, bulk roll to roll processing. While the collector grid embodiments of the current invention may advantageously be produced using continuous processing, one will recognize that combining of grids or electrodes so produced with mating conductive surfaces may be accomplished using either continuous or batch processing. In one case it may be desired to produce photovoltaic cells having discrete defined dimensions. For example, single crystal silicon cells are often produced having X-Y dimensions of 6 inches by 6 inches. In this case the collector grids of the instant invention, which may be produced continuously, may then be subdivided to dimensions appropriate for combining with such cells. In other cases, such as production of many thin film photovoltaic structures, a continuous roll-to-roll production of an expansive surface article can be accomplished in the "Y" direction as identified in FIG. 1. Such a continuous expansive photovoltaic structure may be combined with a continuous arrangement of collector grids of the instant invention in a semicontinuous or continuous manner. Alternatively the expansive semiconductor structure may be subdivided into continuous strips of cell stock. In this case, combining a continuous strip of cell stock with a continuous strip of collector grid of the instant invention may be accomplished in a continuous or semi-continuous manner.

FIG. 31 corresponds to the view of FIG. 30 following an additional optional processing step. The FIG. 31 article is now designated by numeral 125 to reflect this additional processing. FIG. 31 shows additional conductive material deposited onto the "fingers" 84b and "buss" 86b. In this embodiment additional conductive material is designated by one or more layers (88b, 90b) and the fingers and busses project above surface 80b as shown by dimension "H". It is understood that conductive material could comprise more than two layers or be a single layer. Conductive material (88b,90b) is shown as a single layer in the FIG. 31 embodiment for ease of presentation. Article 125 is another embodiment of a unit of "current collector stock". Dimension "H" may be smaller than about 50 micrometers and thus the structure of fingers and busses depicted in FIG. 31 may be considered as a "low profile" structure. In some cases it may be desirable to reduce the height of projection "H" prior to eventual combination with a conductive surface such as 59 or 66 of photovoltaic cell 10. This reduction may be accomplished by passing the structures as depicted in FIGS. 30, 31 through a pressurized and/or heated roller or the like to embed "fingers" 84b and/or "busses" 86b into layer 72b of substrate 120.

While each additional conductive material is shown the FIG. 31 embodiment as having the same continuous monolithic material extending over both the buss and finger patterns, one will realize that selective deposition techniques would allow the additional "finger" layers to differ from additional "buss" layers. For example, as shown in FIG. 31, "fingers" 84b have free surface 98b and "busses" 86b have free surface 100b. As noted, selective deposition techniques such as brush electroplating or masked deposition would allow different materials to be considered for the "buss" surface 100b and "finger" surface 98b. In a preferred embodiment, at least one of the additional layers (88b, 90b) etc. are deposited by electrodeposition, taking advantage of the deposition speed, compositional choice, low cost and selectivity of the electrodeposition process. Many various metals, including highly conductive silver, copper and gold, nickel, tin and alloys can be readily electrodeposited. In these embodiments, it may be advantageous to utilize electrodeposition technology giving an electrodeposit of low tensile stress to prevent curling and promote flatness of the metal deposits. In particular, use of nickel deposited from a nickel sulfamate bath, nickel deposited from a bath containing stress reducing additives such as brighteners, or copper from a standard acid copper bath have been found particularly suitable. Electrodeposition also permits precise control of thickness and composition to permit optimization of other requirements of the overall manufacturing process for interconnected arrays. Alternatively, these additional conductive layers may be deposited by selective chemical deposition or registered masked vapor deposition. These additional layers (88, 90) may also comprise conductive inks applied by registered printing.

It has been found very advantageous to form surface 98b of "fingers" 84b or surface 100b of "busses" 86b with a material compatible with the conductive surface with which eventual contact is made. In preferred embodiments, electroless deposition or electrodeposition is used to form a suitable metallic surface. Specifically electrodeposition offers a wide choice of potentially suitable materials to form the surface. Corrosion resistant materials such as nickel, chromium, tin, indium, silver, gold and platinum are readily electrodeposited. When compatible, of course, surfaces comprising metals such as copper or zinc or alloys of copper or zinc may be considered. Alternatively, the surface 98b may comprise a conversion coating, such as a chromate coating, of a material such as copper or zinc. Further, as will be discussed below, it may be highly advantageous to choose a material to form surfaces 98b or 100b which exhibits adhesive or bonding ability to a subsequently positioned abutting conductive surface. For example, it may be advantageous to form surfaces 98b and 100b using an electrically conductive adhesive. Alternatively, it may be advantageous to form surface 100b of "busses" 86b with a conductive material such as a low melting point alloy solder in order to facilitate electrical joining to a complimentary conductive surface having electrical communication with an electrode of an adjacent photovoltaic cell. For example, forming surfaces 98b and 100b with materials such as tin or alloys of tin with an alloying element such as lead, bismuth or indium would result in a low melting point surface to facilitate electrical joining during subsequent lamination steps. One will note that materials forming "fingers" surface 98b and "buss" surface 100b need not be the same.

FIG. 32 depicts an arrangement of 3 articles just prior to a laminating process according to a process embodiment such as that of FIG. 21. In the FIG. 32 embodiment, "current collector stock" 125 is positioned above a photovoltaic cell 10. A second article of laminating "current collector stock", identified by numeral 129, is positioned beneath cell 10. Article 129 may be similar in structure to article 110 of FIG. 20.

Figure 33:
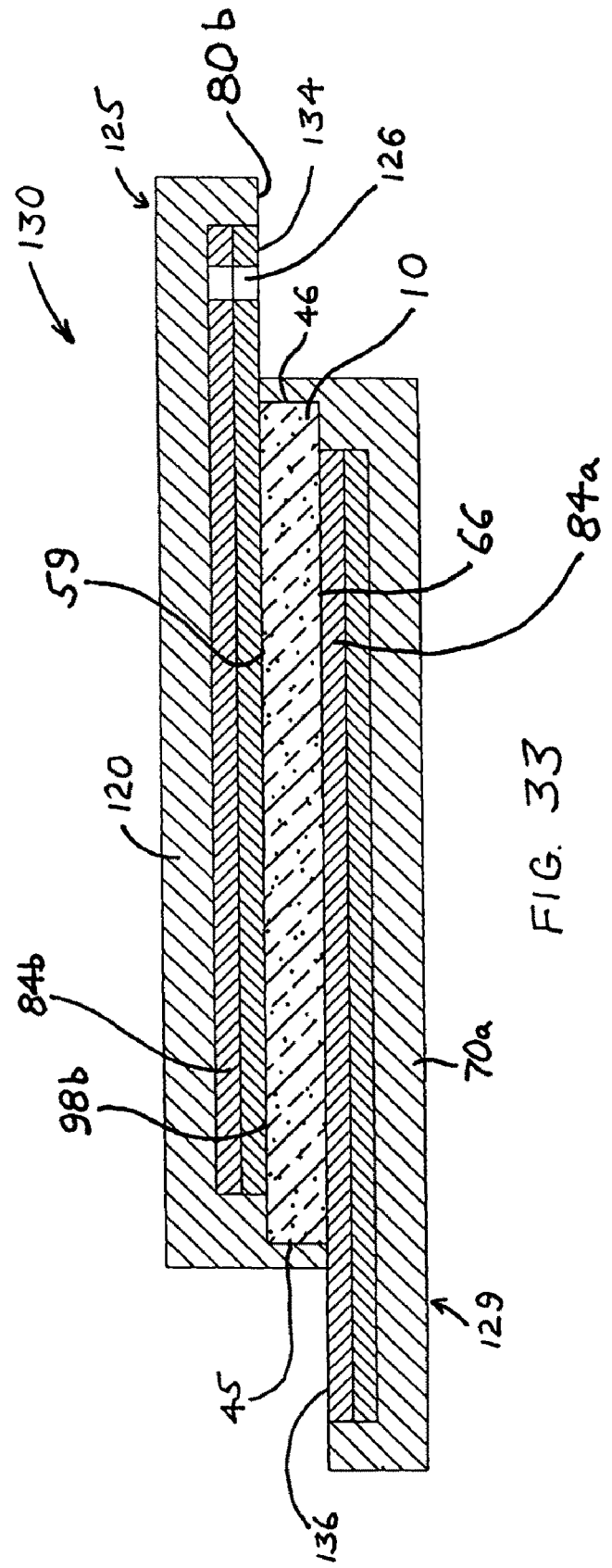
FIG. 33 is a sectional view showing the result of combining the arrangement depicted in FIG. 32 using a process as depicted in FIG. 21.

FIG. 33 shows the article 130 resulting from passing the FIG. 32 arrangement through a lamination process as depicted in FIG. 21. The lamination process has applied article 125 to the top surface 59 of cell 10. Thus, the conductive surface 98b of grid "fingers" 84b of article 125 are fixed by the lamination in intimate contact with conductive top surface 59 of cell 10. The grid pattern of "fingers" or traces 84b extends over a preponderance of the light incident surface 59 of cell 10. The lamination process has similarly positioned the conductive surface 98a of "fingers" 84a of article 129 in intimate contact with the bottom surface 66 of cell 10. The conductive material associated with current collector stock 125 extends past a first terminal edge 46 of cell 10. The conductive material associated with current collector stock 129 extends past second terminal edge 45 of cell 10. These extensions, identified by numerals 134 and 136 in FIG. 33, form convenient "tab" surfaces to facilitate electrical connections to and from the actual cell. Thus article 130 can be properly characterized as a form or embodiment of a "tabbed cell stock". One also realizes that these extensions 134, 136 also may function as "terminal bars" should the cell occur as an end cell in an interconnected array.

In the present specification lamination has been shown as a means of combining the collector grid or electrode structures with a conductive surface. However, one will recognize that other application methods to combine the grid or electrode with a conductive surface may be appropriate such as transfer application processing. For example, in the embodiments such as those of FIG. 23 or 33, the substrate is shown to remain in its entirety as a component of the "tabbed cell stock" and final interconnected array. However, this is not a requirement. In other embodiments, all or a portion of substrate may be removed prior to or after a laminating process accomplishing positioning and attachment of "fingers" 84 and "busses" 86 to a conductive cell surface. In this case, a suitable release material (not shown) may be used to facilitate separation of the conductive collector electrode structure from a removed portion of substrate 70 during or following an application such as the lamination process depicted in FIG. 21. Thus, in this case the removed portion of substrate 70 would serve as a surrogate or temporary support to initially manufacture and transfer the grid or electrode structure to the desired conductive surface. One example would be that situation where layer 72 of FIG. 7 would remain with the final interconnected array while layers 74 and/or 76 would be removed.

Figure 34:
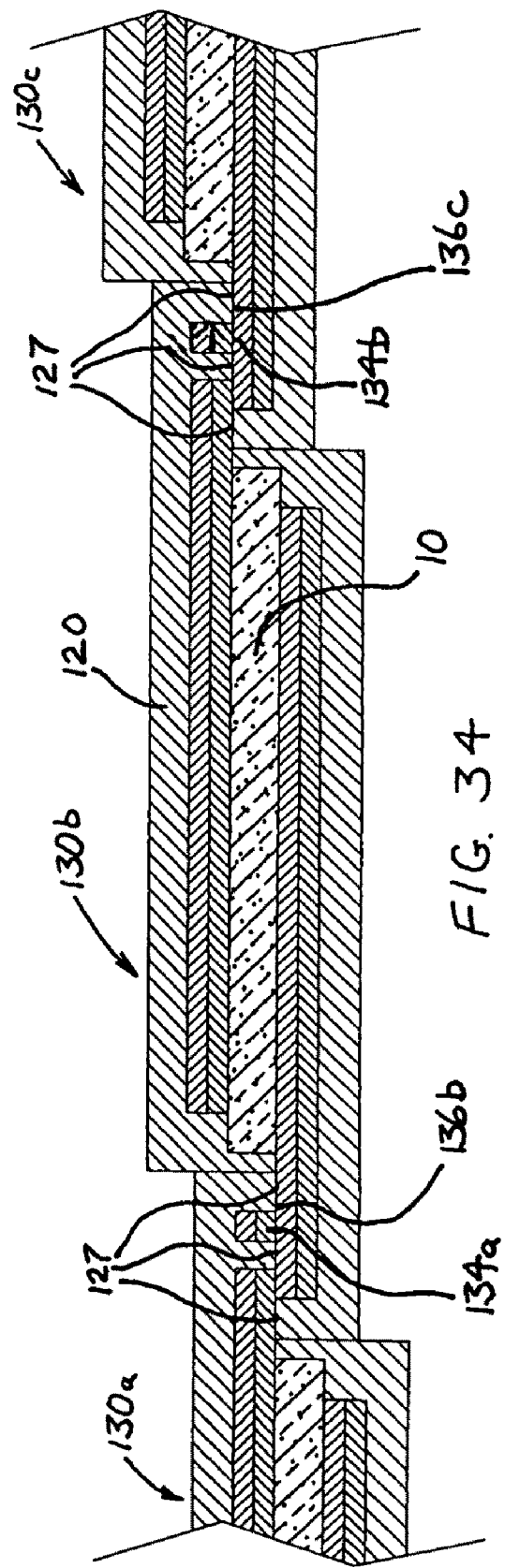
FIG. 34 is a sectional view a series interconnection of a multiple of articles such as depicted in FIG. 33.

FIG. 34 embodies the combination of multiple portions of "tabbed cell stock" 130. In the FIG. 34 embodiment, an extension 134a associated with a first unit of "tabbed cell stock" 130a overlaps extension 136b of an adjacent unit of "tabbed cell stock" 130b. The same spatial arrangement exists between "tabbed cell stock" units 130b and 130c. The conductive surfaces associated with the mating extensions are positioned and held in secure contact as a result of an adhesive material forming surface 80b of the substrate 120 melting and filling the voided regions 126 as shown. The mating contact is additionally secured by adhesive bonding produced by additional originally exposed regions of substrates. These originally exposed regions of substrate surface in the region of the mechanical and pressure induced electrical joining between adjacent units of "tabbed cell stock" are identified by the numeral 127 in the FIG. 34. It is clear that in the FIG. 34 embodiment a secure and robust series electrical connection is achieved between adjacent units of "tabbed cell stock" by virtue of the lamination process taught herein.

Figure 35:
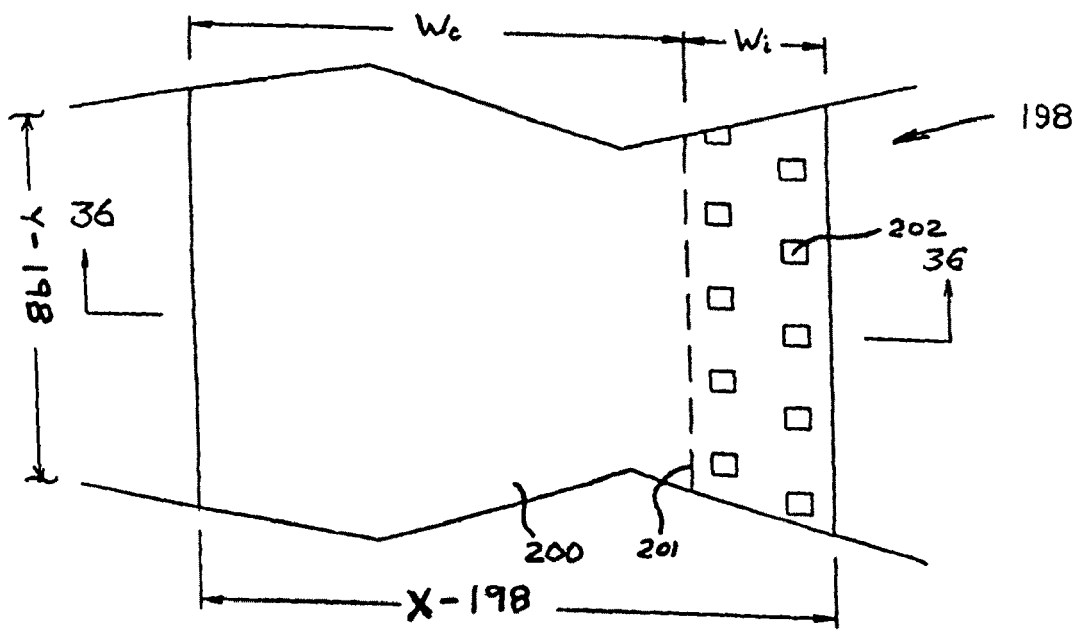
FIG. 35 is a top plan view of a starting article used to produce another embodiment of the instant invention.
Figure 36:
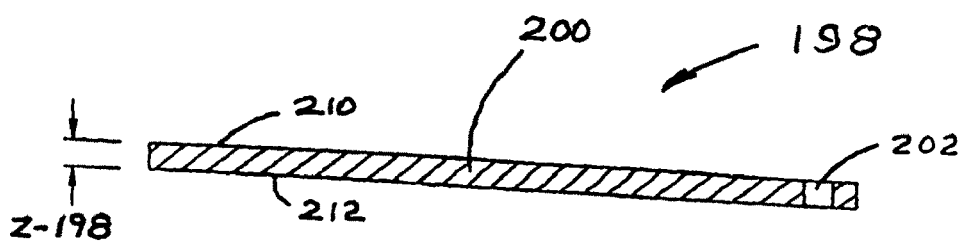
FIG. 36 is a simplified sectional view taken substantially from the perspective of lines 36-36 of FIG. 35.

Referring now to FIGS. 35 through 38, there are shown embodiments of a starting structure for another grid/interconnect article of the invention. FIG. 35 is a top plan view of an article 198. Article 198 comprises a polymeric film or glass sheet substrate generally identified by numeral 200. Substrate 200 has width X-200 and length Y-200. Length Y-200 is sometimes much greater the width X-200 such that film 200 can be processed in essentially a "roll-to-roll" fashion. However, this is not necessarily the case. Dimension "Y" can be chosen according to the application and process envisioned. FIG. 36 is a sectional view taken substantially from the perspective of lines 36-36 of FIG. 35. Thickness dimension Z-200 is normally small in comparison to dimensions Y-200 and X-200 and thus substrate 200 has a sheetlike structure and is often flexible. In the embodiment of FIG. 35, substrate 200 is further characterized by having regions of essentially solid structure (Wc) combined with regions (Wi) having holes 202 extending through the thickness Z-200. In the FIG. 35 embodiment, the substantially solid region is generally defined by a width Wc, representing a current collection region. The region with through-holes (holey region) is generally defined by width Wi, representing an interconnection region. Line 201, which may be imaginary, separates the two regions. Holes 202 may be formed by simple punching, laser drilling and the like. Alternatively, holey region Wi may comprise a fabric joined to region Wc along line 201, whereby the fabric structure comprises through-holes. The reason for these distinctions and definitions will become clear in light of the following teachings.

Figure 37:
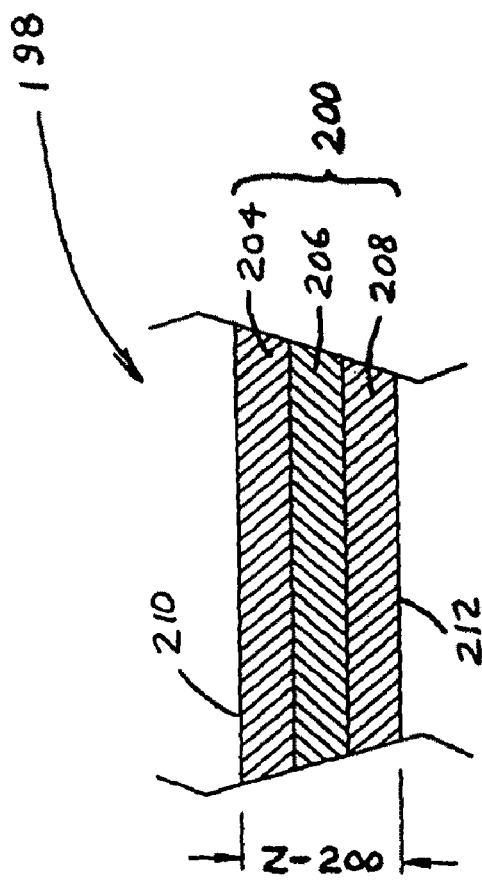
FIG. 37 is a expanded sectional view of the article embodied in FIGS. 35 and 36 showing a possible multi-layered structure of the article.

Referring now to FIG. 36, region Wc of substrate 200 has a first surface 210 and second surface 212. The sectional view of substrate 200 shown in FIG. 36 shows a single layer structure. This depiction is suitable for simplicity and clarity of presentation. Often, however, film 200 will comprise a laminate of multiple layers as depicted in FIG. 37. In the FIG. 37 embodiment, substrate 200 is seen to comprise multiple layers 204, 206, 208, etc. As previously taught herein, for example in the discussion of FIG. 7, the multiple layers may comprise inorganic or organic components such as thermoplastics, thermosets, or silicon containing glass-like layers. The various layers are intended to supply functional attributes such as environmental barrier protection or adhesive characteristics. In particular, in light of the teachings to follow, one will recognize that it may be advantageous to have layer 204 forming surface 210 comprise an adhesive sealing material such as ethylene vinyl acetate (EVA), an ionomer, an olefin based adhesive, atactic polyolefin, or a polymer containing polar functional groups for adhesive characteristics during a possible subsequent lamination process. For example, the invention has been successfully demonstrated using a standard laminating material sold by GBC Corp., Northbrook, Ill., 60062. Additional layers 206, 208 etc. may comprise materials which assist in support or processing such as polypropylene, polyethylene terepthalate and polyethylene naphthalate (PEN), barrier materials such as fluorinated polymers, biaxially oriented polypropylene (BOPP), poly(vinylidene chloride), such as Saran, a product of Dow Chemical, and Siox., and materials offering protection against ultraviolet radiation as previously taught in characterizing substrate 70 of FIG. 6.

As embodied in FIGS. 35 and 36, the solid regions Wc and "holey" regions Wi of substrate 200 may comprise the same material. This is not necessarily the case. For example, the "holey" regions Wi of substrate 200 could comprise a fabric, woven or non-woven, joined to an adjacent substantially solid region along line 201. However, the materials forming the solid region Wc should be relatively transparent or translucent to visible light, as will be understood in light of the teachings to follow.

Figure 35A:
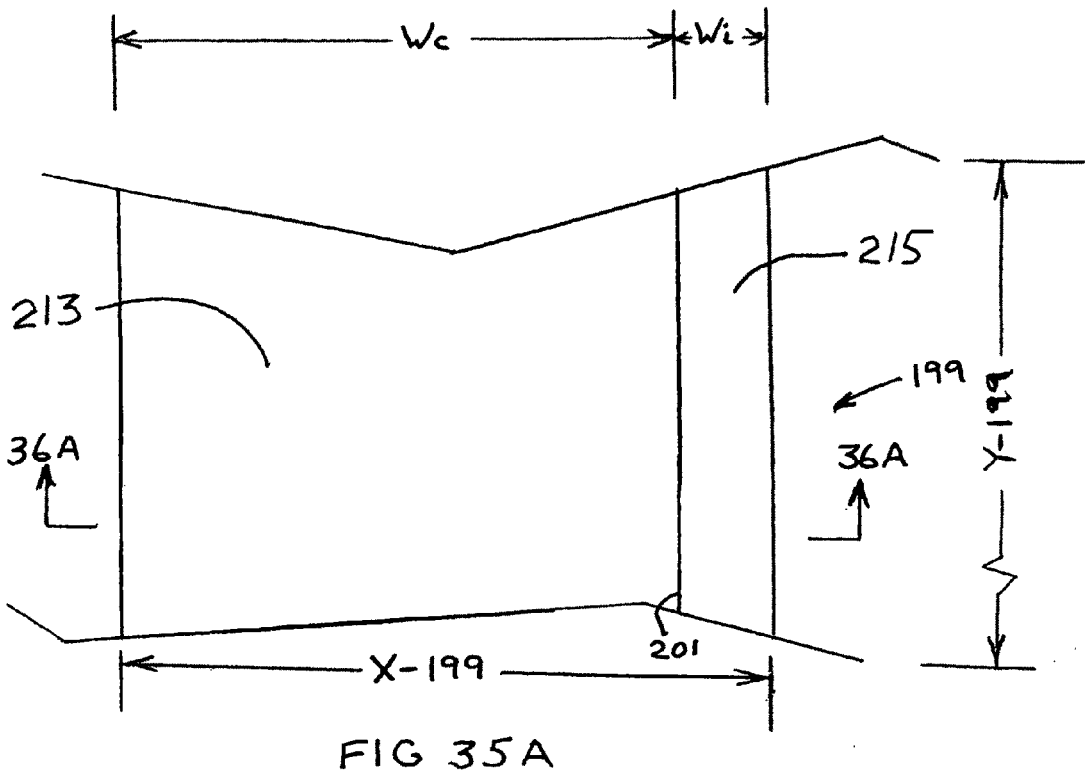
FIG. 35A is a top plan view of an embodiment of an alternate structure.
Figure 36A:
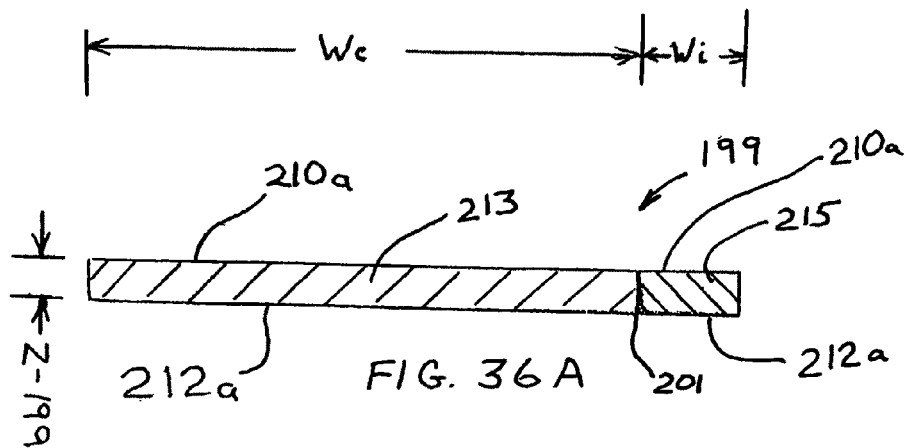
FIG. 36A is a simplified sectional view taken substantially from the perspective of lines 36A-36A of FIG. 35A.

An alternate structure is embodied in FIGS. 35A and 36A. There a structure 199 is formed by seaming two sheetlike material forms 213 and 215. Structure 199 itself has an overall sheetlike form having oppositely facing surfaces 210a and 212a. Material form 213 is transparent or translucent. Material form 215 is electrically conductive. Material form 215 may comprise materials such as an electrically conductive polymer, a bulk metal foil or a fabric comprising metal fibrils. It is important to note that the sheetlike structure 199 has electrical conductivity through its thickness Z-199 from surface 210a to surface 212a in the region Wi. While shown as single layers, it is understood that material forms 213 and 215 may comprise multiple distinct layers.

Figure 38:
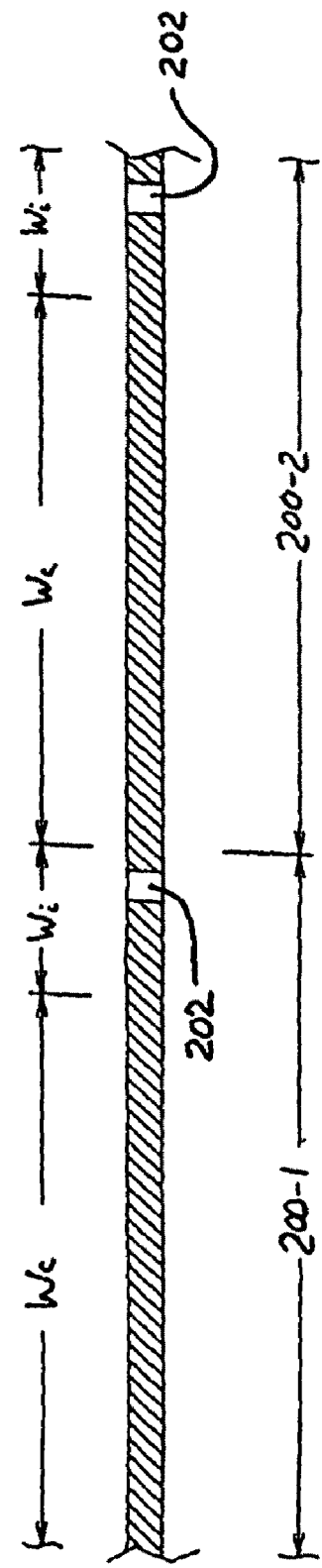
FIG. 38 is a sectional view showing a structure combining repetitive units of the article embodied in FIGS. 35 and 36.

FIG. 38 depicts an embodiment wherein multiple widths 200-1, 200-2 etc. of the general structure of FIGS. 35 and 36 are joined together in a generally repetitive pattern in the width direction. Such a structure allows simultaneous production of multiple repeat structures corresponding to widths 200-1, 200-2 in a fashion similar to that taught in conjunction with the embodiments of FIGS. 6 through 15.

Figure 39:
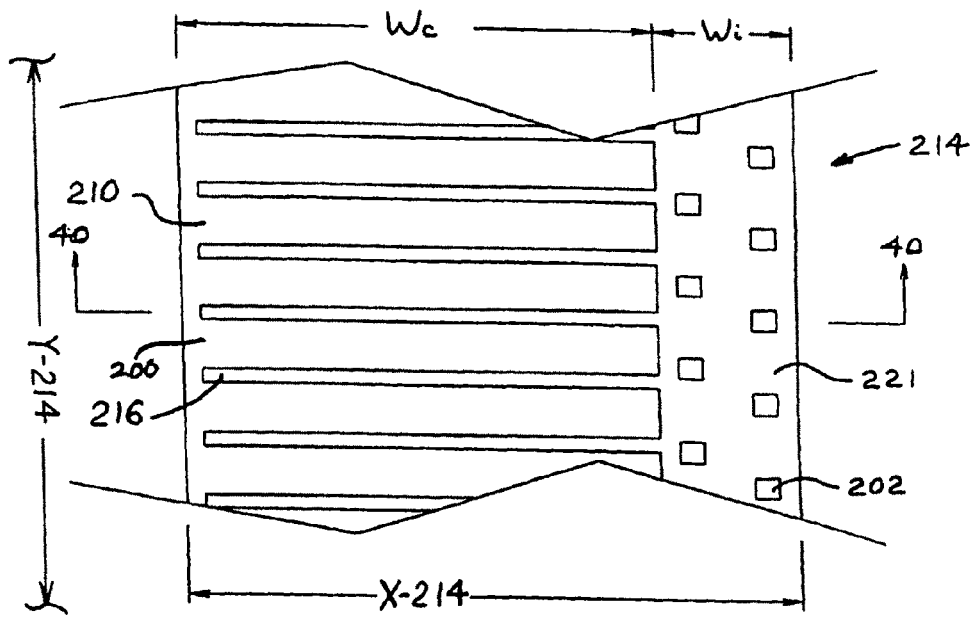
FIG. 39 is a top plan view of the article of FIGS. 35 and 36 following an additional processing step.
Figure 40:
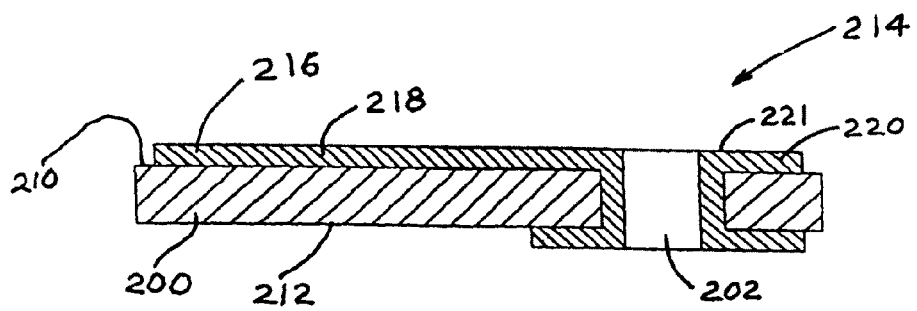
FIG. 40 is a sectional view taken from the perspective of lines 40-40 of FIG. 39.

FIG. 39 is a plan view of the FIG. 35 substrate 200 following an additional processing step, and FIG. 40 is a sectional view taken along line 40-40 of FIG. 39. In FIGS. 39 and 40, the article is now designated by the numeral 214 to reflect this additional processing. In FIGS. 39 and 40, it is seen that a pattern of "fingers" or traces 216 has been formed by material 218 positioned in a pattern onto surface 210 of original sheetlike substrate 200. "Fingers" or traces 216 extend over the width Wc of the solid portion of sheetlike structure 214. The "fingers" 216 extend to the "holey" interconnection region generally defined by Wi. Portions of the Wc region not overlayed by "fingers" 216 remain transparent or translucent to visible light. The "fingers" may comprise electrically conductive material. Examples of such materials are metal containing inks, patterned deposited metals such as etched metal patterns, stamped metal patterns, masked vacuum deposited metal patterns, fine wires, intrinsically conductive polymers and DER formulations. In other embodiments the "fingers" may comprise materials intended to facilitate subsequent deposition of conductive material in the pattern defined by the fingers. An example of such a material would be ABS, catalyzed to constitute a "seed" layer to initiate chemical "electroless" metal deposition. Another example would be a material functioning to promote adhesion of a subsequently applied conductive material to the film 200. In a preferred embodiment, the "fingers" comprise material which will enhance or allow subsequent metal electrodeposition such as a DER or electrically conductive ink. In the embodiment of FIGS. 39 and 40, the "fingers" 216 are shown to be a single layer of material 218 for simplicity of presentation. However, the "fingers" can comprise multiple layers of differing materials chosen to support various functional attributes as has previously been taught.

Continuing reference to FIGS. 39 and 40 also shows additional material 220 applied to the "holey" region Wi of article 214. As with the material comprising the "fingers" 216, the material 220 applied to the region Wi is either conductive or material intended to facilitate subsequent deposition of conductive material.

In an alternate embodiment, region Wi may comprise a fabric which may further comprise conductive material extending through the natural holes of the fabric. Further, such a fabric may comprise fibrils formed from conductive materials such as metals or conductive polymers. The conductive fibrils can be intermixed with nonconductive fibrils to give a fabric combining metallic characteristics such as high conductivity with polymer characteristics such as flexibility and adhesive affinity to a mating conductive surface such as the bottom surface of a photovoltaic cell. Moreover, a fabric structure can be expected to increase and retain flexibility after subsequent processing such as metal electroplating and perhaps bonding ability of the ultimate interconnected cells as will be understood in light of the teachings contained hereafter.

In the embodiment of FIGS. 39 and 40, the "holey" region takes the general form of a "buss" 221 extending in the Y-214 direction in communication with the individual fingers. However, as one will understand through the subsequent teachings, the invention requires only that conductive communication extend from the fingers to a region Wi intended to be electrically joined to the bottom conductive surface of an adjacent cell. The region Wi thus does not require overall electrical continuity in the "Y" direction as is characteristic of a "buss" form depicted in FIGS. 39 and 40.

Reference to FIG. 40 shows that the material 220 applied to the "holey" interconnection region Wi is shown as the same as that applied to form the fingers 216. However, these materials 218 and 220 need not be identical. It is understood that while the material extending over surface 212 is shown in the figure to mirror structure on surface 210 this need not be the case. The pattern of material positioned on surface 212 may differ from that on surface 210 in dimensional structure and/or composition. In this embodiment material 220 applied to the "holey" region extends through holes 202 and onto the opposite second surface 212 of article 214. The extension of material 220 through the holes 202 can be readily accomplished as a result of the relatively small thickness (Z dimension) of the sheetlike substrate 200. Techniques include two sided printing of material 220, through hole spray application, masked metallization or selective chemical deposition or mechanical means such as stapling, wire sewing or riveting.

Figure 41:
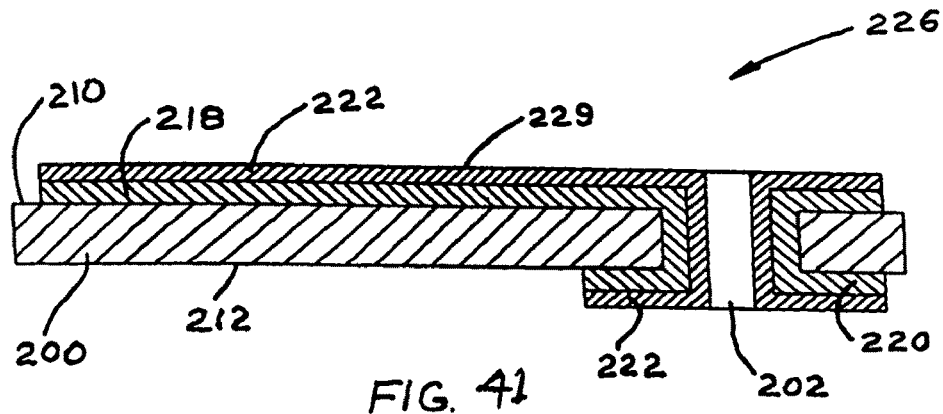
FIG. 41 is a sectional view similar to that of FIG. 40 following an additional optional processing step.

FIG. 41 is a view similar to that of FIG. 40 following an additional optional processing step. The article embodied in FIG. 41 is designated by numeral 226 to reflect this additional processing. It is seen in FIG. 41 that the additional processing has deposited highly conductive material 222 over the originally free surfaces of materials 218 and 220. Material 222 normally comprises metal-based material such as copper or nickel, tin or a conductive metal containing paste or ink. Typical deposition techniques such as printing, chemical or electrochemical metal deposition and masked deposition can be used for this additional optional process to produce the article 226. In a preferred embodiment, electrodeposition is chosen for its speed, ease, and cost effectiveness as taught above. It is understood that articles 214 and 226 are embodiments of "current collector stock".

It is seen in FIG. 41 that highly conductive material 222 extends through holes to electrically join and form electrically conductive surfaces on opposite sides of article 226. It is understood that while the conductive material extending over surface 212 of region Wi is shown in the Figures to mirror structure on surface 210 this need not be the case. The pattern of conductive material positioned on surface 212 may differ from that on surface 210 in dimensional, structural and/or compositional pattern. While shown as a single layer in the FIG. 41 embodiment, the highly conductive material can comprise multiple layers to achieve functional value. In particular, a layer of copper is often desirable for its high conductivity. Nickel is often desired for its adhesion characteristics, plateability and corrosion resistance. The exposed surface 229 of material 222 can be selected for corrosion resistance and bonding ability. It has been found very advantageous to form surface 229 with a material compatible with the conductive surface with which eventual contact is made. In preferred embodiments, electroless deposition or electrodeposition is used to form a suitable metallic surface. Specifically electrodeposition offers a wide choice of potentially suitable materials to form the surface 229. Corrosion resistant materials such as nickel, chromium, tin, indium, silver, gold and platinum are readily electrodeposited may be chosen to form surface 229. When compatible, of course, surfaces comprising metals such as copper or zinc or alloys of copper or zinc may be considered. Alternatively, the surface 229 may comprise a conversion coating, such as a chromate coating, of a material such as copper or zinc. Further, it may be highly advantageous to choose a material, such as a conductive adhesive or metallic solder to form surface 229 which exhibits adhesive or bonding ability to a subsequently positioned abutting conductive surface. In this regard, electrodeposition offers a wide choice of materials to form surface 229. In particular, indium, tin or tin containing alloys are a possible choice of material to form the exposed surface 229 of material 222. These metals melt at relatively low temperatures less than about 500 degree Fahrenheit. Thus these metals may be desirable to promote ohmic joining, through soldering, to other components in subsequent processing such as lamination. Alternatively, exposed surface 229 may comprise an electrically conductive adhesive. Selective deposition techniques such as brush plating or printing would allow the conductive materials of region Wi to differ from those of fingers 216. In addition to supplying electrical communication from surfaces 210 to 212, holes 202 also function to increase flexibility of "buss" 221 by relieving the "sandwiching" effect of continuous oppositely disposed layers. Holes 202 can clearly be the holes naturally present should substrate 200 in the region Wi be a fabric.

One appreciates that in the embodiments of FIGS. 39 through 41 electrical communication between oppositely facing surface regions 210 and 212 is achieved using holes 202 which constitute vias for conductive material extending between oppositely facing surface regions 210 and 212 of articles 214/226. The holes shown in the embodiments are but one of a number of different ways to achieve such communication. One alternate means of establishing such electrical communication was embodied in FIGS. 35A and 36A. There material 215 of region Wi of sheetlike article 199 comprised an electrically conductive material extending between surfaces 210a and 212a. Material form 215 may comprise materials such as an electrically conductive polymer, a bulk metal foil or a fabric comprising metal fibrils.

Figure 41A:
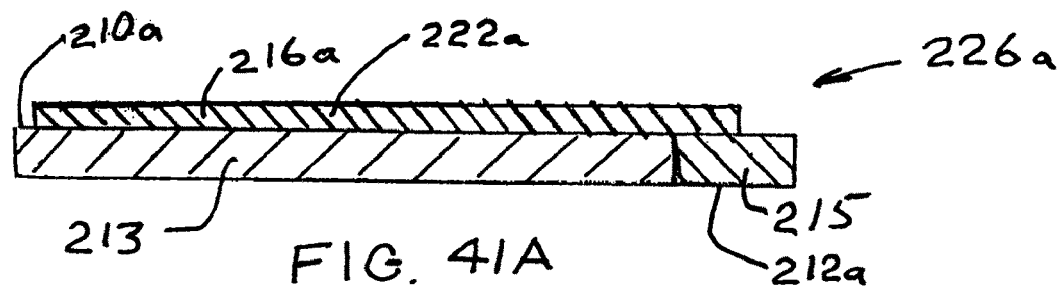
FIG. 41A is a sectional view like FIG. 41 but showing additional structure added to the embodiments of FIGS. 35A and 36A.

FIG. 41A is a sectional view of the FIGS. 35A/36A embodiment following an additional processing step depositing conductive material 222a onto the surface 210a. The FIG. 41A embodiment is identified as 226a to reflect this additional processing. Material 222a forms conductive traces or fingers 216a extending across surface 210a and overlapping a portion of material 215 in the region Wi. Electrical communication may thereby be achieved between the "fingers", the conductive material 215 of region Wi and consequently that portion of surface 212a within region Wi. Thus in this embodiment the conductive material 215 is substituted for the conductive material 222 extending through the holes 202 of FIG. 41.

While shown as a single layer, finger 216a may comprise multiple materials and layers as has previously been discussed for the material traces of FIGS. 39 through 41. Moreover one may formulate material 215 to comprise an electrically conductive polymer having an adhesive affinity to the bottom surface of a photovoltaic cell. Such an adhesive affinity could be conveniently activated by heat and/or pressure associated with a laminating process to electrically and physically join a conductive portion of surface 212a to the bottom surface 66 of a photovoltaic cell.

Figure 42:
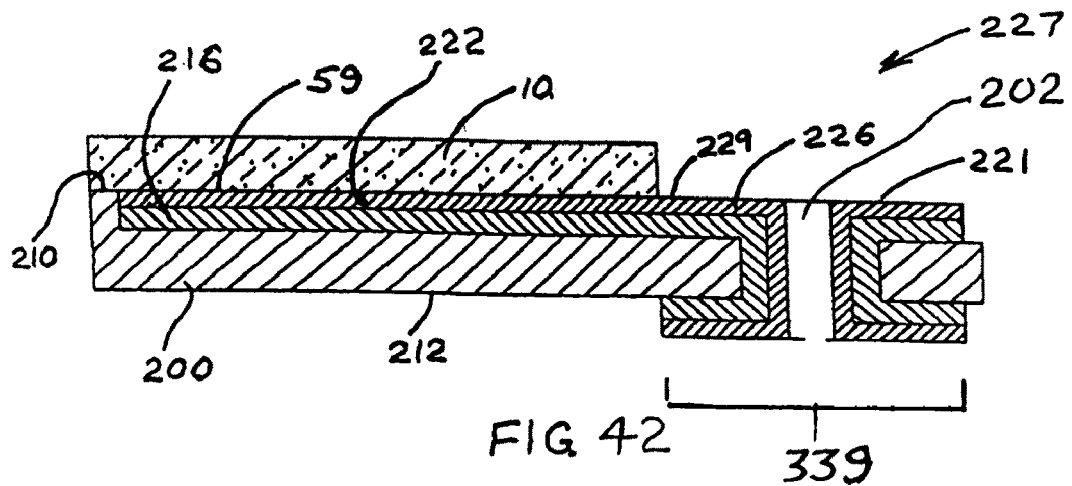
FIG. 42 is a sectional view showing a possible combining of the article of FIG. 41 with a photovoltaic cell.
Figure 43:
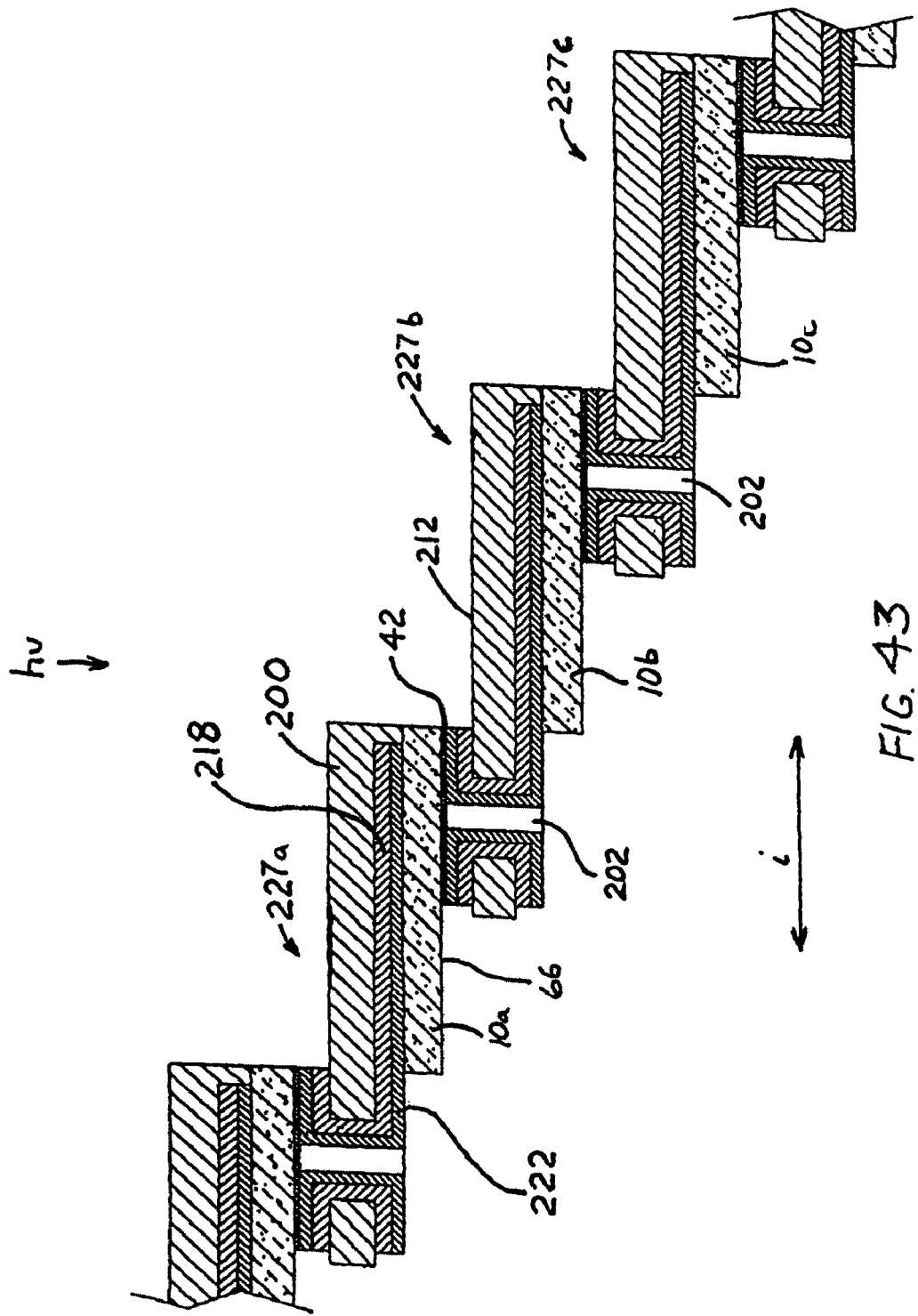
FIG. 43 is a sectional view showing multiple articles as in FIG. 42 arranged in a series interconnected array.

One method of combining the current collector stock 226 embodied in FIG. 41 with a cell stock 10 as embodied in FIGS. 1A and 2A is illustrated in FIGS. 42 and 43. In the FIG. 43 structure, individual current collector stocks 226 are combined with cells 10a, 10b, 10c respectively to produce a series interconnected array. This may be accomplished via a process generally described as follows.

As embodied in FIG. 42, a unit of "current collector stock", such as 226, is combined with a cell such as 10 by positioning of surface region "Wc" of current collector stock 226 having free surface 210 in registration with the light incident surface 59 of cell 10. The grid pattern of "fingers" or traces 216 extends over a preponderance of the light incident surface 59 of cell 10. The article so produced, identified as 227, is another embodiment of "tabbed cell stock". Adhesion joining the two surfaces is accomplished by a suitable process. In particular, the material forming the remaining free surface 210 of article 226 (that portion of surface 210 not covered with conductive material 222) may be a sealing material chosen for adhesive affinity to surface 59 of cell 10 thereby promoting good adhesion between the collector stock 226 and cell surface 59 resulting from a laminating process such as that depicted in FIG. 21. Such a laminating process brings the conductive material of fingers 216 into firm and effective contact with the window electrode 18 forming surface 59 of cell 10. This contact is ensured by the blanketing "hold down" afforded by the adhesive bonding adjacent the conductive fingers 216. One skilled in the art will further understand that the nature of the polymer support layer such as may be represented by layer 206 of FIG. 37, may be important in ensuring the integrity of the blanket "hold down". This is because the mechanical properties such as tensile modulus of the support layer will often exceed that of the adhesive bonding layer. Therefore, the "blanket" is less susceptible to movement over time when exposed to environmental conditions such as thermal cycling. Also, as mentioned above, the nature of the free surface of conductive material 222 may optionally be manipulated and chosen to further enhance ohmic joining and adhesion.

Both batch or continuous laminating are suitable when combining a unit of "current collector stock" with a cell 10 to produce the "tabbed cell stock" 227. The invention has been demonstrated using both roll laminators and batch vacuum laminators. Should the articles 226 and 10 be in a continuous form it will be understood that the combination article 227 could be formed continuously and possibly collected as a continuous "tabbed cell stock".

Referring to FIG. 43, it is seen that proper positioning allows the conductive material 222 extending over the second surface 212 of article 227b to be ohmicly adhered to the bottom surface 66 of cell 10a. This joining is accomplished by suitable electrical joining techniques such as soldering, riveting, spot welding or conductive adhesive application. The particular ohmic joining technique embodied in FIG. 43 is through electrically conductive adhesive 42. A particularly suitable conductive adhesive is one comprising a carbon black filler in a polymer matrix possibly augmented with a more highly conductive metal filler. Such adhesive formulations are relatively inexpensive and can be produced as hot melt formulations. Despite the fact that adhesive formulations employing carbon black alone have relatively high intrinsic resistivities (of the order 1 ohm-cm.), the bonding in this embodiment is accomplished through a relatively thin adhesive layer and over a broad surface. Thus the resulting resistance losses are relatively limited. A hot melt conductive adhesive is very suitable for establishing the ohmic connection using a straightforward lamination process. A hot melt conductive adhesive melts during the lamination process and firmly joins the conductive surfaces upon cooling.

FIG. 43 embodies multiple cells assembled in a series arrangement using the teachings of the instant invention. In FIG. 43, "i" indicates the direction of net current flow and "hv" indicates the light incidence for the arrangement. It is noted that the arrangement of FIG. 43 resembles a shingling arrangement of cells, but with an important distinction. The prior art shingling arrangements have included an overlapping of cells at a sacrifice of portions of very valuable cell surface. In the FIG. 43 teaching, the benefits of the shingling interconnection concept are achieved without any loss of photovoltaic surface from shading by an overlapping cell. In addition, the FIG. 43 arrangement retains a high degree of flexibility because there is no immediate overlap of the metal foil cell substrate.

Figure 44:
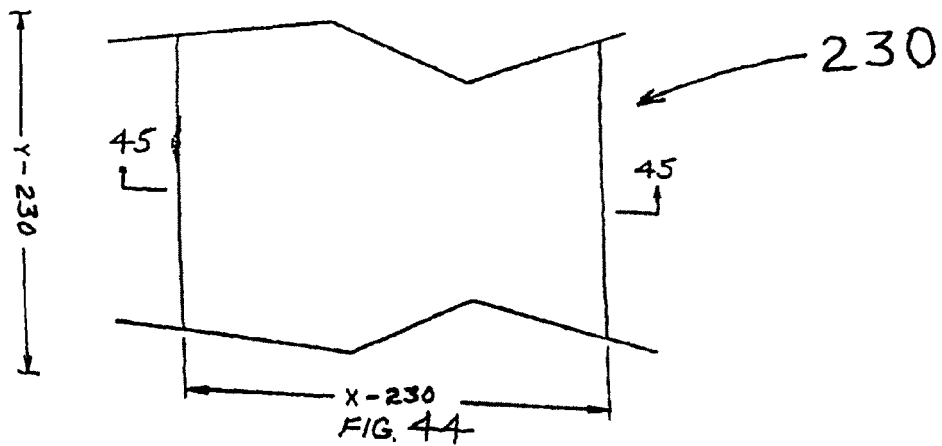
FIG. 44 is a top plan view of a starting article in the production of yet another embodiment of the instant invention.

Yet another form of the instant invention is embodied in FIGS. 44 through 56. FIG. 44 is a top plan view of a substrate article designated 230. Article 230 has width "X-230" and length "Y-230". It is contemplated that "Y-230" may be considerably greater than "X-230" such that article 230 may be processed in continuous roll-to-roll fashion. However, such continuous processing is not a requirement.

Figure 45:
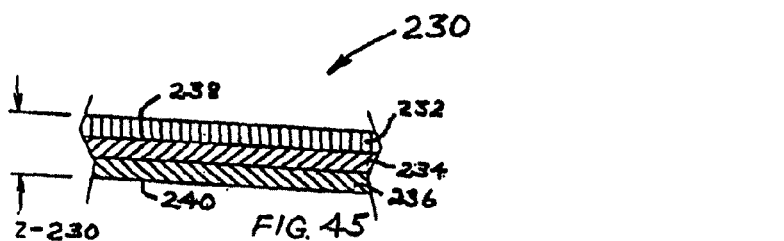
FIG. 45 is a sectional view taken substantially from the perspective of lines 45-45 of FIG. 44 showing a possible layered structure for the article.

FIG. 45 is a sectional view taken substantially from the perspective of lines 45-45 of FIG. 44. It is shown in FIG. 45 that article 230 may comprise any number of material layers such as those designated by numerals 232, 234, 236. The layers are intended to supply functional attributes to substrate article 230 as has been discussed for prior embodiments, for example in FIG. 7. Article 230 is also shown to have thickness "Z-230". "Z-230" is much smaller than "X-230" or "Y-230" and thus article 230 can generally be characterized as being flexible and sheetlike. Article 230 is shown to have a first surface 238 and second surface 240. As will become clear in subsequent embodiments, it may be advantageous to form layer 232 forming surface 238 using a material having adhesive affinity to the bottom surface 66 of cell 10. In addition, it may be advantageous to have surface 240 formed by a material having adhesive affinity to surface 59 of cell 10. The materials forming surfaces 238 and 240 may be the same or be different. As has been previously described, layer 234 may comprise a structural polymer layer such as polypropylene, polyethylene terepthalate (PET), polyethylene naphthalate (PEN), acrylic or polycarbonate.

Figure 46:
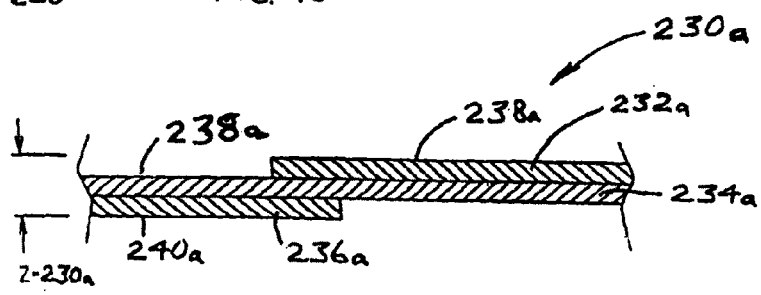
FIG. 46 is a sectional view similar to FIG. 45 but showing an alternate structural embodiment.

Many alternate embodiments for substrate articles exist. For example, FIG. 46 is an alternate sectional embodiment depicting a substrate article 230a. The layers forming article 230a do not necessarily have to extend over the entire expanse of article 230a. In FIG. 46, only a portion of the upward facing surface 238a of article 230a is formed by material layer 232a. Another portion of surface 238a is formed by material layer 234a. Similarly only a portion of the downward facing surface 240a is formed by material layer 236a. Another portion of the downward facing surface 240a is formed by material layer 234a. As will be shown, material layer 236a eventually is positioned to overlay the light incident surface 59 of a photovoltaic cell and therefore is transparent or translucent. In addition, it may be advantageous to choose material 236a to have adhesive affinity to the top surface 59 of a photovoltaic cell 10. Material 232a is eventually positioned to contact the bottom surface 66 of a photovoltaic cell 10. Thus, it may be advantageous to choose material 232a to have adhesive affinity to the bottom surface 66 of a photovoltaic cell 10. One also understands that material 232a need not necessarily be transparent or translucent since it is overlayed by the cell. In some embodiments materials 232a and 236a may be different or in other embodiments they may be the same. Furthermore, the thickness of materials 232a and 236a may differ.

In some embodiments the substrate articles "230" will comprise a common insulating carrier or support layer extending over the full width and length of the article. See, for example, layer 234a of FIG. 46. Such a common layer is often present to facilitate handling and processing and to support the various functional layers associated with the article. However, it is noted that such a common layer is not necessary for practice of the invention. Articles "230" comprising a patchwork of differing sheetlike portions may be employed. Further, one will appreciate in light of the teachings to follow that articles "230" may comprise multiple, discrete and separated sheetlike portions joined in a way to maintain the spatial arrangement of the discrete portions.

Figure 46A:
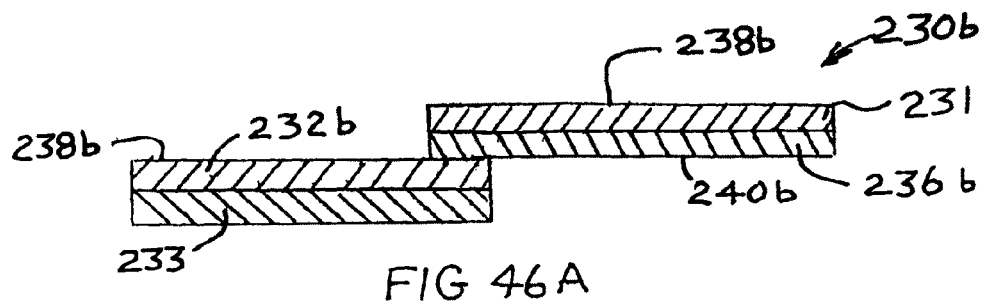
FIG. 46A is a sectional view showing yet another alternate structural embodiment.
Figure 46:
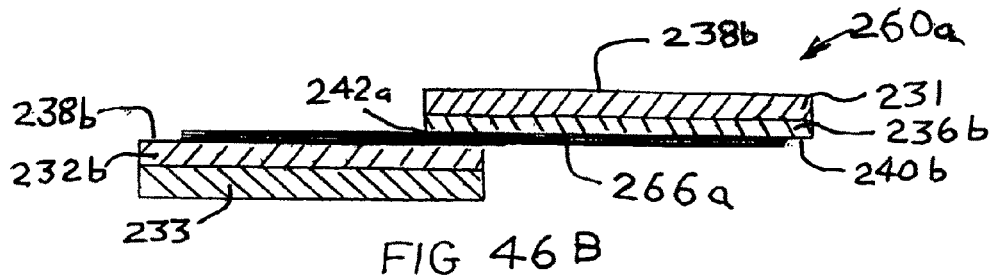
Figure 46:
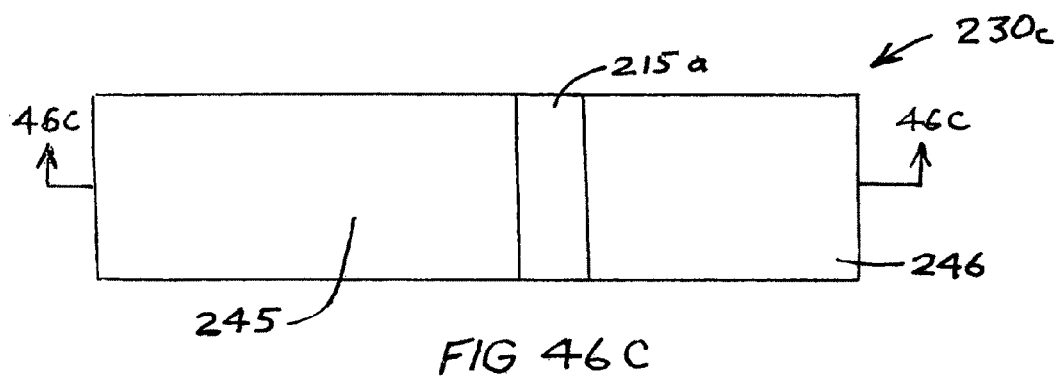
Figure 46:
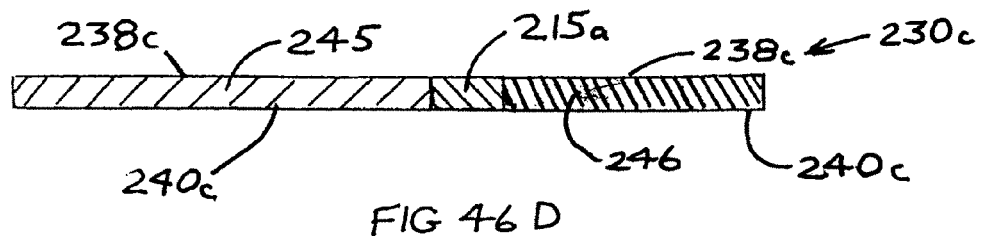
Figure 46:
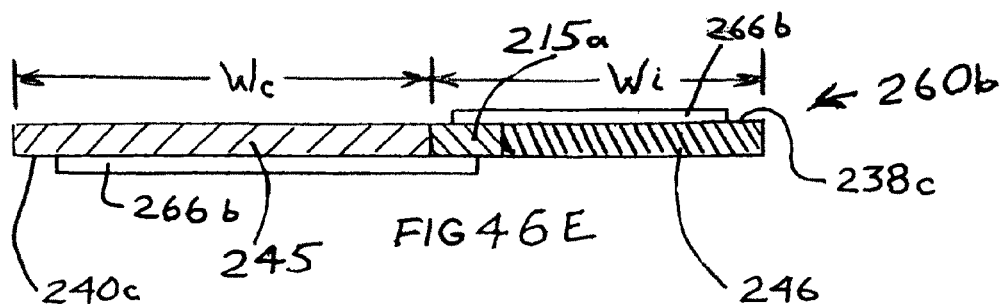
Figure 46:
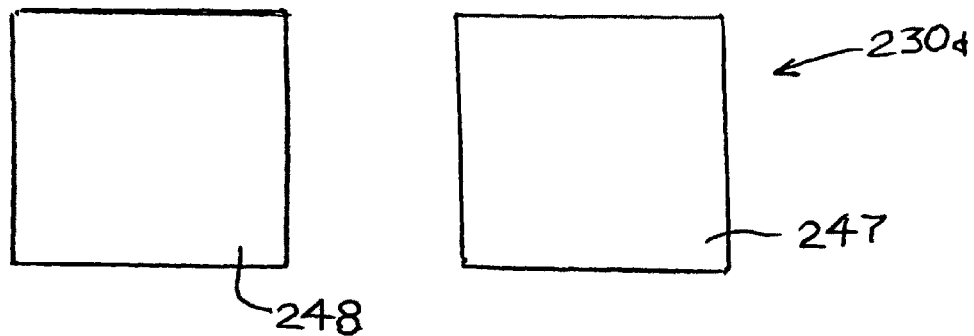
Figure 46:
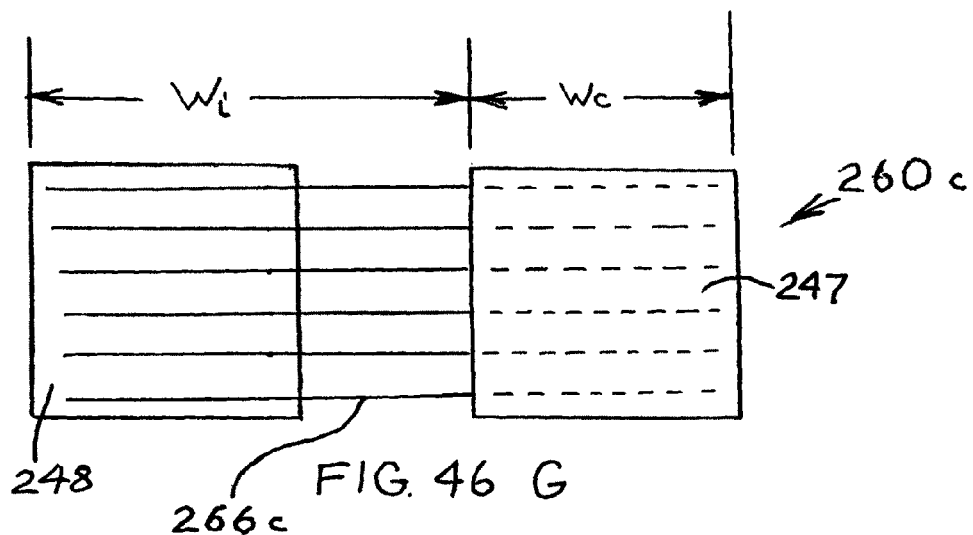
Figure 46:
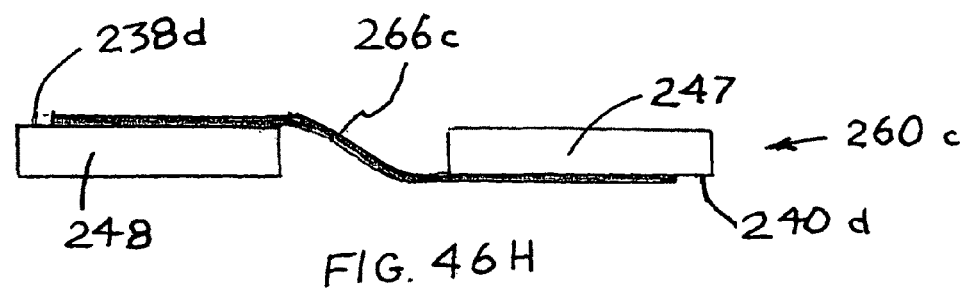

An example of an alternate embodiment is depicted in FIG. 46A. FIG. 46A is a sectional view showing a sheetlike substrate article 230b having an arrangement of joined portions. A first portion is characterized as having surface 240b formed from a transparent or translucent material 236b having adhesive affinity for the top surface 59 of photovoltaic cell 10. A second portion has surface 238b formed by a material 232b having adhesive affinity to the bottom surface 66 of cell 10. The individual portions each may have an optional carrier or support layer (231/233) to facilitate processing and possibly support functional layers. The carrier or support layers (231/233) are normally structural polymeric materials such as polypropylene, polyethylene terepthalate (PET), polyethylene naphthalate (PEN), acrylic or polycarbonate. After a seaming operation joins the portions together as shown, the overall article 230b assumes a substantially planar sheetlike form. Seaming may be accomplished by any number of known techniques such as laminating overlapping regions, stitching and adhesive bonding. A common feature of such articles "230" is that they have a portion of upward facing surface "238" comprising a material having adhesive affinity for a bottom surface of a photovoltaic cell and a portion of downward facing surface "240" comprising a material having adhesive affinity for a top light incident surface of a photovoltaic cell.

Another embodiment of the substrate articles "230" is illustrated in FIGS. 46C and 46D. There an article 230c is embodied which comprises three distinct portions patched together into a sheetlike form. A first material form 245 is transparent or translucent. Portions of surface 240 formed by material form 245 have adhesive affinity for the upper surface 59 of photovoltaic cells. Material form 246 forms a portion of surface 238 having adhesive affinity for the bottom surfaced 66 of a photovoltaic cell. Material forms 245 and 246 are positioned and joined together using conductive material 215a. Material 215a may comprise a conductive polymer, a bulk metal foil, a metal mesh or fabric comprising metal fibrils and the like. Material 215a supplies a conductive communication between surfaces 240c and 238c. While shown as single layers, it is understood that material forms 245, 215a, and 246 may comprise multiple materials and layers.

Another embodiment of the substrate articles "230" is depicted in FIG. 46F. In this top plan view an embodiment comprising two sheetlike portions 247 and 248 is shown in relative position. While not shown in FIG. 46F, portion 247 has a surface 240d which has adhesive affinity to a top surface 59 of a photovoltaic cell. Portion 248 has an oppositely facing surface 238d having adhesive affinity to the bottom surface 66 of a photovoltaic cell.

Figure 47:
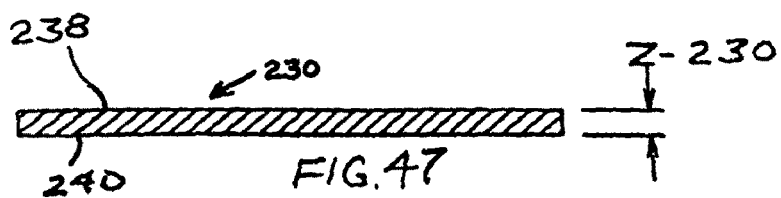
FIG. 47 is a simplified sectional view of the articles embodied in FIGS. 44-46 useful in maintaining clarity and simplicity for subsequent embodiments.

FIG. 47 is a simplified sectional view of the substrate articles "230" which will be used to simplify presentation of teachings to follow. While FIG. 47 presents articles 230 as a single layer, it is emphasized that in the teachings to follow articles 230 may comprise any number of layers and structural portions as taught above. One will readily understand the application of the inventive concepts to follow when using the various article embodiments 230 through 230d of the prior Figures. A common feature of all such articles "230" is that they have an upward facing surface 238 at least a portion of which is formed by a material having adhesive affinity for a bottom surface of a photovoltaic cell and a downward facing surface 240 at least a portion of which is formed by a material having adhesive affinity for a top light incident surface of a photovoltaic cell. The materials forming these adhesive surfaces may be the same or different.

Figure 48:
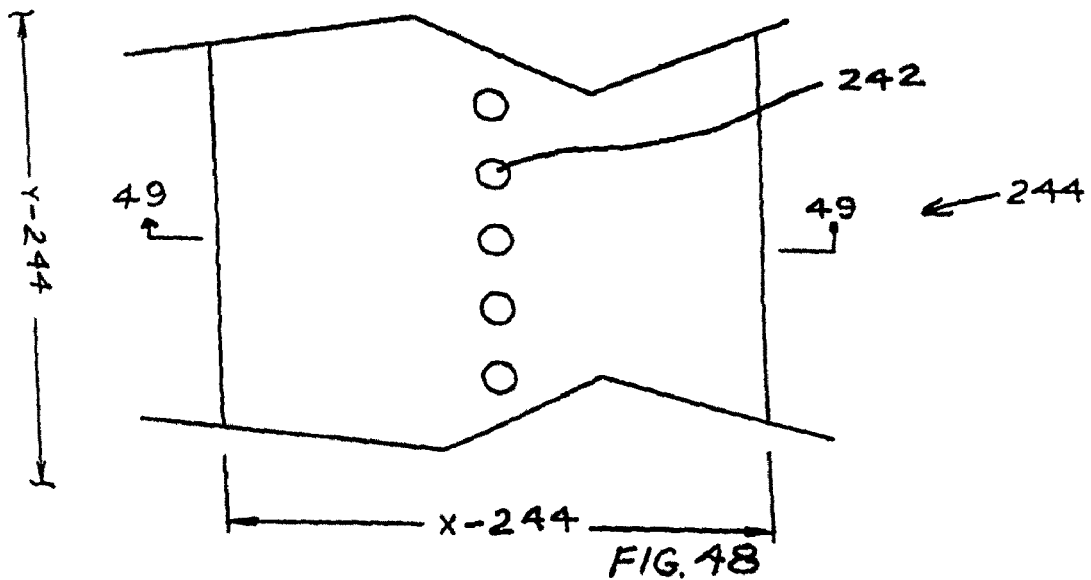
FIG. 48 is a top plan view of the articles of FIGS. 44-46 and 47 following an additional processing step.
Figure 49:
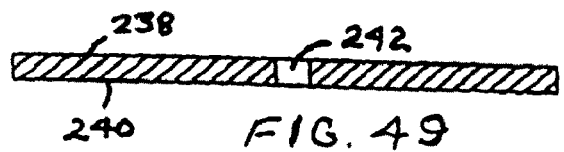
FIG. 49 is a sectional view taken substantially from the perspective of lines 49-49 of FIG. 48.

FIG. 48 is a top plan view of the initial article 230 following an additional processing step. The article embodied in FIG. 48 is designated 244 to reflect this additional processing step. FIG. 49 is a sectional view taken substantially from the perspective of lines 49-49 of FIG. 48. Reference to FIGS. 48 and 49 show that the additional processing has produced holes 242 in the direction of "Y-244". The holes extend from the surface 238 to the surface 240 of article 244. Holes 242 may be produced by any number of techniques such as laser drilling or simple punching.

Figure 50:
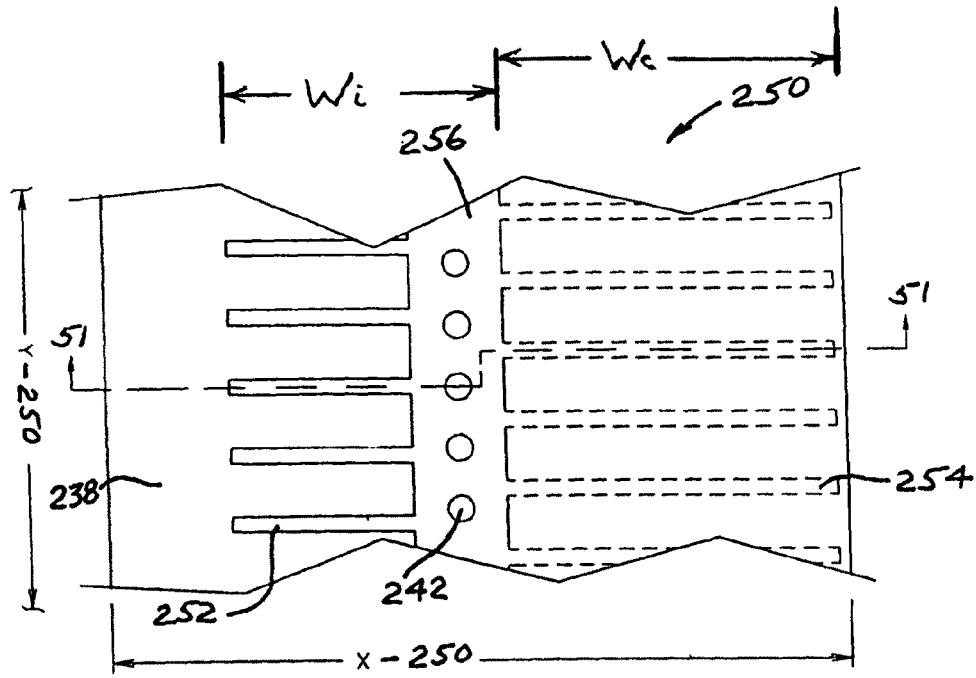
FIG. 50 is a top plan view of the article of FIGS. 48 and 49 following an additional processing step.
Figure 51:
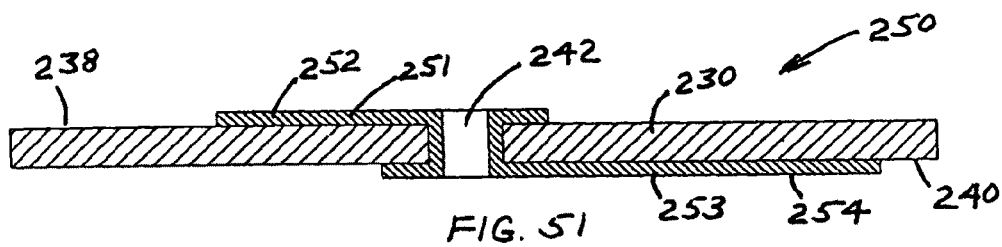
FIG. 51 is a sectional view taken substantially from the perspective of lines 51-51 of FIG. 50.

FIG. 50 is a top plan view of the article 244 following an additional processing step. The article of FIG. 50 is designated 250 to reflect this additional processing. FIG. 51 is a sectional view taken substantially from the perspective of lines 51-51 of FIG. 50. Reference to FIGS. 50 and 51 shows that material 251 has been applied to the first surface 238 in the form of "fingers" 252. Further, material 253 has been applied to second surface 240 in the form of "fingers" 254. In the embodiment, "fingers" 252 and 254 extend substantially perpendicular from a "buss-like" structure 256 extending in the direction "Y-250". As seen in FIG. 51, additional materials 251 and 253 extend through the holes 242. In the FIG. 51 embodiment, materials 251 and 253 are shown as being the same. This is not necessarily a requirement and they may be different. Also, in the embodiment of FIGS. 50 and 51, the buss-like structure 256 is shown as being formed by materials 251/253. This is not necessarily a requirement. Materials forming the "fingers" 252 and 254 and "buss" 256 may all be the same or they may differ in actual composition and be applied separately. Alternatively, fingers and busses may comprise a continuous material structure forming portions of both fingers and busses. Fingers and busses need not both be present in certain embodiments of the invention.

As in prior embodiments, "fingers" 252 and 254 and "buss" 256 may comprise electrically conductive material. Examples of such materials are metal wires and metal foils, conductive metal containing inks and pastes, patterned metals such as etched or punched metal patterns or masked vacuum deposited metals, intrinsically conductive polymers, conductive inks and DER formulations. In a preferred embodiment, the "fingers and "busses" comprise material such as DER or an electrically conductive ink such as silver containing ink which will enhance or allow subsequent metal electrodeposition. "Fingers" 252 and 254 and "buss" 256 may also comprise non-conductive material which would assist accomplishing a subsequent deposition of conductive material in the pattern defined by the "fingers" and "busses". For example, "fingers" 252 and 254 or "buss" 256 could comprise a polymer which may be seeded to catalyze chemical deposition of a metal in a subsequent step. An example of such a material is ABS. "Fingers" 252 and 254 and "buss" 256 may also comprise materials selected to promote adhesion of a subsequently applied conductive material.

Figure 52:
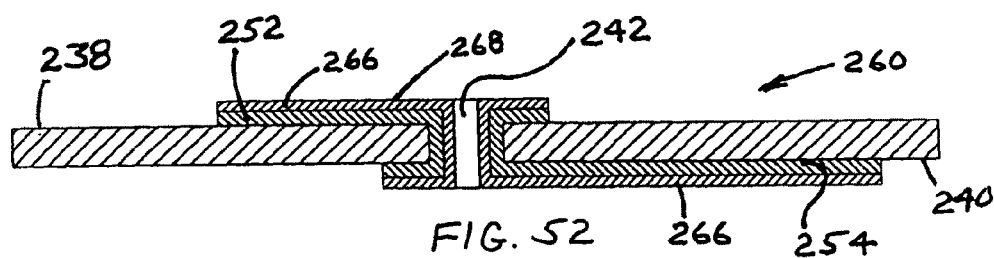
FIG. 52 is a sectional view of the article of FIGS. 50 and 51 following an additional optional processing step.

FIG. 52 is a sectional view showing the unit article 250 following an additional optional processing step. The article of FIG. 52 is designated 260 to reflect this additional processing. In a fashion like that described above for production of prior embodiments of current collector structures, additional conductive material 266 has been deposited by optional processing to produce the article 260 of FIG. 52. The discussion involving processing to produce the articles of FIGS. 12-15, 20, 31, and 41 is proper to describe the additional processing to produce the article 260 of FIG. 52. In a preferred embodiment, conductive material 266 may comprise material applied by electrodeposition. In addition, while shown in FIG. 52 as a single continuous, monolithic layer, the additional conductive material may comprise multiple layers and materials. As in prior embodiments, it may be advantageous to use a material such as a low melting point alloy or conductive adhesive to form exterior surface 268 of additional conductive material 266. Additional conductive material overlaying "fingers" 252 need not be the same as the additional conductive material overlaying "fingers" 254.

One appreciates that in the embodiments of FIGS. 50 through 52 electrical communication between conductive patterns on oppositely facing surfaces 238 and 240 is achieved using holes 242 which constitute vias for conductive material extending between oppositely facing surface 238 and 240 of articles 250/260. The holes shown in the embodiments are but one of a number of different ways to achieve such communication.

An alternate means of providing electrical communication between conductive patterns extending over oppositely facing surfaces of a sheetlike substrate is depicted in FIG. 46B. In FIG. 46B, the article of FIG. 46A is modified with additional structure. In FIG. 46B a metal form such as a wire 266*a* extends over surface 238*b*, through the substrate where portions of the substrate overlap and further over surface 240*b*. The metal wires or ribbons may be mechanically attached to the respective surfaces by partially embedding the wires or ribbons into the surfaces. Vias for conductive material are the natural holes 242*a* formed by the wire penetrating through the substrate.

FIG. 46E embodies an alternate arrangement. FIG. 46E shows additional conductive structure 266*b* extending over opposite faces of substrate 230*c* of FIG. 46C FIG. 46D. In FIG. 46E the article is identified as 260*b* to reflect this additional structure. As previously described, material 215*a* in region Wi of sheetlike article 260*b* comprises an electrically conductive material extending between surfaces 240*c* and 238*c*. Material form 215*a* may comprise materials such as an electrically conductive polymer, a bulk metal foil or a fabric comprising metal fibrils. In the FIG. 46E embodiment, additional conductive material 266*b* forms conductive traces or fingers extending over surfaces 240*c* of material form 245 and surface 238*c* of material 246. The conductive traces on opposite surfaces of article 260*b* overlap and contact material 215*a* to thereby establish electrical communication between the conductive trace patterns on opposite sides of the article 260*b*. Thus in this embodiment the conductive material 215*a* is substituted for the conductive material extending through the holes 242 of FIG. 52. While shown as a single layer, material form 266*b* may comprise multiple materials and layers as has previously been discussed for such traces.

FIGS. 46G and 46H embody a modification to the structure of FIG. 46F. The new modified structure is identified as 260*c*. In the FIGS. 46G and 46H, it is seen that portions 247 and 248 have been joined and fixed in relative spatial position using metal wires or ribbons 266*c* extending between the two portions. In addition, the wires extend over a surface 238*d* of portion 248 and also surface 240*d* of portion 247. As previously indicated, surface 238*d* of portion 248 would have adhesive affinity for a bottom surface of a photovoltaic cell and surface 240*d* of portion 247 would have adhesive affinity to a top surface 59 of a photovoltaic cell. The metal wires or ribbons could be mechanically attached to the respective surfaces by partially embedding the wires or ribbons into the surfaces. This attachment may be enhanced by adhesive characteristics of the material forming the surface itself. Alternatively attachment of the wires to the surfaces by first coating with a conductive adhesive may be considered.

The alternate structural embodiments "260" of FIGS. 46B, 46E, 46H and 52 may be characterized as "laminating current collector/interconnect" assemblies or as units of interconnecting structure. Inspection of the embodiments reveals some important common characteristics for such "laminating current collector/interconnect" assemblies:

at least a portion of the substrate is formed by a transparent or translucent material.

the articles all have a portion of a downward facing surface formed by a material having adhesive affinity for a top conductive surface of a photovoltaic cell and further having an electrically conductive pattern extending over that portion of downward facing surface.

the articles all have a portion of an upward facing surface which is formed by a material having adhesive affinity for a bottom conductive surface of a photovoltaic cell and further having an electrically conductive pattern extending over that portion of upward facing surface.

the articles all have electrical communication between the conductive patterns positioned on the upward facing and downward facing surface portions.

In many cases the articles "260" will also comprise a multilayered laminating sheet comprising a structural plastic layer supporting an adhesive layer.

The sectional views of FIGS. 55 and 56 embody the use of articles 250 or 260 to achieve a series connected structural array of photovoltaic cells 10. In FIG. 55, an article designated as 270 has been formed by combining article 260 with cell 10 by laminating the surface 240 of article 260 to the top conductive surface 59 of cell 10. The grid pattern of "fingers" or traces 254 extends over a preponderance of the light incident surface 59 of cell 10. In a preferred embodiment, portions of exposed surface 240 (regions not covered with "fingers" 254) are formed by a material having adhesive affinity to surface 59 and a secure and extensive adhesive bond forms between surfaces 240 and 59 during the heat and pressure exposure of the lamination process. Thus an adhesive "blanket" holds conductive material 266 of "fingers" 254 in secure contact with surface 59. One skilled in the art will further understand that the nature of the polymer support layer such as may be represented by layer 234 of FIG. 45 may be important in ensuring the integrity of the blanket "hold down". This is because the mechanical properties such as tensile modulus of the support layer will often exceed that of the adhesive bonding layer. Therefore, the "blanket" is less susceptible to movement over time when exposed to environmental conditions such as thermal cycling. As previously pointed out, low melting point alloys or conductive adhesives may also be considered to enhance this contact although these measures have not been necessary to establish excellent contact between cell surfaces and the laminated traces.

It is understood that article 270 of FIG. 55 is yet another embodiment of a "tabbed cell stock". One clearly appreciates that the "tabbed cell stock" article 270 has readily accessible surfaces of opposite cell polarity. Surface 66 is readily accessible as seen. Conductive material 266 contacts top cell surface 59 and extends to form an accessible surface removed from the cell. Thus, the performance characteristics of the "tabbed cell" can be readily determined. This allows immediate and facile identification of cell performance characteristics, sorting of cell material according to performance and removal of defective cell material.

An additional feature of the laminating "current collector/interconnect" assemblies 260 embodied in FIGS. 46B, 46E, 46H and 52 is the extending portion comprising conductive material positioned on second surface 238. Choosing material forming surface 238 to have adhesive affinity to the bottom surface 66 of a photovoltaic cell allows electrical connection to be achieved during lamination of surface 238 to bottom surface 66 of cells 10. Accordingly, the sectional view of FIG. 56 embodies multiple articles 270 arranged in a series interconnected array. The series connected array is designated by numeral 290 in FIG. 56. In the FIG. 56 embodiment, it is seen that "fingers" 252 positioned on surface 238 of article 270b have been brought into contact with the bottom surface 66 of cell 10 associated with article 270a. This contact is achieved by choosing material 232 forming free surface 238 of article 270b to have adhesive affinity for bottom conductive surface 66 of cell 10 of article 270a. Secure adhesive bonding is achieved during the heat and pressure exposure of a laminating process thereby resulting in a hold down of the "fingers" 252 in contact with surface 66. In addition, it is clear that the extension of the unit of interconnect structure 260 to adjacent cells physically secures the cells in adjacent positioning.

It may be important to realize that contact between the conductive surfaces of the article 260 and the photovoltaic cells is achieved via pressure exerted by the "blanketing effect" of adhesive layers of article 260 contacting the corresponding photovoltaic cell surface. It is important to understand that these contacts may be achieved without the use of solders or conductive adhesives.

Thus, it is seen that with the FIG. 56 structure the current collection and electrical communication may achieved with continuous, monolithic conductive structure extending between the top surface of one cell and the bottom or rear surface of an adjacent cell. One readily appreciates that no solder or electrically conductive adhesives are required to achieve the current collection and interconnecting contacts associated with the FIG. 56 structure. This avoids potential degradation of contacts sometimes experienced when using conductive adhesives or solders. However, as discussed above one may choose to employ low melting point metals or conductive adhesives at the contacting surfaces of the electrical traces if desireable.

In addition, the FIG. 56 embodiment clearly shows an advantageous "shingling" type structure that minimizes shielding of valuable photovoltaic cell surface. As seen, the only light shielding of the photovoltaic cells is from the traces 254. No overlapping of cells is required, as has been the case for "legacy" shingled arrangements. Furthermore, the FIG. 56 structural arrangement requires no separation, in a direction parallel to the cell surface, among adjacent cells. This contrasts with legacy "string and tab" approaches which employ such a separation for positioning of tabs and short prevention.

It is seen that the structural embodiment of FIG. 56 includes complete encapsulation of cells 10. This is achieved by having article 260 be of sufficient width dimension to exceed the combined span of two adjacent cells. Surface 240 of a first article 270 extends slightly past a terminal edge of a first cell and surface 238 extends sufficiently to complete encapsulation of the cells as shown.

The sectional view of FIG. 56 suggests sharp and abrupt variations in surface topography when traversing right to left from cell-to-cell. These variations are a result of the drawing format only and do not represent actual surface variations of the article. Indeed, variations in surface topography of actual articles are slight when considering the horizontal distances over which they occur. This is a result of the relatively small thickness dimensions (dimension "Z" in the various drawing embodiments) characteristic of both the interconnecting substrate structure and the thin film photovoltaic cells taught herein. Indeed, the actual surface topography of the embodiments such as that of FIG. 56 may in practice be characterized as substantially planar.

Smooth undulations in surface topography are important. First, efforts to overlay integrated modular cell arrays with flexible barrier films normally demand a substantially planar surface upon which to laminate the barrier film. The importance of surface planarization prior to application of barrier films is discussed in U.S. patent application Ser. No. 12/372,720, the entire contents of which are hereby incorporated by this reference. It is readily appreciated that the upper and lower surfaces of the modular arrays as depicted in FIG. 56 are formed by smooth polymeric films forming a structure having very low aspect ratio (depth to width ratio) and wherein the seams between the units are smoothed by the pressures and material flow during the lamination step. Thus requirements for thick intermediary "planarization" layers between the modular arrays taught herein, such as that of FIG. 56, and overlaying functional layers are avoided. Furthermore, material defects are avoided during a subsequent lamination of the flexible barrier film.

A second significant advantage of the structure embodied in FIG. 56 is that the substantially planar upper and lower surfaces require only a minimum thickness of intermediary material, such as an adhesive layer, to achieve the planarization associated with firmly and uniformly laminating the structure to additional material sheets such as glass or barrier film. Typical thicknesses for intermediary materials are less than 250 micrometer. Thick intermediary materials (typically thicker than 250 micrometers) required for higher aspect ratios structure such as "string and tab" arrangements can be avoided. This leads to reduced material cost and more efficient processing options.

Figure 61:
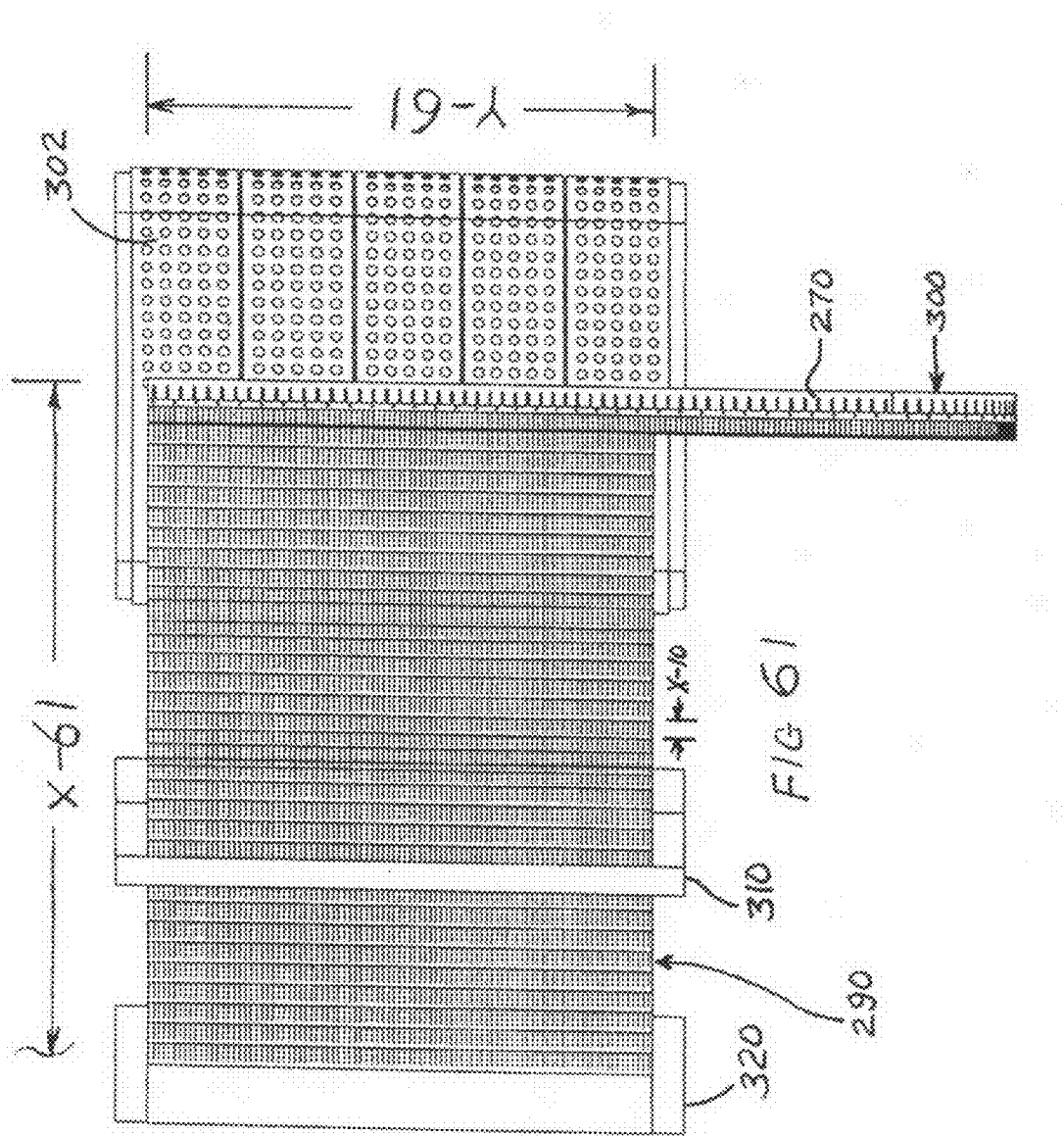
FIG. 61 is a top plan view embodying a possible process to achieve positioning of photovoltaic cells into a series interconnected array.

Further, one notes that the structure of the integrated array of FIG. 56 remains highly flexible. This permits the array to be further processed using techniques, such as roll lamination, which operate best when one of the material feed streams is flexible. For example a process of roll lamination of the FIG. 56 structure to a glass support/barrier sheet is depicted in FIG. 61 and more thoroughly discussed below. There the glass may be fed as a rigid member while the FIG. 56 structure and intermediary adhesive are fed as flexible layers to the nip of a roll laminator.

Finally, one notes that the FIG. 56 structure involves firm positioning and interconnection of the individual cells relative each other. The robust seaming of the films associated with adjacent cells ensures that the permanent positioning and interconnection is maintained despite manipulations and handling associated with subsequent processing. This permits major expansion of design and form factor choices for final modules of the instant invention. In comparison, prior to final lamination "string and tab" legacy structures are flimsy and vulnerable to damage.

One also will appreciate that using the conductive pattern of traces joined by a connecting trace of material 128 as shown if FIG. 29 allows for substantial redundancy in current collection and contact. Should any of the traces become electrically disabled alternate electrical paths are readily available to accomplish the necessary current transport and contacts.

Figure 57:
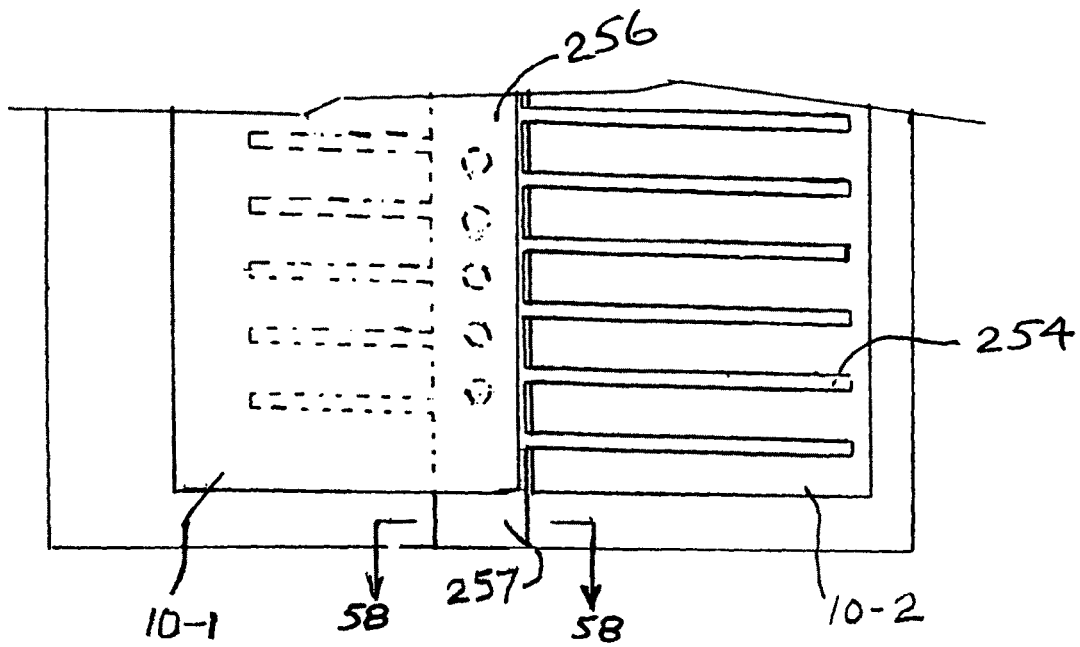
FIG. 57 is a top plan view of a structural arrangement as depicted in FIG. 56 but with some structural portions removed for clarity of explanation of a feature of the invention.
Figure 58:
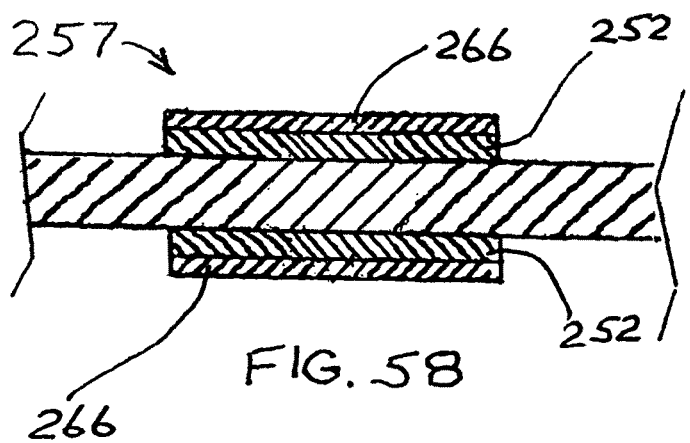
FIG. 58 is a sectional view taken substantially from the perspective of lines 58-58 of FIG. 57.

Turning now to FIGS. 57 and 58 there is shown there a valuable feature of the modular arrays as depicted in FIG. 56. FIG. 57 is a top plan view of a structural arrangement as depicted in FIG. 56 but with some structural portions removed for clarity of explanation of a feature of the invention. FIG. 58 is a sectional view taken substantially from the perspective of lines 58-58 of FIG. 57. In FIG. 57, a pair of cells 10-1 and 10-2 are shown positioned adjacent each other in series electrical arrangement as embodied in FIG. 56. One sees that a portion 257 of the "buss" 256 associated with the pair of cells may be designed to extend outside the area occupied by the adjacently paired cells.

The sectional view of FIG. 58 is taken thru that portion 257. Reference to FIG. 58 shows that one may access the buss 256 positioned between adjacent cells. One will therefore understand, that electrical connections between two consecutive buss extensions can be used to determine the electrical characteristics of individual cells after assembly into the module format. Furthermore, the electrical connections between buss extensions allow for the identification, isolation, and repair of shunted or shorted photovoltaic cells.

A common problem encountered with photovoltaic cells, especially thin film cells is that of electrical shunting or shorting from the top light incident surface to the opposite bottom electrode. Such shunting may result from a number of sources including:

a. So called "thin film" photovoltaic cells often comprise a self supporting metal foil substrate. These foil substrates allow continuous deposition and manufacture of the raw PV materials. These PV layers may be deposited over relatively broad surfaces of the underlying metal foil substrate. The PV material layers are often very thin (of the order 1 micron). One problem encountered here is the surface roughness of the supporting metal foil. This foil roughness can be greater than the thickness of the deposited semiconductor materials. In this situation, metal portions may protrude through the PV layers and effectively electrically connect the top and bottom electrodes. While various efforts are made to "smooth" the supporting metal foil, the roughness problem may remain.

b. The "thin film" PV deposits may also have discontinuities such as pinholes extending through the thickness. These may result from a number of sources such as insufficient substrate cleaning or flaking and scratching during handling of the raw, unprotected PV material prior to encapsulation. It is common to apply a conductive silver containing ink to the light incident surface of cells to function as a current collecting structure. The ink, when extending over a sufficiently large discontinuity in the PV material, may wick down to the underlying metal substrate and result in a short.

c. In the case of a laminated electrode such as that taught in U.S. Pat. No. 7,635,810, a separately prepared grid is laminated to the light incident surface of a PV cell. Because of the reduced thickness of thin film PV materials, it is possible to cause "punch through" of the grid from the top surface to the underlying foil substrate during the heat and pressure exposure encountered during the lamination process.

Such shunting or shorting causes deterioration in the performance of the cell, normally lowering both the open circuit voltage (Voc) and the short circuit current (Isc). Unfortunately, it is difficult to detect and isolate shunts prior to the application of the collection grid structure.

A shunt or short may often comprise a very minute contact of conductive material extending through the semiconductor body. Since the observed shunts or shorts often involve minimal point contacts, it has been observed that passing an electrical current through the shunted cell from front to back electrodes heats up the short sufficiently to "burn it out" (much like a fuse burns out as a result of a short circuit). Alternately, heating up the region of the short may at least "disturb" it enough to separate the point contact. One will readily understand, that the exposed buss extensions as shown in FIGS. 57 and 58 provide contacts to pass the electrical current.

One can measure the electrical resistance through a PV cell by connecting the leads of an ohmmeter to the opposite electrodes of a cell. When this is done under "dark" conditions, (no illumination), the resistance determined is hereby defined as the "dark series resistance" and abbreviated as "Rd". For example, Rd can be conveniently determined by placing the light incident surface of a cell against an opaque surface such as a wood table surface and measuring the resistance. In the case of a CIGS cell supported by a metal foil substrate, the positive pole of the ohmmeter is connected to the foil and the "common" or negative connected to the top electrode.

It has been observed that, for cells having a surface area of about 8 square inches, a shunted or shorted cell is quickly identified if the "dark series resistance" Rd of the cell falls below about 2 ohms (i.e. 2 ohms, 1 ohm, 0.5 ohm). Cells showing an Rd above about 5 ohms (i.e. 5 ohms, 10 ohms, 20 ohms, 50 ohms, 75 ohms) typically perform satisfactorily. Thus, concern is raised when the Rd falls below about 5 ohms. However, selected cells having Rd below 5 ohms have on occasion shown adequate performance, indicating that other parameters may, at least partially, overcome the negative affects of partial shunting.

The use of exposed buss extensions to pass current and repair shorted or shunted cells was reduced to practice in San Jose, Calif. in August, 2009. First, a number of "laminated cell stock" samples were prepared using CIGS material supported on a stainless steel substrate. These samples were prepared according to the teachings associated with FIG. 55. Table A gives the data observed for the individual cells after the initial lamination of the grids to the top surface of the cells:

TABLE A

| Cell # | Rd After Initial Lamination |
| --- | --- |
| 3-24 | 96 |
| 3-8 | 122 |
| 3-2 | 106 |
| 2-20 | 103 |

These cells were then assembled into a "4-up" modular array in a fashion as depicted in FIG. 56. Table B provides the data observed following this array lamination:

TABLE B

| Cell # | Rd of Cell |
| --- | --- |
| 3-24 | 0.5 |
| 3-8 | 0.6 |
| 3-2 | 93. |
| 2-20 | 91. |

Cells 3-24 and 3-8 had thus shorted during the array lamination. Measurements of the modular array in the sun across the entire array showed an open circuit voltage of 2.1 volts and a closed circuit current of 1.51 amps. This showed that despite two cells (3-24 and 3-8) being "shunted", the array performance had not suffered catastrophically.

The process to repair the cells involved connecting a wire probe to each pole of a fresh 9-volt battery. These probes were then placed in contact with the opposite electrodes of each of the shorted cells. The positive battery pole was placed in contact with the bottom cell electrode (stainless steel) and the negative battery electrode was contacted to the top grid electrode of the cell. It was observed that the initial current across the shorted cells was 5-6 amps but it quickly dropped below 1 amp after about 10 seconds. Both cells 3-8 and 3-24 were treated in this way. It should be noted that no electrical treatment was given to cells 3-2 and 2-20. Upon completion of this electrical exposure, the following measurements were made:

TABLE C

| Cell # | Rd |
| --- | --- |
| 3-24 | 30.5 |
| 3-8 | 99.5 |
| 3-2 | 90. |
| 2-20 | 95. |

The electrical measurements indicated that the shorts had been removed from the cells 3-24 and 3-8. In addition, it was observed that the precise location of the original shorts could be observed by small bubbling of the plastic around the short and even a tiny burn mark on the backside stainless surface. It is apparent that forcing a current through the original short acted to remove the short by disturbing it, possibly either by "burning it out" like a fuse or by simply melting the plastic film. The "repaired" array had electrical performance virtually identical to an array never having shorts. These electrical measurements are reported in Table D.

TABLE D

| Initial readings | |
| --- | --- |
| Voc - 2.20 V | Isc - 1.58 amps. |
| Readings after approximately ½ hour sun soak (cells very warm) | |
| Voc - 2.12 | Isc - 1.56 amps. |
| Readings after cells had cooled down from sun soak | |
| Voc - 2.24 V | Isc - 1.53 amps. |

Readings were taken in the sun, Aug. 18, 2009, San Jose, approximately 2:00 PM. A slight haze existed.

Figure 53:
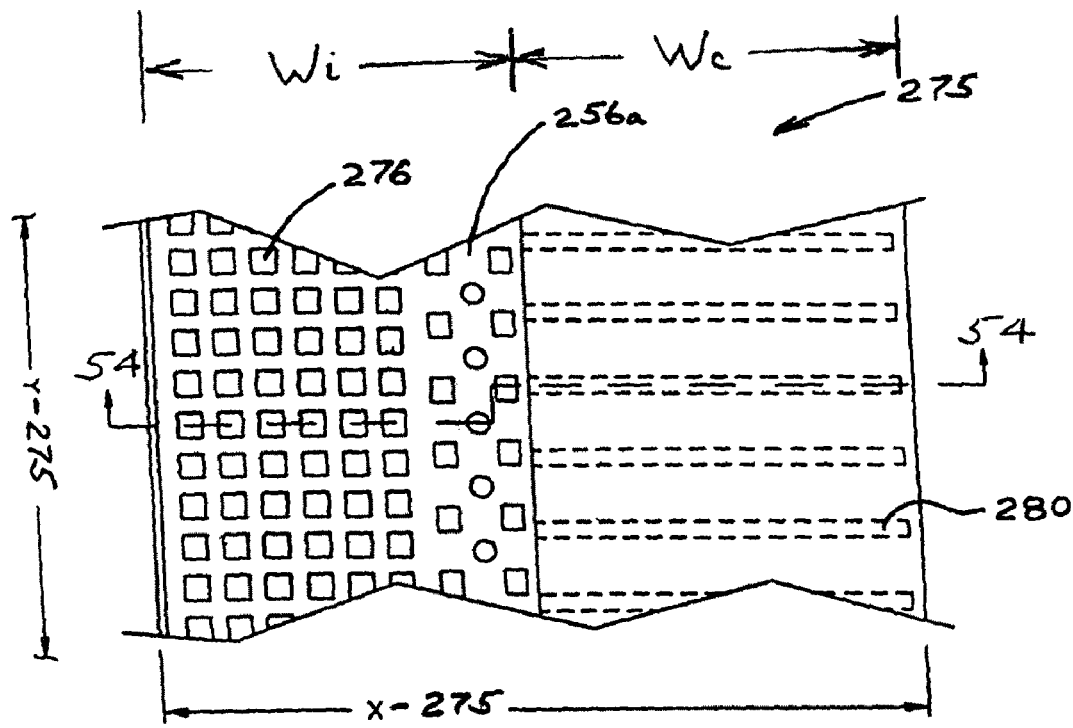
FIG. 53 is a top plan view of an article similar to that of FIG. 50 but embodying an alternate structure.
Figure 54:
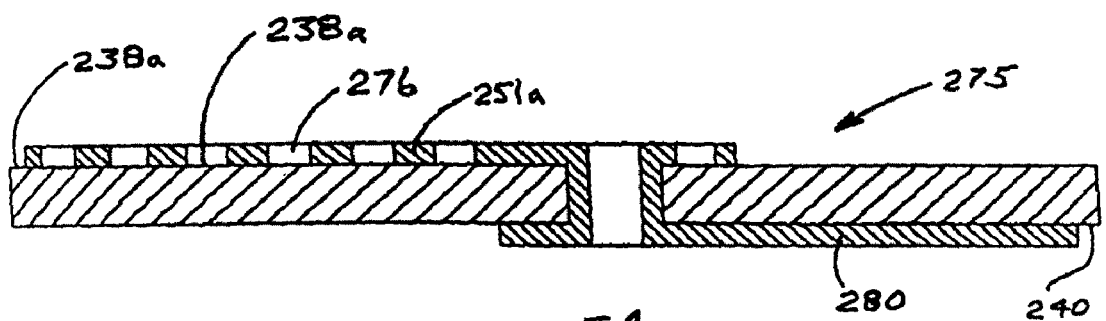
FIG. 54 is a sectional view taken substantially from the perspective of lines 54-54 of FIG. 53.

The embodiments of FIGS. 50 through 52 show structure of "fingers" and "busses". Other geometrical forms are clearly possible. This is especially the case when considering structure for contacting the rear or bottom surface 66 of a photovoltaic cell 10. One embodiment of an alternate structure is depicted in FIGS. 53 and 54. FIG. 53 is a top plan view while FIG. 54 is a sectional view taken substantially from the perspective of lines 54-54 of FIG. 53. In FIGS. 53 and 54, there is depicted an article 275 analogous to article 250 of FIG. 50. The article 275 in FIGS. 53 and 54 comprises "fingers" 280 similar to "fingers" 254 of the FIG. 50 embodiment. However, the pattern of material 251 forming the structure on the surface 238a of article 275 is considerably different than the "fingers" 252 and "buss" 256 of the FIG. 70 embodiment. In FIG. 53, material 251a is deposited in a mesh-like pattern having voids 276 leaving multiple regions of surface 238a exposed. Lamination of such a structure may result in improved surface area contact of the pattern compared to the finger structure of FIG. 50. It is emphasized that since surface 238a of article 275 eventually contacts rear surface 66 of the photovoltaic cell, potential shading is not an issue and thus geometrical design of the exposed contacting surfaces 238a relative to the mating conductive surfaces 66 can be optimized without consideration to shading issues.

Using a laminating approach to secure the conductive grid materials to a conductive surface involves some design and performance "tradeoffs". For example, if the electrical trace or path "finger" 84 comprises a wire form, it has the advantage of potentially reducing light shading of the surface (at equivalent current carrying capacity) in comparison to a substantially flat electrodeposited, printed or etched foil member. However, the relatively higher profile for the wire form must be addressed. It has been taught in the art that wire diameters as small as 50 micrometers (0.002 inch) can be assembled into grid like arrangements. Thus when laid on a flat surface such a wire would project above the surface 0.002 inches. For purposes of this instant specification and claims, a structure projecting above a surface less than 0.002 inches will be defined as a low-profile structure. Often a low profile structure may be further characterized as having a substantially flat surface.

Figure 59:
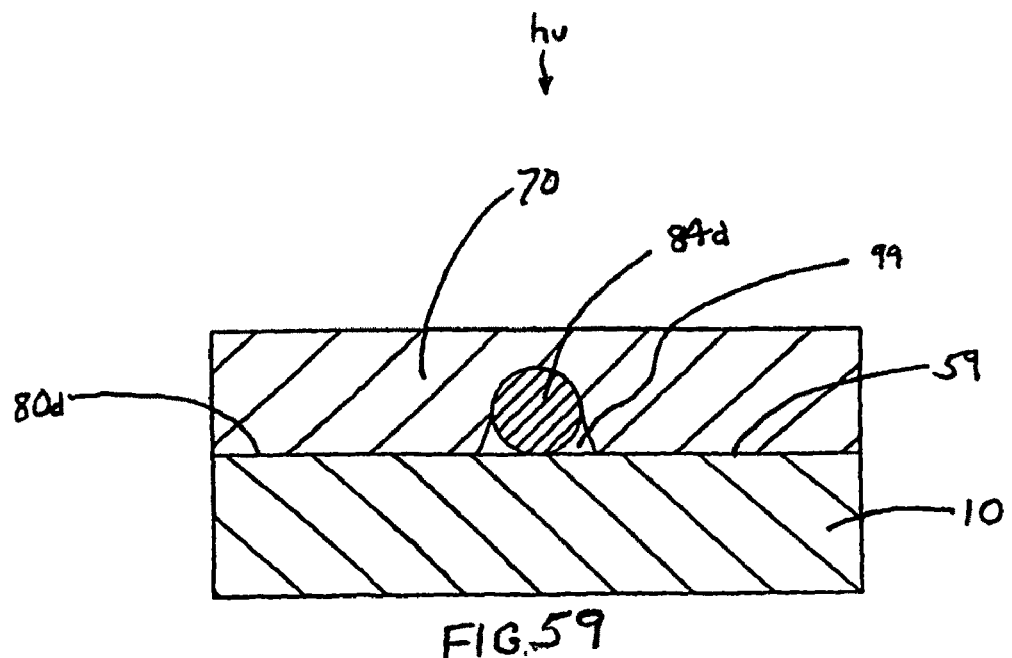
FIG. 59 is a sectional view embodying a possible condition when using a circular form in a lamination process.
Figure 60:
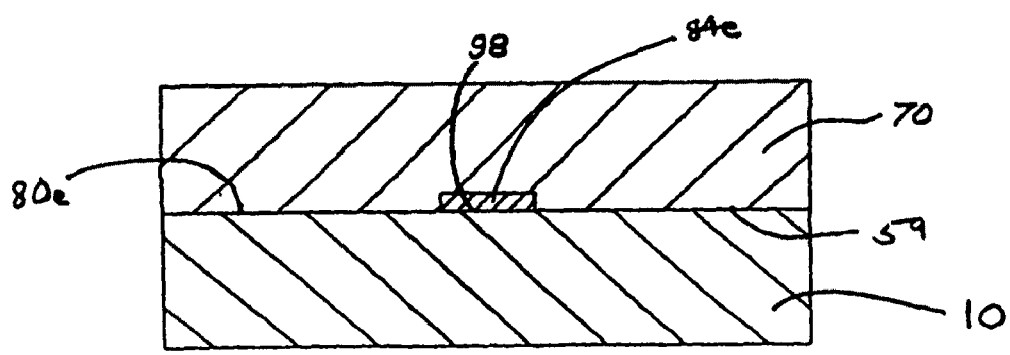
FIG. 60 is a sectional view embodying a possible condition resulting from choosing a low profile form in a lamination process.

A potential cross sectional view of a wire 84d laminated to a surface by the process such as that of FIG. 21 is depicted in FIG. 59. FIG. 60 depicts a typical cross sectional view of an electrical trace 84e formed by printing, electrodeposition, chemical "electroless" plating, foil etching, masked vacuum deposition etc. It is seen in FIG. 59 that being round the wire itself contacts the surface essentially along a line (normal to the paper in FIG. 59). In addition, the sealing material forming surface 80d of film 70 may have difficulty flowing completely around the wire, leaving voids as shown in FIG. 59 at 99, possibly leading to insecure contact. Another problem is that material forming surface 80d may flow under the wire preventing conductive contact. Thus, the thickness of the sealing layer, lamination parameters, material choice and initial projection of the wire form above the substrate surface become very important when using a round wire form.

On the other hand, using a lower profile substantially flat conductive trace such as depicted in FIG. 60 increases contact surface area compared to the line contact associated with a wire. The low profile form of FIG. 60 facilitates broad surface contact and secure lamination but comes at the expense of increased light shading. The low profile, flat structure does require consideration of the thickness of the "flowable" sealing layer forming surface 80e relative to the thickness of the conductive trace. Excessive thickness of certain sealing layer materials might allow relaxation of the "blanket" pressure promoting contact of the surfaces 98 with a mating conductive surface such as 59. Insufficient thickness may lead to voids similar to those depicted for the wire forms of FIG. 59. However, it has been found that, when using low profile traces such as embodied in FIG. 60 sealing layer thicknesses for ranging from 0.5 mil, (0.0005 inch) to 10 mil (0.01 inch) all perform satisfactorily. Thus a wide range of sealing layer thickness is possible, and the invention is not limited to sealing layer thicknesses within the stated tested range.

A low profile structure such as depicted in FIG. 60 may be advantageous because it may allow minimizing sealing layer thickness and consequently reducing the total amount of functional groups present in the sealing layer. Such functional groups may adversely affect solar cell performance or integrity. Also, processing speed may be increased and cost may be reduced. For example, it may be advantageous to limit the thickness of a sealing layer to 5 mils or less.

Electrical contact between conductive grid "fingers" or "traces" 84 and a conductive surface (such as cell surface 59) may be further enhanced by coating a conductive adhesive formulation onto "fingers" 84 and possibly "busses" 86 prior to or during the lamination process such as taught in the embodiment of FIG. 21. In a preferred embodiment, the conductive adhesive would be a "hot melt" material. A "hot melt" conductive adhesive would melt and flow at the temperatures involved in the laminating process 92 of FIG. 21. In this way surface 98 is formed by a conductive adhesive resulting in secure adhesive and electrical joining of grid "fingers" 84 to a conductive surface such as top surface 59 following the lamination process. In addition, such a "flowable" conductive material may assist in reducing voids such as depicted in FIG. 57 for a wire form. In addition, a "flowable" conductive adhesive may increase the contact area for a wire form 84d.

In the case of a low profile form such as depicted in FIG. 60, the conductive adhesive may be applied by standard registered printing techniques. However, it is noted that a conductive adhesive coating for a low profile conductive trace may be very thin, of the order of 1-10 micron thick. Thus, the intrinsic resistivity of the conductive adhesive can be relatively high, perhaps up to or even exceeding about 100 ohm-cm. This fact allows reduced loading and increased choices for a conductive filler. Since the conductive adhesive does not require heavy filler loading (i.e. it may have a relatively high intrinsic resistivity as noted above) other unique application options exist.

For example, a suitable conductive "hot melt" adhesive may be deposited from solution onto the surface of the "fingers" and "busses" by conventional paint electrodeposition techniques. Alternatively, should a condition be present wherein the exposed surface of fingers and busses be pristine (no oxide or tarnished surface), the well known characteristic of such a surface to "wet" with water based formulations may be employed to advantage. A freshly activated or freshly electroplated metal surface will be readily "wetted" by dipping in a water-based polymer containing fluid such as a latex emulsion containing a conductive filler such as carbon black. Application selectivity would be achieved because the exposed polymeric sealing surface 80 would not wet with the water based latex emulsion. The water based material would simply run off or could be blown off the sealing material using a conventional air knife. However, the water based film forming emulsion would cling to the freshly activated or electroplated metal surface. This approach is similar to applying an anti-tarnish or conversion dip coating to freshly electroplated metals such as copper and zinc.

Alternatively, one may employ a low melting point metal-based material as a constituent of the material forming either or both surfaces 98 and 100 of "fingers" and "busses". In this case the low melting point metal-based material, or alloy, is caused to melt during the temperature exposure of the process 92 of FIG. 21 (typically less than 600 degrees F.) thereby increasing the contact area between the mating surfaces 98, 100 and a conductive surface such as 59. Such low melting point metal-based materials may be applied by electrodeposition or simple dipping to wet the underlying conductive trace. Suitable low melting point metals may be based on tin, such as tin-bismuth and tin-lead alloys. Such alloys are commonly referred to as "solders". In another preferred embodiment indium or indium containing alloys are chosen as the low melting point contact material at surfaces 98, 100. Indium melts at a low temperature, considerably below possible lamination temperatures. In addition, indium is known to bond to glass and ceramic materials when melted in contact with them. Given sufficient lamination pressures, only a very thin layer of indium or indium alloy would be required to take advantage of this bonding ability.

In yet another embodiment, one or more of the layers 84, 86, 88, 90 etc. may comprise a material having magnetic characteristics. Magnetic materials include nickel and iron. In this embodiment, either a magnetic material in the cell substrate or the material present in the finger/grid collector structure is caused to be permanently magnetized. The magnetic attraction between the "grid pattern" and magnetic component of the foil substrate of the photovoltaic cell (or visa versa) creates a permanent "pressure" contact.

In yet another embodiment, the "fingers" 84 and/or "busses" 86 comprise a magnetic component such as iron or nickel and a external magnetic field is used to maintain positioning of the fingers or busses during the lamination process depicted in FIG. 21.

A number of methods are available to employ the current collecting and interconnection structures taught hereinabove with photovoltaic cell stock to achieve effective interconnection of multiple cells into arrays. A brief description of some possible methods follows. A first method envisions combining photovoltaic cell structure with current collecting electrodes while both components are in their originally prepared "bulk" form prior to subdivision to dimensions appropriate for individual cells. A expansive surface area of photovoltaic structure such as embodied in FIGS. 1 and 2 of the instant specification representing the cumulative area of multiple unit cells is produced. As a separate and distinct operation, an array comprising multiple current collector electrodes arranged on a common substrate, such as the array of electrodes taught in FIGS. 9 through 15 is produced. The bulk array of electrodes is then combined with the expansive surface of photovoltaic structure in a process such as the laminating process embodied in FIG. 21. This process results in a bulk combination of photovoltaic structure and collector electrode. Appropriate subdividing of the bulk combination results in individual cells having a preattached current collector structure. Electrical access to the collector structure of individual cells may be achieved using through holes, as taught in conjunction with the embodiments of FIGS. 35 through 42. Alternatively, one may simply lift the collector structure away from the cell surface 59 at the edge of the unit photovoltaic cell to expose the collector electrode.

Another method of combining the collector electrodes and interconnect structures taught herein with photovoltaic cells involves a first step of manufacture of multiple individual current collecting structures or electrodes. A suitable method of manufacture is to produce a bulk continuous roll of electrodes using roll to roll processing. Examples of such manufacture are the processes and structures embodied in the discussion of FIGS. 9 through 15 of the instant specification. The bulk roll is then subdivided into individual current collector electrodes for combination with discrete units of cell stock. The combination produces discrete individual units of "tabbed" cell stock. In concept, this approach is appropriate for individual cells having known and defined surface dimensions, such as 6"×6", 4"×3", 2"×8" and 2"×16". Cells of such defined dimensions may be produced directly, such as with conventional single crystal silicon manufacture. Alternatively, cells of such dimension are produced by subdividing an expansive cell structure into smaller dimensions. The "tabbed" cell stock thereby produced may be packaged in cassette packaging. The discrete "tabbed" cells are then electrically interconnected into an array, optionally using automatic cassette dispensing, positioning and electrical joining of multiple cells. The overhanging tabs of the individual "tabbed" cells facilitate such joining into an array as was taught in the embodiments of FIGS. 24, 34, 43, and 56 above.

Alternate methods to achieve interconnected arrays according to the instant invention comprise first manufacturing multiple current collector structures in bulk roll to roll fashion. In this case the "current collector stock" would comprise electrically conductive current collecting structure on a supporting sheetlike web essentially continuous in the "Y" or "machine" direction. Furthermore, the conductive structure is possibly repetitive in the "X" direction, such as the arrangement depicted in FIGS. 9, 12 and 38 of the instant specification. In a separate operation, individual rolls of unit "cell stock" are produced, possibly by subdividing an expansive web of cell structure. The individual rolls of unit "cell stock" are envisioned to be continuous in the "Y" direction and having a defined width corresponding to the defined width of cells to be eventually arranged in interconnected array.

Having separately prepared rolls of "current collector stock" and unit "cell stock"; multiple array assembly processes may be considered as follows. In one form of array assembly process, a roll of unit "current collector stock" is produced, possibly by subdividing a bulk roll of "current collector stock" to appropriate width for the unit roll. The rolls of unit "current collector stock" and unit "cell stock" are then combined in a continuous process to produce a roll of unit "tabbed stock". The "tabbed" stock therefore comprises cells, which may be extensive in the "Y" dimension, equipped with readily accessible contacting surfaces for either or both the top and bottom surfaces of the cell. The "tabbed" stock may be assembled into an interconnected array using a multiple of different processes. As examples, two such process paths are discussed according to (A) and (B) following.

Process Example (A): Multiple strips of "tabbed" stock are fed to a process such that an interconnected array of multiple cells is achieved continuously in the machine (original "Y") direction. This process would produce an interconnected array having series connections of cells whose number would correspond to the number of rolls of "tabbed" stock being fed. In this case the individual strips of "tabbed" stock would be arranged in appropriate overlapping fashion as dictated by the particular embodiment of "tabbed" stock. The multiple overlapping tabbed cells would be electrically joined appropriately using electrical joining means, surface mating through laminating or combinations thereof as has been taught above. Both the feed and exit of such an assembly process would be substantially in the original "Y" direction and the output of such a process would be essentially continuous in the original "Y" direction. The multiple interconnected cells could be rewound onto a roll for further processing.

Figure 62:
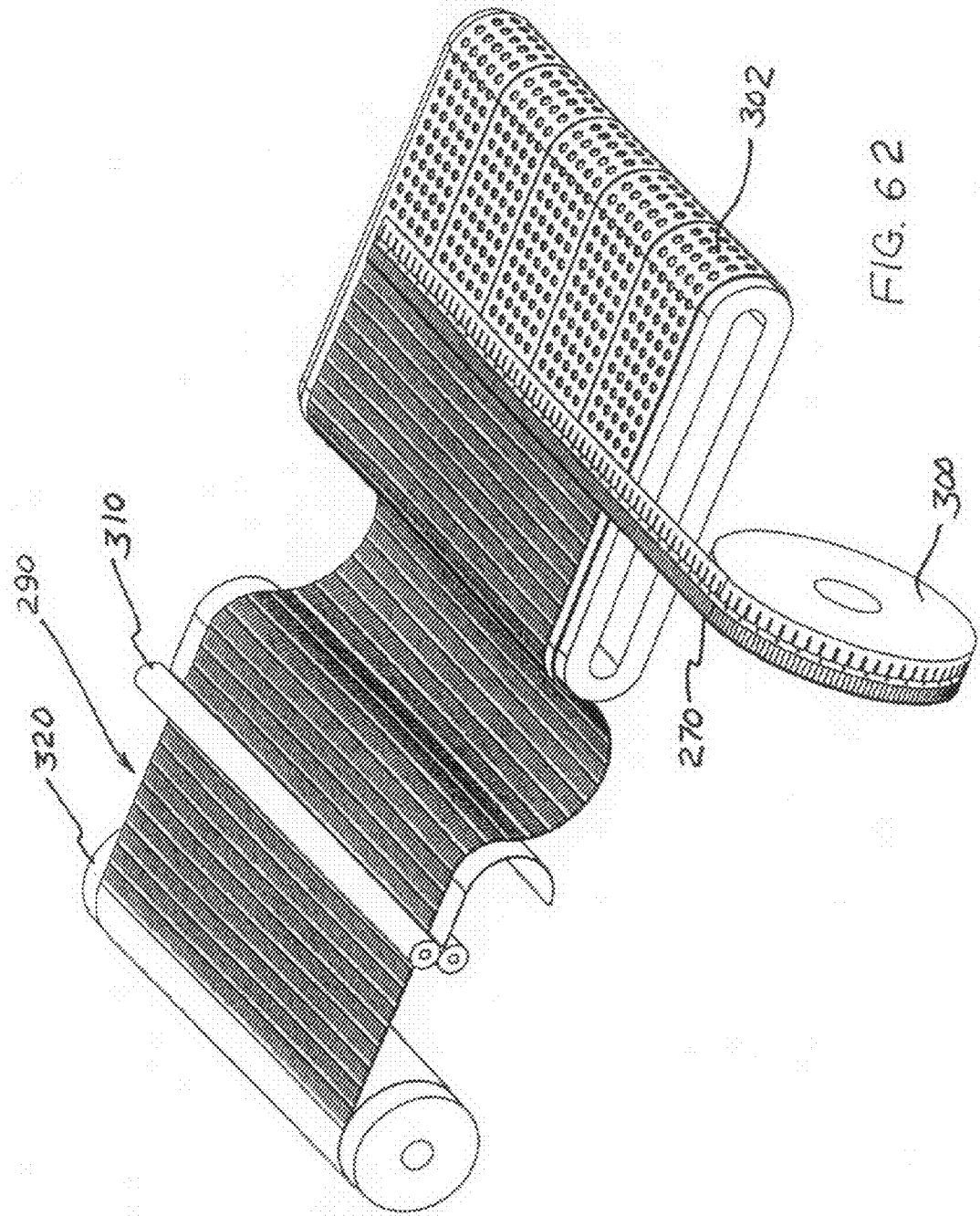
FIG. 62 is a perspective view of the process embodied in FIG. 61.

Process Example (B): An alternative process is taught in conjunction with FIGS. 61 and 62. FIG. 61 is a top view of the process and FIG. 62 is a perspective view. The process is embodied in FIGS. 61 and 62 using the "tabbed cell stock" 270 as shown in FIG. 55. One will recognize that other forms of "tabbed cell stock" such as those shown in FIGS. 23, 33, 42, are also suitable. A single strip of "tabbed" cell stock 270 is unwound from roll 300 and cut to a predetermined length "Y-61". "Y-61" represents the width of the form factor of the eventual interconnected array. Strips of "tabbed cell stock" cut to length "Y-61" may then be processed according to alternate processing sequences. In a first sequence as embodied in FIGS. 61 and 62 the cut strip is directly positioned for further interconnecting into the modular array. In another sequence the strips of length "Y-61" are accumulated in feeder cassettes and then fed to the modularization process from the cassettes. A possible advantage to the cassetting approach is that the individual cut strips may be performance evaluated and matched prior to assembly into an interconnected module.

In either of these sequences, a first step in the interconnection process secures a cut strip in position. In the process embodiment of FIGS. 61 and 62, this positioning is accomplished using a vacuum belt 302. The strip is then "shuttled" in the original "x" direction of the "tabbed cell stock" a distance substantially the length of a repeat dimension among adjacent series connected cells. This repeat distance is indicated in FIGS. 56 and 61 as "X-10". A second strip of "tabbed cell stock" 270 is then appropriately positioned to properly overlap the first strip, as best shown in FIG. 56. The second strip is then slightly tacked to the first strip of "tabbed cell stock" using exposed substrate material, such as that indicated at numeral 306 in FIG. 56. The tacking may be accomplished quickly and simply at points spaced in the "Y-61" direction using heated probes to melt small regions of the sealing material forming the surface of the exposed substrate. It is understood that other methods of relative positioning of tabbed cell strips, such as adhesive application or spot welding, may be chosen to maintain positioning of the adjacent cells.

This process of positioning and tacking is repeated multiple times. Normally, the repetitively positioned cell structures are passed through a "fixing" step to accomplish completion of the structural and electrical joining of the modular arrangement. The electrical joining may take many forms, depending somewhat on the structure of the individual "tabbed cell stock". For example, in the embodiment of FIGS. 24 and 25, joining may take the form of an electrically conductive adhesive, solder, etc. as previously taught. In the case of "tabbed" cell stock 270 such as embodied in FIG. 55, electrical joining may comprise a simple "blanket hold down" of conductive structure resulting from adhesive lamination such as previously described and embodied in FIG. 56.

The "fixing" step may involve heat and or pressure and is often accomplished using roll, vacuum, or press lamination. In the embodiment of FIGS. 61 and 62, the "fixing" is accomplished using lamination with roll laminator 310. Thus the series connected structure 290 depicted in FIG. 56 is achieved. It is seen that in the process depicted in FIGS. 61 and 62 the interconnected cell stock would exit the basic lamination assembly process in a fashion substantially perpendicular to the original "Y" direction of the "tabbed cell stock". The interconnected cells produced would therefore have a new predetermined width "Y-61" and the new length (in the original "X" direction) may be of extended dimension. The output in the new length dimension may be described as essentially continuous and thus the output of interconnected cells may be gathered on roll 320 as shown.

It is noted that the overall process depicted in FIGS. 61 and 62 is substantially continuous in that the feed stream to the process (tabbed cell stock 270) is continuous while the output of the process 290 may also be continuous. The process scheme depicted in FIGS. 61 and 62 permits other options while maintaining the substantially continuous nature of the overall process. For example, should one wish to apply a transparent environmental protective layer to the modular cell array, this can easily be accomplished using an auxiliary feed stream of barrier film prior to the lamination depicted at rolls 310. One may also consider application of a flexible backsheet in similar fashion. In addition, other processing options may be considered both before and after the "fixing" depicted by lamination 310 and while the modular array remains in it "continuous" form. These other options include additional lamination steps, quality checks on individual cells or module lengths, and spray application of functional coatings.

It will be appreciated that using the processing as embodied in FIGS. 61 and 62, a large choice of final form factors for the interconnected array is possible. For example, dimension "Y-61" could conceivably and reasonably be quite large, for example 8 feet while dimension "X-61" may be virtually any desired dimension. It is seen that the FIGS. 61/62 process results in a repetitive arrangement of cells encapsulated and seamed together in a robust, flexible sheetlike structure. Large module sizes can be produced which are also very easy to handle and manipulate. To date, module sizes employing "string and tab" or "shingling" interconnections have been restricted by the practical problems of handling and interconnecting large numbers of small individual cells. The largest commercially available "string and tab" module known to the instant inventor is 26 square feet. Using the instant invention, module sizes far in excess of 26 square feet are reasonable. Large modules suitable for combination with standard construction materials may be produced. For example, a module surface area of 4 ft. by 8 ft. (a standard dimension for plywood and other sheetlike construction materials) is readily produced using the processing of the instant invention. Alternatively, since the final modular array can be accumulated in roll form as shown in FIGS. 61 and 62, installation could be facilitated by the ability to simply "roll out" the array at the installation site. The ability to easily make modular arrays of very expansive surface and having wide choice of form factor greatly facilitates eventual installation and is a substantial improvement over existing options for modular array manufacture.

Finally, the ability to easily specify module dimensions allows a significant expansion of options for pre-fabrication of modules and module designs at the factory.

Another significant advantage to the modular processing taught here is the ability to quickly and easily change electrical characteristics of the final module. The module currents are determined in large part by the surface area of the individual cells (length by width) which may be easily varied. Using the depicted process, module voltages may be easily adjusted by simply specifying the module lengths "X-61" and the width "X-10" of the individual cells.

Figure 63:
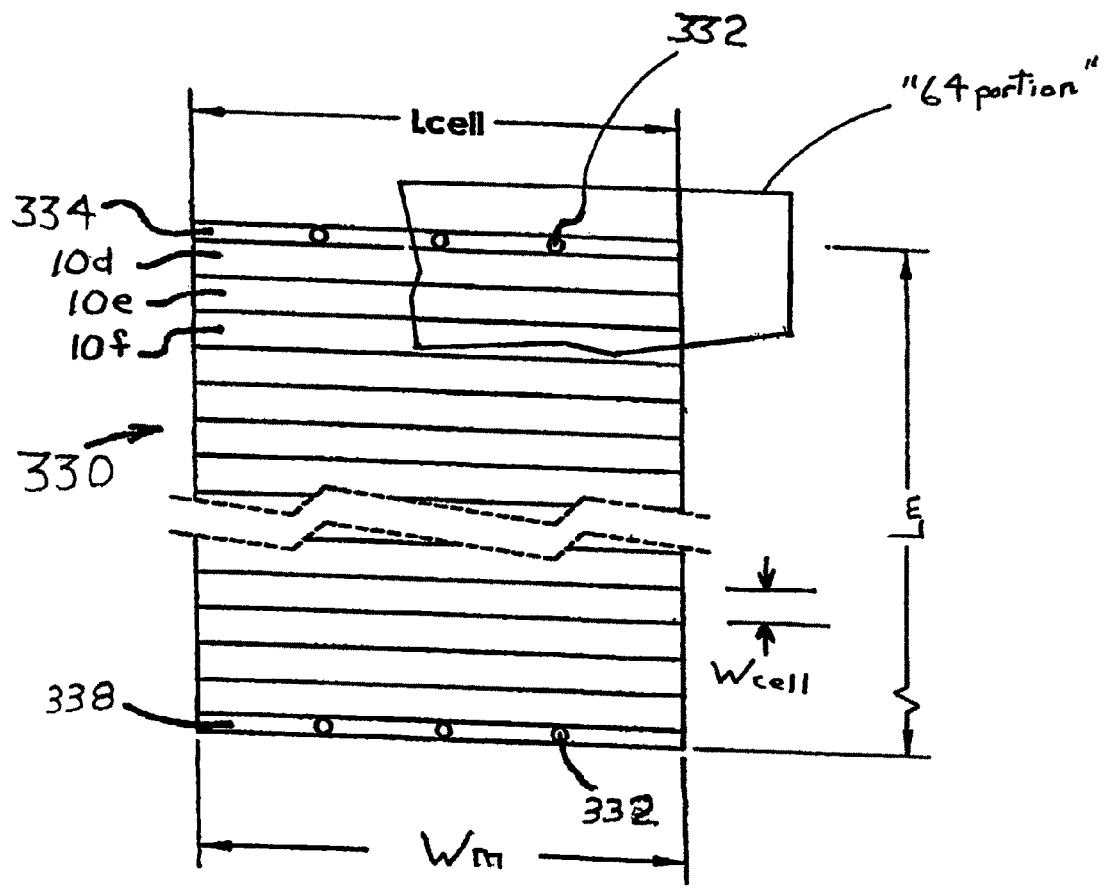
FIG. 63 is a top plan view of a modular array which may result from a process such as that of FIGS. 61 and 62. Thus, FIG. 63 may represent structure such as those presented in the sectional views of FIGS. 24, 34, 43 and 56.
Figure 64:
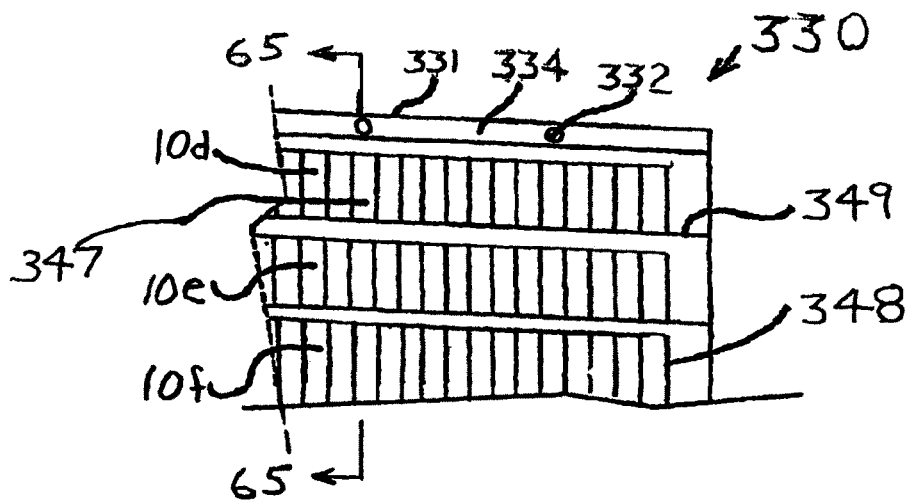
FIG. 64 is a depiction of the enclosed portion of FIG. 63 labeled "64 portion" which shows additional structural detail.
Figure 65:
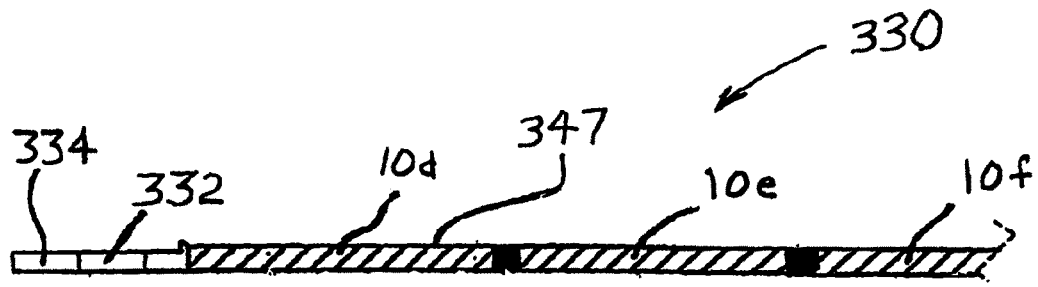
FIG. 65 is a simplified sectional view taken substantially from the perspective of lines 65-65 of FIG. 64. Thus, FIG. 65 may represent simplified views of structure such as that presented in the sectional views of FIGS. 24, 34, 43 and 56.

Referring now to FIGS. 63 through 65 of this instant specification, details of a module structure according to embodiments of the instant invention are presented. In FIG. 63, a top plan view of a portion of photovoltaic module 330 is depicted. In the FIG. 63 embodiment, overall module surface dimensions are indicated by width (Wm) and length (Lm). Typical module dimensions may be 4 ft. Wm by 8 ft. Lm. However, one will realize that the invention is not limited to these dimensions. Module surface dimensions may be larger or smaller (i.e. 2 ft. by 4 ft., 4 ft. by 16 ft., 8 ft. by 4 ft., 8 ft. by 16 ft., 8 ft. by 100 ft., etc.) depending on specific requirements. Thus, the overall module may be relatively large.

The FIG. 63 depiction includes terminal ends 329 and 331 at opposite ends of module 330. Positioned adjacent the edge of the terminal end 331 is electrically conductive terminal bar 334. One realizes that a terminal bar such as the region indicated as 334 in FIG. 63 may be present at the ends of modular arrangements such as embodied in FIGS. 43 and 56. For example, a possible "terminal bar" region is shown at numeral 339 in FIG. 42. One further understands that a terminal bar 338 of polarity opposite that of 334 may be positioned at the terminal end 329 opposite terminal end 331. In the embodiment of FIG. 63, through holes 332 have been positioned within the terminal bars 334 and 338. Through holes such as those indicated by 332 may be used to achieve electrical communication between conductive surfaces on opposite sides of the terminal bar region. This feature expands installation design choices and may improve overall contact between the terminal bars and conductive attachment hardware.

In the FIG. 63 embodiment, the module comprises multiple cells having surface dimensions of width Wcell (actually in the defined length direction of the overall module) and length Lcell as shown. In the FIG. 63 embodiment, the cell length (Lcell) is shown to be substantially equivalent to the module width (Wm). In addition, terminal bars 334 and 338 are shown to span substantially the entire width (Wm) of the module.

For purposes of describing embodiments of the invention, a typical module as embodied in FIG. 63 may have an overall length Lm of 8 feet and overall width Wm of 4 feet. Typically the cell width (Wcell) may be from 0.2 inch to 12 inches depending on choices among many factors. For descriptive purposes a cell width (Wcell) may be considered to be 1.97 inches. Using these typical dimensions the module 330 of FIG. 63 comprises 48 individual cells interconnected in series, with terminal bars 334 and 338 of about 0.7 inch width at each terminal end of the module. Assuming an individual cell open circuit voltage of 0.5 volts (typical for example of a CIGS cell), the open circuit voltage for the module embodied in FIG. 63 would be about 24 volts. This voltage is noteworthy in that it is insufficient to pose a significant electrical shock hazard, and further that the opposite polarity terminals are separated by 8 feet. Should higher voltages be permitted or desired, one very long module or multiple modules connected in series may be considered, employing mounting and connection structures taught herein for the individual modules. Alternatively, should higher voltage cells be employed (such as multiple junction a-silicon cells which may generate open circuit voltages in excess of 2 volts), the cell width (Wcell) may be increased accordingly to maintain a safe overall module voltage. At a ten percent module efficiency, the module of FIG. 63 as described would generate about 290 Watts.

Continuing reference to FIG. 64 shows photovoltaic cells 10d, 10e, 10f, etc. positioned in a repetitive arrangement. In the embodiment, the individual cells comprise thin film semiconductor material supported by a metal-based foil and modularized as taught above, for example as embodied in FIG. 43 or 56. Alternate photovoltaic cell structures known in the art and incorporated into expansive modules would be appropriate for practice of the invention. On the top free surface 347 of module 330 in the FIG. 64 embodiment, a pattern of fingers 348 and busses 349 collect power for transport to an adjacent cell in series arrangement.

FIG. 65 is a sectional depiction from the perspective of lines 65-65 of FIG. 64. The FIG. 65 embodiment shows a series connected arrangement of multiple photovoltaic cells 10d, 10e, 10f, etc. To promote clarity of presentation, the details of the series connections and cell structure are not shown in FIG. 65. One will realize that FIG. 65 is a greatly simplified depiction of series connected structures such as those of FIGS. 24, 34, 43, and 56.

One realizes the module structures depicted in FIG. 65 may be readily fabricated at a factory and shipped in bulk packaging form to an installation site. Alternatively, additional components may be incorporated at the factory prior to shipment. For example, it may be appropriate to apply a transparent protective barrier over the top surface 347 of module 330. Transparent protective layers may be either rigid or flexible. Rigid glass sheets have been commonly used as transparent barriers for photovoltaic modules. An alternative to rigid glass may be very thin flexible glass materials such as those identified as Corning 0211 and Schott D263. More recently expansive area, flexible transparent barrier sheets have been proposed to allow production of flexible, environmentally secure photovoltaic modules. These barrier sheets may typically comprise stacks of multiple films in a laminar structure. The films may comprise multiple inorganic layers or combinations of multiple organic and inorganic layers. The multiple layers present a tortuous path for moisture or gas molecules to penetrate through the barrier sheet. The individual layers of the barrier sheet are typically very thin, often of the order of one micrometer or less, formed by various processing such as sputtering, chemical vapor deposition and atomic layer deposition. Thus these individual layers are typically not self supporting. A barrier stack of multiple thin polymer and inorganic pairs (dyads) may be applied directly to a device to be protected. Alternatively, the barrier stack may be deposited onto a supporting carrier film which itself may be applied over a device for protection. An example of such a barrier film technology is that marketed by Vitex Systems under the tradename "Barix".

Figure 66:
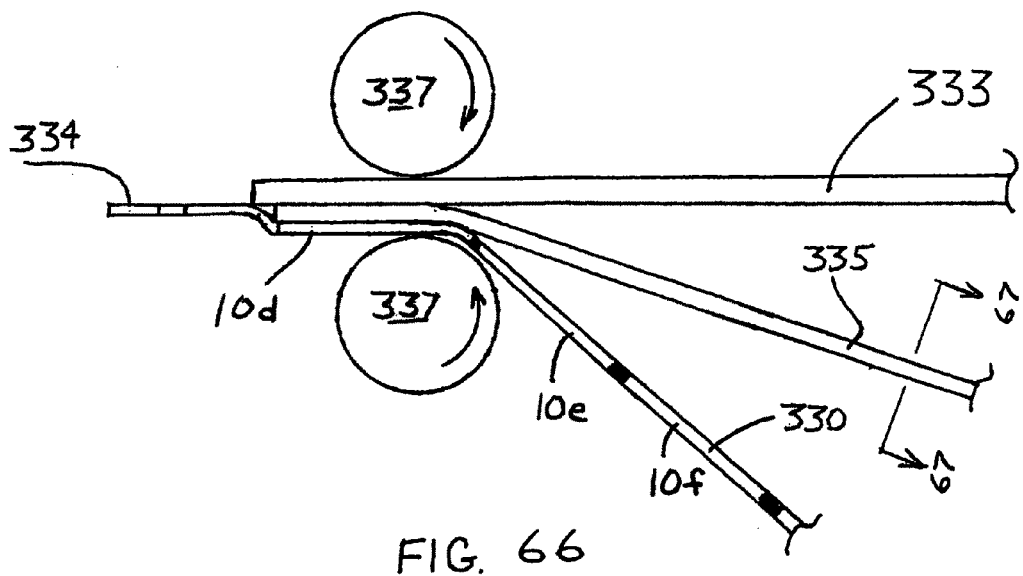
FIG. 66 is a side view of a process wherein an array such as depicted in FIG. 65 may be applied to a protective sheet using roll lamination.

FIG. 66 is a side view depicting a roll lamination of modular structure 330 to transparent protective or barrier layer 333. It is understood that other lamination techniques such as vacuum lamination may be appropriate. Since module 330 is flexible the application of either a rigid barrier layer such as glass or a flexible barrier film may be accomplished using roll lamination such as depicted in FIG. 66. Glass sheets would normally be considered rigid. Polymer sheets may be flexible or rigid Sheet 333 may also comprise multiple additional layers imparting various functional attributes such as structural processing strength, environmental barrier protection, adhesive characteristics and UV resistance, abrasion resistance, and cleaning ability.

As one understands, the roll lamination depicted in FIG. 66 may have manufacturing benefits compared to other lamination processes such as vacuum lamination. In the roll lamination process of FIG. 66, appropriate heat and pressure causes adhesive/sealant 335 to sufficiently soften and flow to form a seal between the facing surfaces of the module 330 and sheet 333. Rolls 337 squeeze the warmed composite together to form this surface seal while at the same time expelling a majority of air. In this process the sheets may be preheated prior to entering the rolls or the rolls themselves may be heated to sufficiently soften the sealant 335. Adhesive or sealant 335 may comprise a number of suitable materials, including thermoplastic or thermosetting materials, pressure sensitive adhesive formulations, ionomers, ethylene vinyl acetate (EVA) formulations, polyolefins, acrylics and the like. Alternatively, the sealant 335 may comprise a pressure sensitive adhesive and the process of FIG. 66 may be practiced at room temperature.

Figure 67:
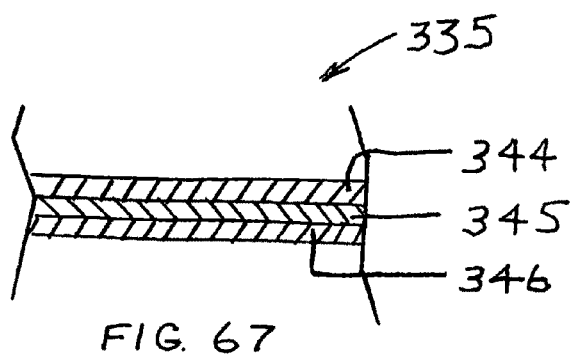
FIG. 67 is a sectional view taken substantially from the perspective of lines 67-67 of FIG. 66.

FIG. 67 is a sectional view of one embodiment of adhesive/sealant 335 taken substantially from the lines 67-67 of FIG. 66. In FIG. 67, sealant 335 is shown to compose multiple layers 344, 345, and 346. In this embodiment layers 344 and 346 are formed by materials having adhesive affinity to the corresponding surfaces of articles 333 and 330. Further in this embodiment, layer 345 represents a structural carrier film supporting the adhesive layers 344 and 346. Such a structural carrier film is used when adhesive layers 344, 346 do not possess the integrity required for the envisioned processing. One will realize that other embodiments are possible including a single adhesive layer absent the carrier layer 345. One will also realize that should the top surface 347 of module 330 have adhesive affinity for barrier layer 333 then adhesive/sealant 335 may possibly be eliminated.

It is understood that once the module is applied to transparent sheet 333, the composite will behave mechanically similar to the transparent sheet. Should sheet 333 be rigid, as is typical for glass or a thick plastic sheet, the composite (module 330/sealant 335/transparent sheet 333) would be characterized as rigid. Should sheet 333 be flexible, as is typical for many plastic barrier materials, the composite will remain flexible.

It is emphasized that the roll lamination process depicted in FIG. 66 is but one form of process capable of creating the (module/sealant/transparent barrier sheet) structure. Other lamination techniques, such as vacuum lamination or simple spreading of sealing material followed by transparent sheet application, may be alternatively employed. In some embodiments, adhesive/sealant 335 may be eliminated and sheet 333 may simply cover module 330. In other embodiments, barrier layer 333 may be applied by liquid flow coating or spraying of the module 330.

Figure 68:
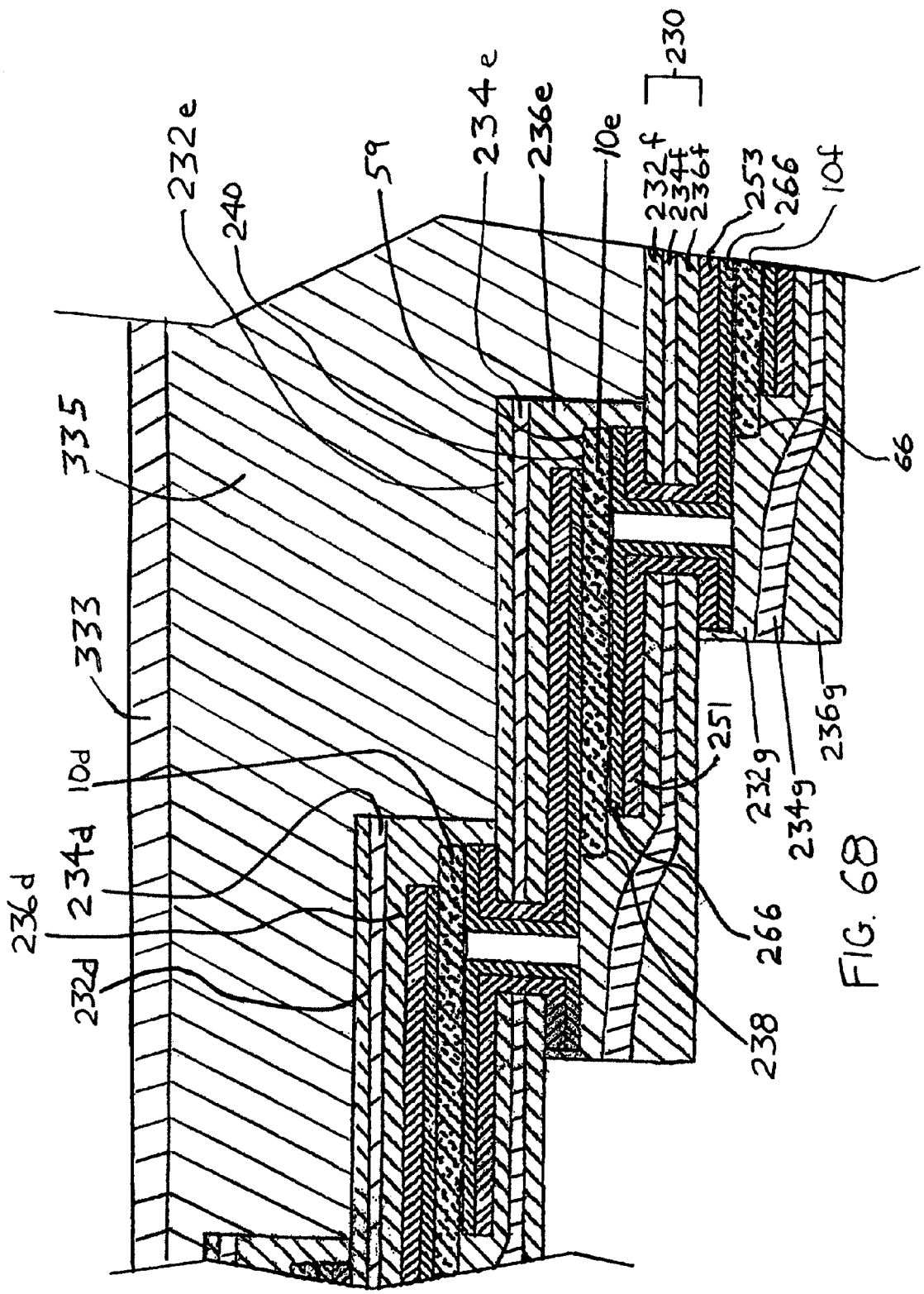
FIG. 68 is a sectional view showing the details of the layered structure resulting from a lamination process such as that of FIG. 66 wherein a protective layer is applied an array such as that of FIGS. 63-65.

The sectional view of FIG. 68 embodies structure which may result from the process depicted in FIG. 66. In FIG. 68, cells 10d, 10e, 10f are interconnected in series and the arrangement is laminated to barrier 333 through adhesive/sealant layer 335 as shown. Each cell has a light incident surface 59 overlayed by its own distinctive laminated unit of interconnecting structure. The unit of interconnecting structure comprises a collector portion having electrical trace material 266 positioned on surface 240 of substrate 230 as has been previously embodied herein. In the FIG. 68 embodiment, substrate 230 comprises three layers, 232, 234, 236. Layer 236 forming surface 240 comprises material having adhesive affinity for the light incident surfaces 59 of photovoltaic cells 10. Layer 232 forming surface 238 comprises material having adhesive affinity of the bottom conductive surface 66 of cell 10. Sandwiched between layers 232 and 236 is layer of structural polymer 234. One readily realizes that the stack 232/234/236 is translucent or transparent since it overlays the light incident surface of the cells.

Structural polymer support layer 234 may serve multiple functions. First, it may serve as a supporting layer for layers of material 232 and 236. Often these layers 232 and 236 are formulated for adhesive affinity but may suffer from a lack of structural integrity, being thin or having low modulus. This condition is often present in laminating films. Second, the structural layer may be important for facile processing of the substrate through various processing steps. In addition, the structural layer 234 may supply a protective film to protect the cell surfaces from abrasion and chafing from the handling through the various process steps. Finally, the structural layer normally exhibits a relatively high elastic modulus, which contributes to firm "blanket" holddown of the electrical traces to the cell surface following lamination. The firm holddown achieved with the high modulus structural layer contributes to excellent thermal cycling and aging performance of the composites of the invention.

It is understood that layer 234 may in practice represent a multiple layer structure. As has previously been taught the multiple layers may provide additional functional benefits such as environmental barrier properties, uv resistance, cut resistance, electrical insulating properties etc.

Inspection of the structure embodied in FIG. 68 reveals that each individual cell has its light incident surface 59 overlayed by its own individual and distinct portion of unit of interconnecting structure. Specifically, a cell such as 10d is overlayed by a unit of interconnecting structure comprising layer portions 232d, 234d, 236d. In particular, one will recognize that the polymer support layer 234d overlaying a first cell 10d is separate, distinct, spaced apart, and disconnected from the polymer support layer 234e overlaying a second cell 10e. Similarly, layer 232d is separate and disconnected from layer 232e, while layer 236d is separate and disconnected from layer 236e. Continued reference to FIG. 68 shows that these same structural distinctions exist for those portions of unit of interconnecting structure contacting the bottom surfaces 66 of cells 10. For example, layer 232e contacting the bottom surface 66 of cell 10d is separate, spaced apart, and disconnected from layer 232f contacting the bottom surface 66 of cell 10e. Similarly, polymer support layer 234e covering the bottom surface 66 of cell 10d is separate, spaced apart and disconnected from polymer support layer 234f covering the bottom surface 66 of cell 10e.

Continued reference to FIG. 68 shows adhesive layer 335 positioned above the series arrangement of multiple cells. As seen in the embodiment, the adhesive layer extends as a continuous structure to cover a multiple of cells. As previously noted, adhesive layer 335 may be a single layer or be a composite of multiple laminated layers. Positioned above adhesive layer 335 is environmental barrier 333. Barrier 333 may comprise glass or a flexible barrier sheet.

The module structure embodied in FIG. 68 may also include a protective backside barrier (not shown) commonly referred to as a "backsheet". Suitable "backsheets" are known in the art. Typical "backsheets" may comprise glass or laminated sheets combining metal foil and polymer film layers. Since they are applied to the backside of the photovoltaic cell, the "backsheet" need not be transparent. In addition, flexible backsheets of polymer/metal foil laminates may be applied to the structures of the invention by techniques taught hereinbefore. For example, a flexible backsheet may be applied during the process of FIGS. 61, 62 at laminating rolls 310. Alternatively, a flexible "backsheet" may be applied by the processing embodied in FIG. 66.

Figure 69:
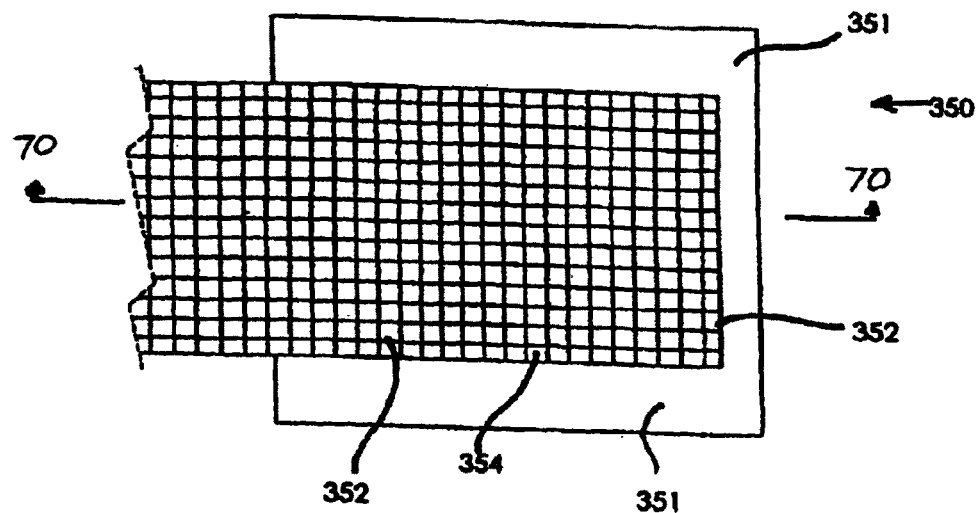
FIG. 69 is a top plan view showing a simplified depiction of structure useful to explain a concept of the invention.

The laminated contact is particularly suitable for the electrical joining requirements of many embodiments of the instant invention. A simplified depiction of structure to assist understanding the concept of a laminated contact is embodied in FIGS. 69 and 70. FIG. 69 shows a top plan view of an article 350. Article 350 comprises a conductive mesh 352 positioned on the surface of or partially embedded in adhesive 351. Mesh 352 may be in the form of a metal screen, a metallized fabric or a fabric comprising conductive fibers and the like. Adhesive 351 possesses adhesive affinity to the conductive surface to which electrical joining is intended. Numeral 354 indicates holes through the mesh or fabric. One will realize that many different patterns and conductive materials may be suitable for the conductive material represented by conductive mesh 352, including conductive comb-like patterns, serpentine traces, monolithic metal mesh patterns, metallized fabric, wires, etched or die cut metal forms, forms comprising vacuum deposited, chemically deposited and electrodeposited metals, etc.

Figure 70:
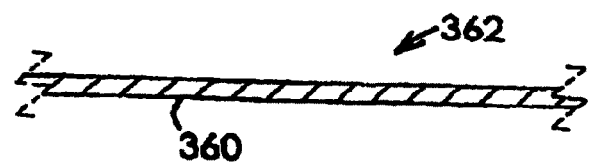
FIG. 70 is a sectional view taken substantially from the perspective of lines 70-70 of FIG. 69.

FIG. 70 shows a sectional view of article 350 juxtaposed such that the free surface of adhesive 351 and metal 352 are in facing relationship to a mating conductive surface 360 of article 362 to which electrical joining is desired. In the embodiment, article 350 is seen to be a composite of the conductive material pattern 352 positioned on a top surface of hot melt adhesive film 351. In the embodiment, an additional support film 366 is included for structural and process integrity, and possibly barrier properties. Additional film 366 may be a polymer film of a material such as polyethylene terephthalate, polyethylene naphthalate (PEN), polypropylene, polycarbonate, etc. Film 366 may be multilayered and comprise layers intended to achieve functional attributes such as moisture barrier, UV protection etc. Film 366 may also comprise a structure such as glass. Article 350 can include additional layered materials (not shown) to achieve desired functional characteristics similar to article 70 discussed above. Also depicted in FIG. 70 is article 362 having a bottom surface 360. Surface 360 may represent, for example, the top or bottom surfaces 59 or 66 respectively of solar cell structure 10 (FIG. 2A).

In order to achieve the laminated contact, articles 350 and 362 are brought together in the facing relationship depicted and heat and pressure are applied. The adhesive layer 351 softens and flows to contact surface 360. In the case of the FIG. 70 embodiment, flow occurs through the holes 354 in the mesh 352. Upon cooling and removal of the pressure, the metal mesh 352 overlays and is held in secure and firm electrical contact with surface 360 by virtue of the adhesive bond between adhesive 351 and surface 360. Thus mesh may function as a laminated electrode or current collector in combination with surface 360.

EXAMPLE 1

A standard plastic laminating sheet from GBC Corp. 75 micrometer (0.003 inch) thick was coated with DER in a pattern of repetitive fingers joined along one end with a buss-like structure resulting in an article as embodied in FIGS. 16 through 19. The fingers were 0.020 inch wide, 1.625 inch long and were repetitively separated by 0.150 inch. The buss-like structure which contacted the fingers extended in a direction perpendicular to the fingers as shown in FIG. 16. The buss-like structure had a width of 0.25 inch. Both the finger pattern and buss-like structure were printed simultaneously using the same DER ink and using silk screen printing. The DER printing pattern was applied to the laminating sheet surface formed by the sealing layer (i.e. that surface facing to the inside of the standard sealing pouch).

The finger/buss pattern thus produced on the lamination sheet was then electroplated with nickel in a standard Watts nickel bath at a current density of 50 amps. per sq. ft. Approximately 4 micrometers of nickel thickness was deposited to the overall pattern.

A photovoltaic cell having surface dimensions of 1.75 inch wide by 2.0625 inch long was used. This cell was a CIGS semiconductor type deposited on a 0.001 inch stainless steel substrate. A section of the laminating sheet containing the electroplated buss/finger pattern was then applied to the top, light incident side of the cell, with the electroplated grid finger extending in the width direction (1.75 inch dimension) of the cell. Care was taken to ensure that the buss region of the conductive electroplated metal did not overlap the cell surface. This resulted in a total cell surface of 3.61 sq. inch. (2.0625"×1.75") with about 12% shading from the grid, (i.e. about 88% open area for the cell).

The electroplated "finger/buss" on the lamination film was applied to the photovoltaic cell using a standard Xerox office laminator. The resulting completed cell showed good appearance and connection.

The cell prepared as above was tested in direct sunlight for photovoltaic response. Testing was done at noon, Morgan Hill, Calif. on Apr. 8, 2006 in full sunlight. The cell recorded an open circuit voltage of 0.52 Volts. Also recorded was a "short circuit" current of 0.65 Amps. This indicates excellent power collection from the cell at high efficiency of collection.

EXAMPLE 2

Individual thin film CIGS semiconductor cells comprising a stainless steel supporting substrate 0.001 inch thick were cut to dimensions of 7.5 inch length and 1.75 inch width.

In a separate operation, multiple laminating collector grids were prepared as follows. A 0.002 inch thick film of Surlyn material was applied to both sides of a 0.003 inch thick PET film to produce a starting laminating substrate as embodied in FIG. 44. Holes having a 0.125 inch diameter were punched through the laminate to produce a structure as in FIG. 48. A DER ink was then printed on opposite surfaces and through the holes to form a pattern of DER traces. The resulting structure resembled that depicted in FIG. 51. The grid fingers 254 depicted in FIGS. 50 and 51 were 0.012 inch wide and 1.625 inch long and were spaced on centers 0.120 inch apart in the length direction. The grid fingers 252 were 0.062 inch wide and extended 1 inch and were spaced on centers 0.5 inch apart. The printed film was then electroplated to deposit approximately 2 micrometers nickel strike, 5 micrometers copper and an outer flash coating of 1 micrometer nickel. This operation produced multiple sheets of laminating current collector stock having overall dimension of 7.5 inch length ("Y" dimension) and 4.25 in width ("X" dimension) as indicated in FIG. 50. These individual current collector sheets were laminated to cells having dimension of 7.25 inches in length and 1.75 inches in width to produce tabbed cell stock as depicted in FIG. 55. A standard Xerox office roll laminator was used to produce the tabbed cell stock. Six pieces of the tabbed cell stock were laminated together as depicted in FIG. 56. A standard Xerox office roll laminator was used to produce the FIG. 56 embodiment. The combined series interconnected array had a total surface area of 76.1 square inches. In full noon sunlight the 6 cell array had an open circuit voltage of 3.2 Volts and a short circuit current of 2.3 amperes.

While many of the embodiments of the invention refer to "current collector" structure, one will appreciate that similar articles could be employed to collect and convey other electrical characteristics such as voltage.

Although the present invention has been described in conjunction with preferred embodiments, it is to be understood that modifications, alternatives and equivalents may be included without departing from the spirit and scope of the inventions, as those skilled in the art will readily understand. Such modifications, alternatives and equivalents are considered to be within the purview and scope of the invention and appended claims.

What is claimed is:

1. In combination, two electrically interconnected photovoltaic cells and an interconnecting component wherein,
    each of said cells has transparent top light incident surface regions,
    said interconnecting component comprises a polymeric sheetlike substrate having a top upward facing side and a bottom downward facing side,
    a first portion of said sheetlike substrate comprises multiple transparent polymeric layers, a first of said transparent layers comprises a polymeric adhesive forming the downward facing side of said first portion, and a second of said transparent layers comprises a structural polymer overlaying at least a portion of said first adhesive layer,
    said first adhesive layer positioned over at least a portion of a first cell, such that said adhesive is in direct physical contact with a transparent top light incident surface region of said first cell,
    and wherein said sheetlike substrate extends beyond said first cell such that a second portion of said sheetlike substrate is positioned beneath a second of said cells,
    an wherein the upward facing side of said second portion of said sheetlike substrate is formed by a layer of additional polymeric adhesive,
    and wherein said structural polymer layer overlays a preponderance of the light incident surface of said first cell and does not overlay the light incident surface of said second cell.

2. The combination of claim 1 wherein said polymeric adhesive layer forming the downward facing side of the first portion is distinct from an adhesive layer contacting the light incident surface of a second cell.

3. The combination of claim 1 wherein said first layer of transparent polymeric adhesive comprises material from the group polyolefins, inomers, polyacrylics, polyacetates, polyurethanes and silicones.

4. The combination of claim 1 wherein a pattern of conductive material is positioned on said downward facing side of said first portion, said pattern extending over a preponderance of said top light incident surface of said first cell, and wherein said pattern is in direct physical contact with said top light incident surface.

5. The combination of claim 1 wherein said first layer of transparent polymeric adhesive has a thickness of 250 micrometers or less.

6. The combination of claim 1 wherein said structural polymer layer overlaying said transparent polymeric adhesive comprises material from the group polyethylene, polypropylene, biaxially oriented polypropylene (BOPP), polyethylene terepthalate (PET), polyethylene naphthalate (PEN), polycarbonate, acrylic or fluorinated polymers.

7. In combination, two electrically interconnected photovoltaic cells and an interconnecting component wherein,
   each of said cells has a top light incident surface formed by a transparent conductive material and an oppositely facing bottom surface formed by a conductive material,
   said interconnecting component comprises a sheetlike substrate having a top, upward facing side and a bottom downward facing side,
   a first portion of said sheetlike substrate comprises multiple polymeric layers positioned beneath at least a portion of a first of said cells, and a first of said polymeric layers comprises a polymeric adhesive forming the upward facing side of said first portion, said polymeric adhesive in direct physical contact with the bottom surface of said first cell, and a second of said polymeric layers comprises a structural polymer underlying at least a portion of said first adhesive layer.
   and wherein said sheetlike substrate extends beyond said first cell such that a second portion of said sheetlike substrate is positioned over a preponderance of the top light incident surface of a second of said cells,
   and wherein said structural polymer layer does not extend under said second of said cells.

8. The combination of claim 7 wherein said polymeric adhesive layer forming the upward facing surface of said first portion is distinct from an adhesive layer contacting the bottom surface of a second cell.

9. The combination of claim 7 wherein said polymeric adhesive layer comprises material from the group polyolefins, inomers, polyacrylics, polyacetates and silicones.

10. The combination of claim 7 wherein a pattern of conductive material is positioned on the upward facing side of said first portion and wherein said pattern is in direct physical contact with said cell bottom surface.

11. The combination of claim 7 wherein said polymeric adhesive layer has a thickness of 250 micrometers or less.

12. The combination of claim 7 wherein said structural polymer layer underlying said first polymeric layer comprises material from the group polyethylene, polypropylene, biaxially oriented polypropylene (BOPP), polyethylene terepthalate (PET), polyethylene naphthalate (PEN), polycarbonate, acrylic or fluorinated polymers.

13. In combination two electrically interconnected photovoltaic cells and an interconnecting component wherein,
   each of said cells has transparent top light incident surface regions and an oppositely facing bottom surface formed by a conductive material,
   said interconnecting component comprises a sheetlike substrate having a top upward facing side and a bottom downward facing side, p1 a first portion of said sheetlike substrate comprises multiple transparent polymeric layers overlaying a first of said cells,
   a first of said multiple polymeric layers being formed by a transparent polymeric adhesive forming the downward facing side of said first portion in direct physical contact with said transparent top light incident surface region of a first of said cells,
   said sheetlike substrate extends outwardly of said first cell such that a portion of said top upward facing side is positioned beneath a second cell,
   and wherein said portion of said top upward facing side is formed by additional polymeric adhesive in direct physical contact with said bottom surface of the second cell,
   and wherein said first layer of transparent polymeric adhesive overlays a preponderance of the light incident surface of said first cell and does not overlay the light incident surface of said second cell.

14. The combination of claim 13 wherein said first layer comprises a thermoplastic.

15. The combination of claim 13 wherein said first layer comprises material from the group polyolefins, inomers, polyacrylics, polyacetates, polyurethanes and silicones.

16. The combination of claim 13 wherein said interconnecting component comprises Surlyn.

17. The combination of claim 13 wherein said first layer has a thickness of 250 micrometers or less.

18. The combination of claim 13 wherein said interconnecting component comprises a layer of structural polymer overlaying said first layer.

19. The combination of claim 18 wherein said structural polymer comprises material from the group polyethylene, polypropylene, biaxially oriented polypropylene (BOPP), polyethylene terepthalate (PET), polyethylene naphthalate (PEN), polycarbonate, polyacrylic or fluorinated polymers.

20. The combination of claim 13 wherein a pattern of conductive material is positioned on said first layer, said pattern extending over a preponderance of said top light incident surface of said first cell, and wherein said pattern is in direct physical contact with said top light incident surface.

21. The combination of claim 20 wherein the conductive material of the pattern is part of a monolithic form of conductive material extending from said top light incident surface of said first cell to beneath the bottom surface of a second cell.

22. The combination of claim 20 wherein said pattern comprises a layer of metal absent polymer.

23. The combination of claim 20 wherein a portion of a surface of said pattern is formed by material comprising nickel and absent polymer, and wherein said surface is in contact with the light incident surface of said first cell.

24. The combination of claim 20 wherein said pattern comprises multiple substantially parallel conductive traces having ends distal from said second cell, and wherein the distal ends of two adjacent traces are electrically connected by metallic material such that should a first of said two traces become impaired an alternate electrical path exists such that the performance of the cell remains substantially undiminished.

25. The combination of claim 13 wherein said additional adhesive in contact with the bottom conductive surface of said second cell is distinct from adhesive material contacting the bottom conductive surface of said first cell.

26. The combination of claim 13 wherein the light incident surfaces of both said first and second cells are overlayed by a common barrier layer.

27. The combination of claim 26 wherein said common barrier layer comprises glass.

28. The combination of claim 13 wherein said top light incident surface regions comprise a transparent conductive material.

29. The combination of claim 28 wherein said transparent conductive material is a transparent conductive metal oxide.

30. The combination of claim 13 wherein said cells comprise thin film semiconductor.

31. The combination of claim 13 wherein said cells comprise a self supporting metal based foil.

32. The combination of claim 13 wherein said interconnecting component is flexible.

33. The combination of claim 13 further having an aggregate top surface, and wherein said combination is flexible at any point of said aggregate top surface.

34. The combination of claim 18 wherein said layer of structural polymer does not overlay said second cell.

35. The combination of claim 13 wherein said first layer of transparent polymeric adhesive is a cured, non-flowing material.

36. The combination of claim 20 wherein said pattern has a surface formed by a conductive polymer comprising a conductive filler in a polymer matrix.

37. The combination of claim 36 wherein said polymer matrix comprises a polymeric adhesive.

38. The combination of claim 20 further comprising additional conductive material positioned on said upward facing side portion of said substrate formed by said additional polymeric adhesive.

* * * * *